(12) United States Patent
Tanabe et al.

(10) Patent No.: US 6,861,614 B1
(45) Date of Patent: Mar. 1, 2005

(54) S SYSTEM FOR THE FORMATION OF A SILICON THIN FILM AND A SEMICONDUCTOR-INSULATING FILM INTERFACE

(75) Inventors: Hiroshi Tanabe, Tokyo (JP); Tomoyuki Akashi, Tokyo (JP); Yoshimi Watabe, Tokyo (JP)

(73) Assignees: NEC Corporation (JP); Sumitomo Heavy Industries, Ltd. (JP); Anelva Corporation (JP)

( * ) Notice: Subject to any disclaimer, the term of this patent is extended or adjusted under 35 U.S.C. 154(b) by 137 days.

(21) Appl. No.: 09/612,551

(22) Filed: Jul. 7, 2000

(30) Foreign Application Priority Data

Jul. 8, 1999 (JP) .......................................... 11-194024

(51) Int. Cl.⁷ .......................... H01L 21/00; B23K 26/06
(52) U.S. Cl. .................. 219/121.66; 438/166; 438/487
(58) Field of Search ...................... 219/121.65, 121.66, 219/121.83; 438/487, 166

(56) References Cited

U.S. PATENT DOCUMENTS

| | | | |
|---|---|---|---|
| 4,370,026 A | * | 1/1983 | Dubroeucq et al. |
| 5,304,250 A | | 4/1994 | Sameshima et al. ... 118/723 ER |
| 5,432,122 A | * | 7/1995 | Chae |
| 5,477,304 A | | 12/1995 | Nishi .......................... 355/53 |
| 5,699,191 A | * | 12/1997 | Fork .......................... 359/626 |
| 5,923,475 A | * | 7/1999 | Kurtz et al. ................. 359/626 |
| 5,932,118 A | * | 8/1999 | Yamamoto et al. .... 219/121.66 |
| 6,071,765 A | * | 6/2000 | Noguchi et al. |
| 6,072,631 A | * | 6/2000 | Guenther et al. |
| 6,117,752 A | * | 9/2000 | Suzuki ........................ 438/487 |
| 6,160,827 A | * | 12/2000 | Tanaka |
| 6,242,291 B1 | * | 6/2001 | Kusumoto et al. |
| 6,304,385 B1 | * | 10/2001 | Tanaka |
| 6,437,313 B2 | * | 8/2002 | Yamazaki et al. .......... 250/216 |
| 6,451,636 B1 | * | 9/2002 | Segawa et al. ............. 438/166 |
| 6,471,772 B1 | * | 10/2002 | Tanaka |

FOREIGN PATENT DOCUMENTS

| | | | |
|---|---|---|---|
| JP | 57-181537 | 11/1982 | ........... G03B/27/32 |
| JP | 10-97083 | 4/1989 | ............ H04N/7/08 |
| JP | 5-21393 | 1/1993 | ......... H01L/21/302 |
| JP | 5-909191 | 4/1993 | ......... H01L/21/268 |
| JP | 5-129183 | 5/1993 | ......... H01L/21/027 |
| JP | 5-182923 | 7/1993 | ......... H01L/21/268 |
| JP | 5-211167 | 8/1993 | ......... H01L/21/336 |
| JP | 6-310407 | 4/1994 | ......... H01L/21/027 |
| JP | 6-232030 | 8/1994 | ......... H01L/21/027 |
| JP | 6-267826 A | * 9/1994 | |
| JP | 6-267826 | 9/1994 | ......... H01L/21/027 |
| JP | 7-078759 | 3/1995 | ........... H01L/21/20 |
| JP | 7-99321 | 4/1995 | ......... H01L/29/786 |
| JP | 7-130721 | 5/1995 | ........... H01L/21/31 |
| JP | 7-142331 | 6/1995 | ......... H01L/21/027 |
| JP | 7-266064 A | * 10/1995 | |

(List continued on next page.)

OTHER PUBLICATIONS

Crystalline Si Films for Integrated Actrive–Matrix Liquid–Crstal Displays, James S. Im and Robert S. Sposili, Mrs Bulletin, Mar. 1996, pp. 39–48.

(List continued on next page.)

*Primary Examiner*—Geoffrey S. Evans
(74) *Attorney, Agent, or Firm*—Hayes Soloway P.C.

(57) ABSTRACT

In a semiconductor thin film forming system for modifying a predetermined region of a semiconductor thin film by exposing the semiconductor thin film to a projected light patterned through a pattern formed on a photo mask, the system includes a mechanism (opt20') for uniformizing the light for exposure in a predetermined area on the photo mask. This system can provide a crystallized silicon film having a trap state density less than $10^{12}$ cm$^{-2}$ and can provide a silicon-insulating film interface exhibiting a low interface state density.

11 Claims, 44 Drawing Sheets

FOREIGN PATENT DOCUMENTS

| | | | | |
|---|---|---|---|---|
| JP | 7-283110 | 10/1995 | ......... | H01L/21/027 |
| JP | 7-118443 | 12/1995 | .......... | H01L/21/20 |
| JP | 8-55795 | 2/1996 | ......... | H01L/21/027 |
| JP | 8-111449 | 4/1996 | .......... | H01L/21/68 |
| JP | 8-192287 | 7/1996 | .......... | B23K/26/06 |
| JP | 9-7911 | 1/1997 | .......... | H01L/21/02 |
| JP | 9-17729 | 1/1997 | .......... | H01L/21/20 |
| JP | 9-148246 | 6/1997 | .......... | H01L/21/20 |
| JP | 9-283423 | 10/1997 | ......... | H01L/21/027 |
| JP | 10-041513 | 2/1998 | ......... | H01L/29/786 |
| JP | 10-116989 | 5/1998 | ......... | H01L/29/786 |
| JP | 10-149984 | 6/1998 | .......... | H01L/21/20 |
| JP | 10-209029 | 8/1998 | ......... | H01L/21/027 |
| JP | 11-17185 | 1/1999 | ......... | H01L/29/786 |
| JP | 11-143087 | 1/2002 | .......... | G03B/27/42 |
| KR | 1998-24115 | 6/1998 | ......... | H01L/21/027 |
| KR | 1999-0045161 | 6/1999 | ......... | H01L/21/027 |

OTHER PUBLICATIONS

Sequential Lateral Solidification of Thin Silicon Films on SiO2, Robert S. Sposili and James S. Im, Appl. Phys. Lett. 69 (19), Nov. 4, 1996, pp. 2864–2866.

Single–crystal Si Films for Thin–Film transistor Devices, James S. Im, Robert S. Sposili, and M.A. Crowder, Appl. Phys. Lett. 70 (25), Jun. 23, 1997, American Institute of Physics, p. 3434–3436.

Effects of Light Pulse Duratio on Excimer–Laser Crystallization Characteristics of Silicon Thin Films, Ishihara, Yeh, Hattori and Matsumura, Jpn. J. Appl. Phys. vol. 34 (1995) pp. 1759–1764, p. 1, No. 4A, Apr. 1995.

Improvement of structural and electrical properties in low–temperature gate oxides for poly–Si TFTs by controlling O2/SiH4 ratios, Yuda, Tanabe and Okumura, AM–LCD 97, The Japan Society of Applied Physics, Digest of Technical Papers, 1997, International Workshop on Active–Matrix Liquid–Crystal Displays—TFT Technologies and Related Materials—Sep. 11–12, 1997, Kogakuin University, Tokyo, Japan, pp. 87–89.

Excimer Laser Crystallization of Amorphous Silicon Films, Tanabe, Sera, Nakamura, Hirata, Yuda and Okumura, reprinted from the NEC Research & Development, Vo. 35, No. 3, pp. 254–260, Jul. 1994.

The Properties of Gases and Liquids, Robert C. Reid, John M. Prausnitz, Bruce E. Poling, Fourth Edition, Cover, Contents Page, Appendix B, p. 734, and Index page.

Transport Phenomena, Department of Chemical Engineering, Univesity of Wisconsin, Madison, Wisconsin, Preface, pp. 508–513, Table B–2, and Appendix C (p. 747).

* cited by examiner

SCHEMATIC DIAGRAM OF CONVENTIONAL EXCIMER LASER ANNEALER

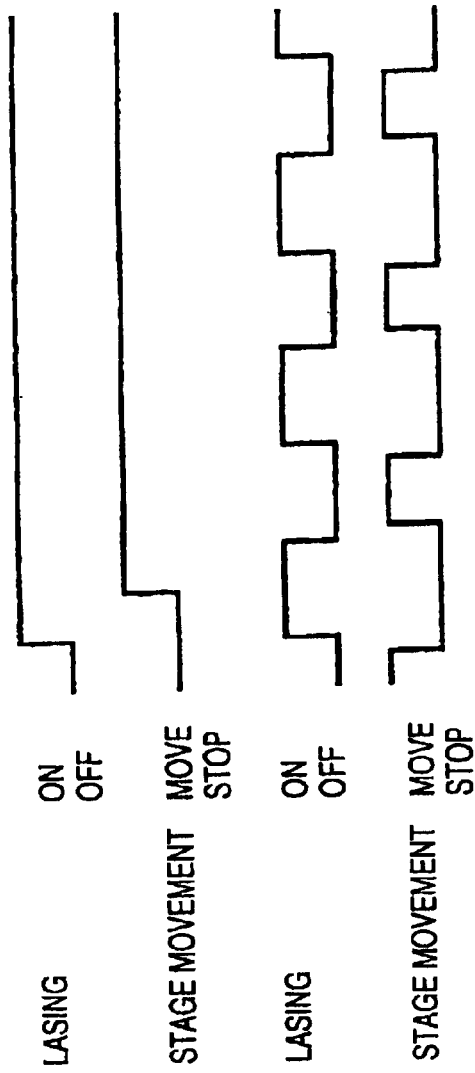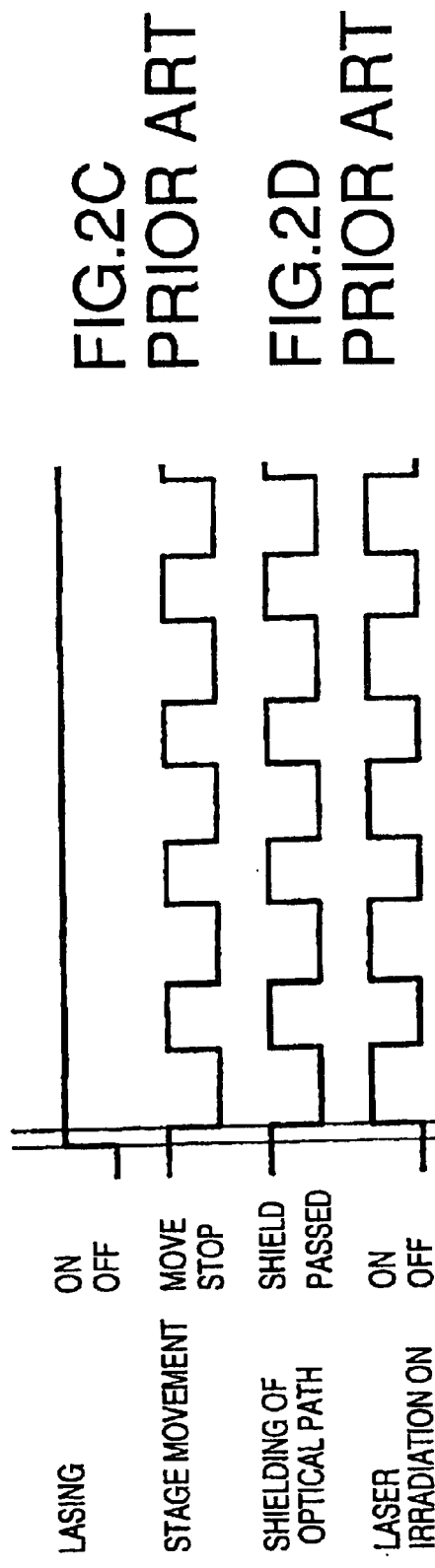
FIG.2A PRIOR ART
FIG.2B PRIOR ART
FIG.2C PRIOR ART
FIG.2D PRIOR ART
ILLUSTRATIVE TIMING CHARTS

ILLUSTRATIVE LASER PULSE SHAPE

RELATIONSHIP BETWEEN IRRADIATION INTENSITY AND COOLING RATE, AND COOLING RATE AT WHICH THE MATERIAL BECOMES AMORPHOUS

RELATIONSHIP BETWEEN MAXIMUM COOLING RATE AFTER APPLICATION OF SECOND PULSE AND THE COOLING RATE IN THE VICINITY OF SOLIDIFICATION POINT

TEMPERATURE OF SILICON THIN FILM 75nm THICK ON A SiO₂ SUBSTRATE IRRADIATED AT AN INTENSITY OF 450mJ/cm² BY XeCL LASER (WAVELENGTH: 308nm)

339 mJ/cm2    424 mJ/cm2    470 mJ/cm2

ELECTRON MICROSCOPIC PHOTOGRAPHS OF LASER-INDUCED CRYSTALLIZED FILMS AFTER ZERO-ETCHING RELATIVE TO IRRADIATION INTENSITY AND NUMBER OF IRRADIATION TIME

ALIGNMENT MECHANISM

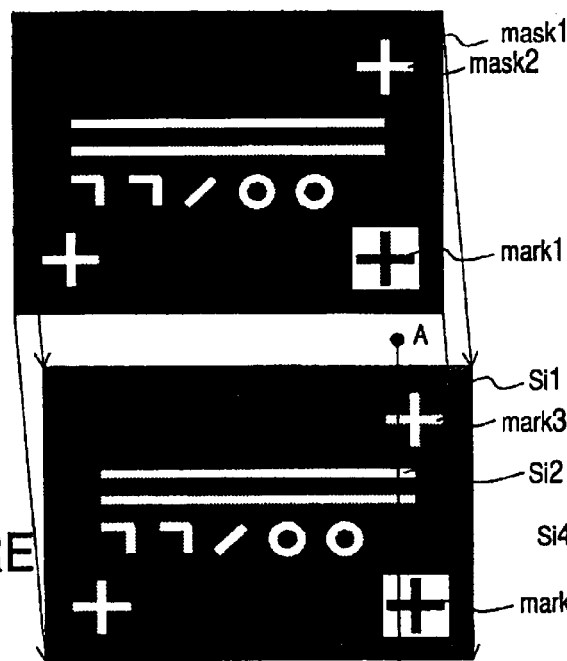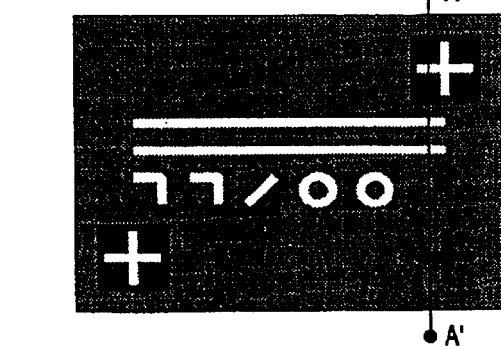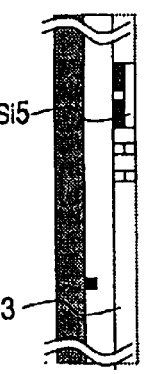
FIG. 13A MASK PATTERN
FIG. 13B EXPOSURE PATTERN
FIG. 13C A-A' CROSS SECTION
FIG. 13D ETCHING PATTERN
FIG. 13E
PATTERN TRANSFER AND ALIGNMENT IN EXCIMER LASER ANNEALING

PLASMA-ENHANCED CVD CHAMBER-SUBSTRATE TRANSFER
CHAMBER-LASER IRRADIATING CHAMBER

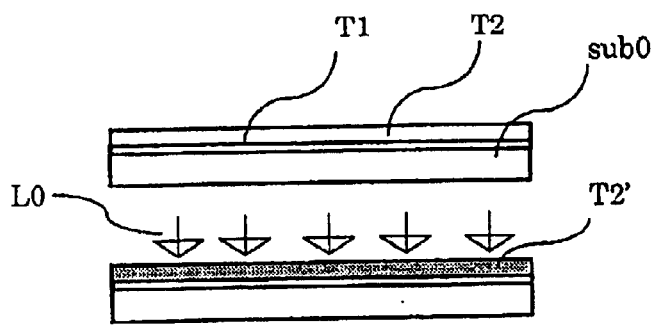
FIG. 18A
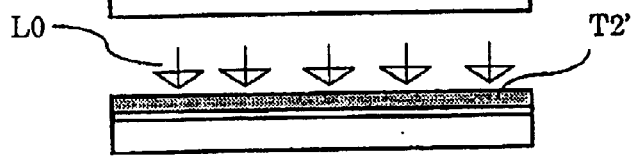
FIG. 18B
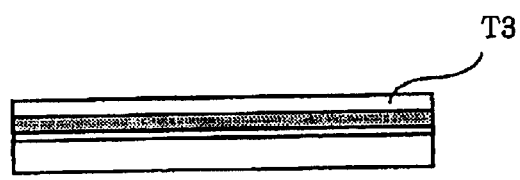
FIG. 18C
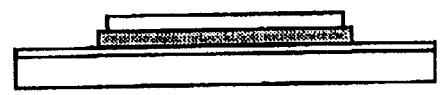
FIG. 18D
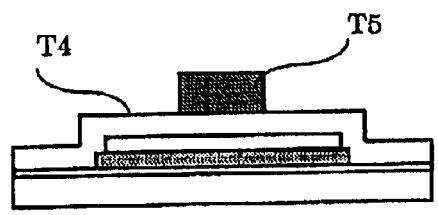
FIG. 18E
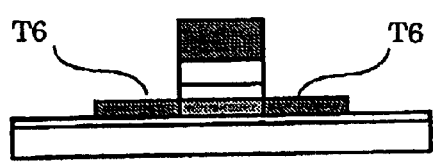
FIG. 18F1
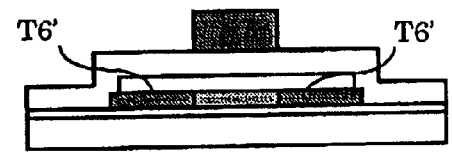
FIG. 18F2
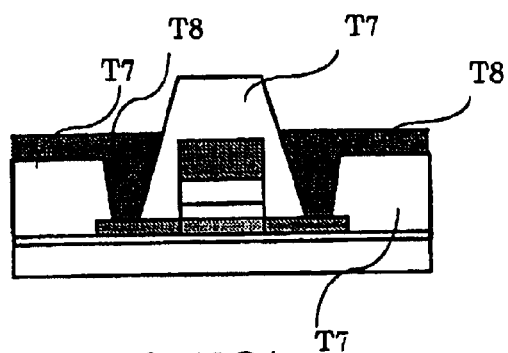
FIG. 18G1
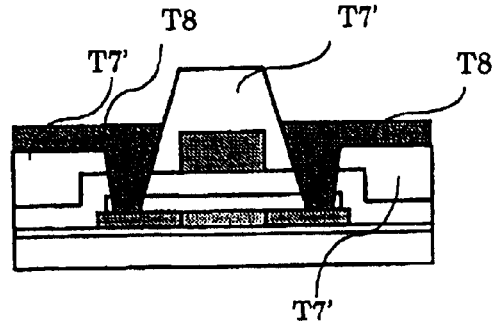
FIG. 18G2

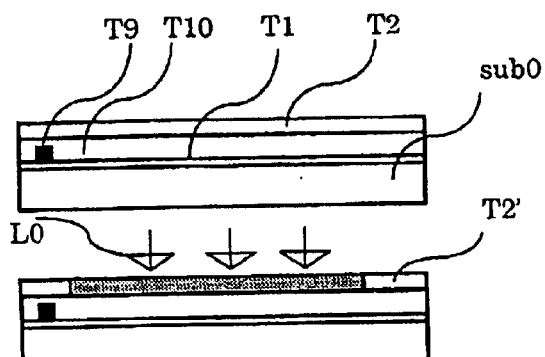
FIG. 19A
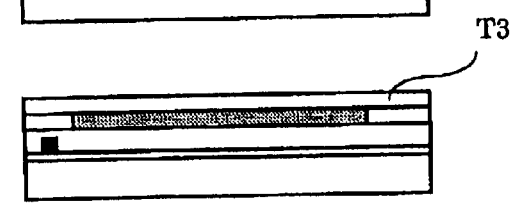
FIG. 19B
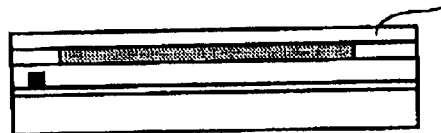
FIG. 19C
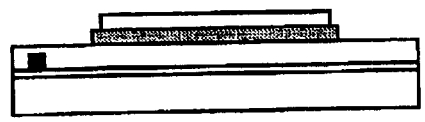
FIG. 19D
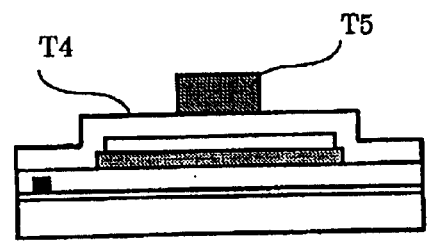
FIG. 19E
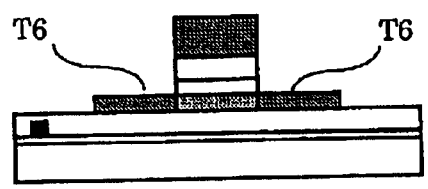
FIG. 19F1
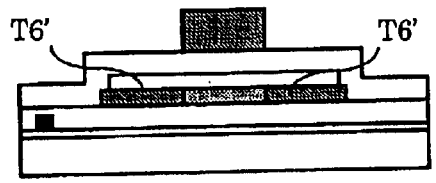
FIG. 19F2
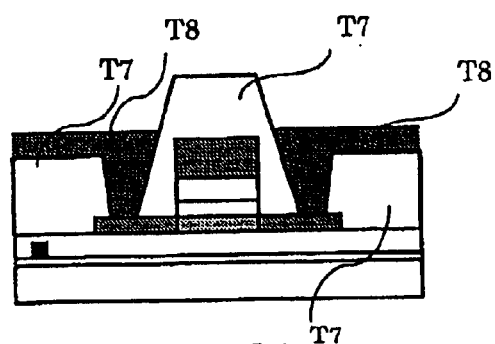
FIG. 19G1
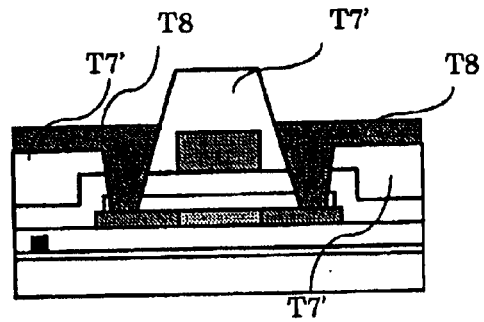
FIG. 19G2

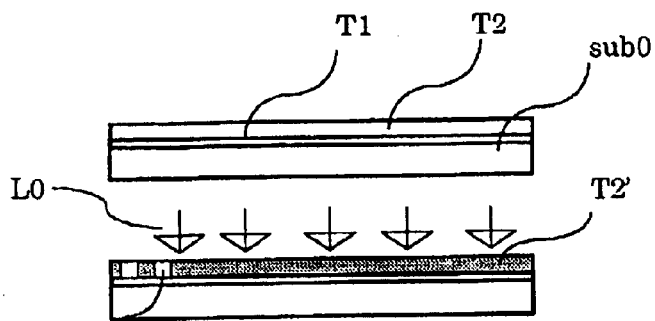
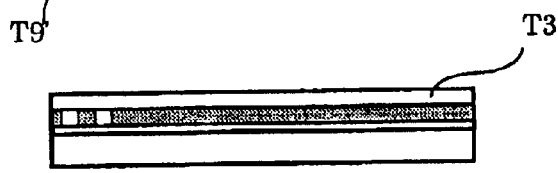
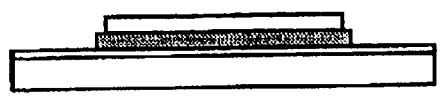
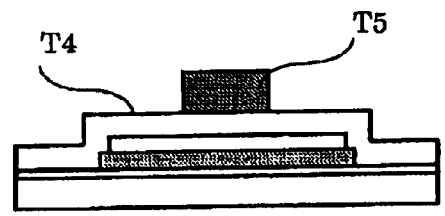
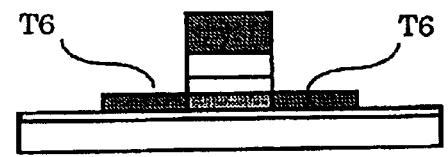
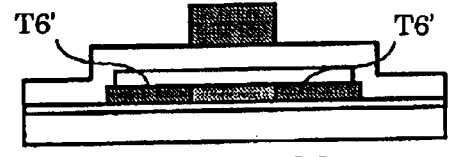
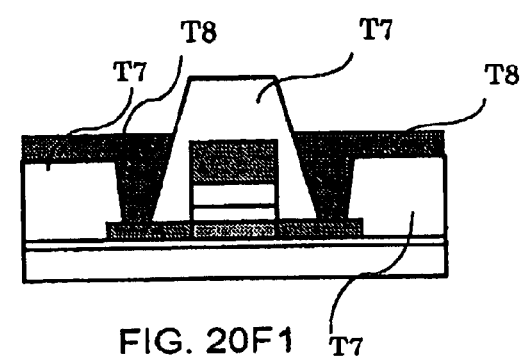
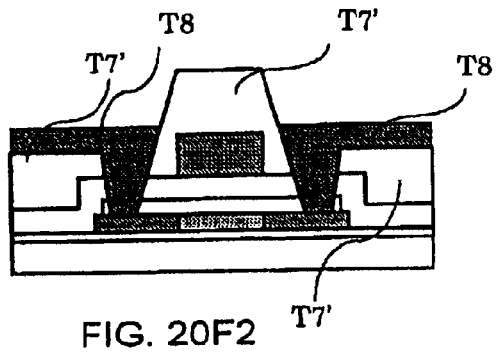
FIG. 20A
FIG. 20B
FIG. 20C
FIG. 20D
FIG. 20E
FIG. 20G1
FIG. 20G2
FIG. 20F1
FIG. 20F2

$t_0$ : START OF $O_2$ DISCHARGE
$t_1$ : START OF $SiH_4$ SUPPLY
$t_2$ : $SiH_4$ SUPPLY ATTAINS A CONSTANT LEVEL

S SYSTEM FOR THE FORMATION OF A SILICON THIN FILM AND A SEMICONDUCTOR-INSULATING FILM INTERFACE

BACKGROUND OF THE INVENTION

1. Field of the Invention

This invention relates to a system for the formation of a silicon thin film and a good-quality semiconductor-insulating film interface. Such silicon thin films are used for crystalline silicon thin film transistors, and such semiconductor-insulating film interfaces are employed for field effect transistors. The invention also relates to a semiconductor thin film forming system by the pulsed laser exposure method. Such semiconductors include, for example, silicon germanium (SiGe), silicon carbide (SiC), and other silicon compounds, and GaAs, GaN, $CuInSe_2$, ZeSe, and other compound semiconductors. In addition, the invention relates to a system for the manufacture of driving elements or driving circuits composed of the semiconductor thin films or field effect thin film transistors for displays and sensors, for example.

2. Description of the Related Art

Typical processes for the formation of a thin film transistor (TFT) on a glass substrate are a hydrogenated amorphous silicon TFT process and a polycrystalline silicon TFT process. In the former process, the maximum temperature in a manufacture process is about 300° C., and the carrier mobility is about 1 $cm^2$/Vsec. Such a hydrogenated amorphous silicon TFT formed by the former process is used as a switching transistor of each pixel in an active matrix (AM) liquid crystal display (LCD) and is driven by a driver integrated circuit (IC, an LSI formed on a single crystal silicon substrate) arranged on the periphery of a screen. Each of the pixels of this system includes an individual switching element TFT, and this system can yield a better image quality with less crosstalk than a passive matrix LCD. In such a passive matrix LCD, an electric signal for driving the liquid crystal is supplied from a peripheral driver circuit. In contrast, the latter polycrystalline silicon TFT process can yield a carrier mobility of 30 to 100 $cm^2$/Vsec by, for example, employing a quartz substrate and performing a process at high temperatures of about 1000° C. as in the manufacture of LSIs. For example, when this process is applied to a liquid crystal display manufacture, such a high carrier mobility can yield a peripheral driver circuit on the same glass substrate concurrently with the formation of pixel TFTs for driving individual pixels. This process is therefore advantageous to minimize manufacture process costs and to downsize the resulting products. If the product should be miniaturized and should have a higher definition, a connection pitch between an AM-LCD substrate and a peripheral driver integrated circuit must be decreased. A conventional tab connection method or wire bonding method cannot significantly provide such a decreased connection pitch. However, if a process at high temperatures as in the above case is employed in the polycrystalline silicon TFT process, low softening point glasses cannot be employed. Such low softening point glasses can be employed in the hydrogenated amorphous silicon TFT process and are available at low costs. The process temperature in the polycrystalline silicon TFT process should be therefore decreased, and techniques for the formation of polycrystalline silicon films at low temperatures have been developed by utilizing a laser-induced crystallization technique.

Such a laser-induced crystallization is generally performed by a pulse laser irradiator having a configuration shown in FIG. 1. A laser light supplied from a pulse laser source 1101 reaches a silicon thin film 1107, a work, on a glass substrate 1108 via an optical path 1106. The optical path 1106 is specified by a group of optic devices including mirrors 1102, 1103, and 1105, and a beam homogenizer 1104. The beam homogenizer 1104 is arranged to uniformize spatial intensities of laser beams. Generally, the glass substrate on an X-Y stage 1109 is moved to irradiate a selected position on the substrate with a laser beam. The laser irradiation can be also performed by moving the optic device group or moving the optic device group and the stage in combination.

For example, J. Im and R. Sposili describe that a substrate is mounted on an X-stage, and a homogenizer is mounted on a Y-stage in FIG. 6 of "Crystalline Si films for integrated active-matrix-liquid-crystal displays", *Materials Research Society Bulletin*, vol. 21, (1996), p. 39 (Reference 1).

Laser irradiation is also performed in vacuo or in a high purity gaseous atmosphere. Where necessary, the system has a cassette 1110 and a substrate traveling mechanism 1111. The cassette 1110 houses glass substrates each with a silicon thin film, and the substrate traveling mechanism 1111 serves to move the substrate between the cassette and the stage to house the substrate in the cassette or to mount the substrate on the stage.

Japanese Patent Publication (JP-B) No. 7-118443 discloses a technique of irradiating an amorphous silicon thin film on an amorphous substrate with a short wavelength pulse laser light. This technique can crystallize an amorphous silicon while keeping the overall substrate from high temperatures, and can produce semiconductor elements or semiconductor integrated circuits on large substrates available at low costs. Such large substrates are required in liquid crystal displays, and such substrate available at low costs may be glasses, for example. However, as is described in the above publication, the crystallization of an amorphous silicon thin film by action of a short wavelength laser light requires an irradiation intensity of about 50 to 500 $mJ/cm^2$. However, the maximum emission output of a conventionally available pulse laser irradiator is at most about 1 J/pulse, and an area to be irradiated by a single irradiation is at most about 2 to 20 $cm^2$, by a simple conversion. For example, if the overall of a 47 cm×37 cm substrate should be crystallized by action of laser, at least 87 to 870 points of the substrate must be irradiated with a laser light. Likewise, the number of points to be irradiated with a laser light increases with an increasing size of the substrate, for example, as in a 1 m×1 m substrate. Such a laser-induced crystallization is generally performed by a pulse laser irradiator having a configuration shown in FIG. 1.

To form uniform thin film semiconductor elements on a large substrate by the above technique, an effective process is known as disclosed in Japanese Unexamined Patent Publication (JP-A) No. 5-211167 (Japanese Patent Application No. 3-315863). The process includes the steps of dividing the elements to portions smaller than the beam size of the laser and repeating a combination of irradiation with several pulses and movement of the area to be irradiated by step-and-repeat drawing method. In the process, the lasing and the movement of a stage (i.e., the movement of a substrate or laser beam) are alternatively performed, as shown in FIG. 2B. However, even according to this process, the variation of lasing intensity exceeds ±5% to ±10% when the irradiation procedure is repeated at a density of about 1 pulse per irradiated portion to 20 pulses per irradiated portion using a currently available pulse laser irradiator with a uniformity of lasing intensity of ±5% to ±10% (in continuous lasing). The resulting polycrystalline silicon thin film and polycrystalline silicon thin film transistor cannot therefore have satisfactorily uniform characteristics. Particularly, the generation of a strong or weak light caused by an unstable discharge at early stages of lasing significantly invites such heterogeneous characteristics. This phenomenon is called spiking. As a possible solution to the spiking, a process of controlling an applied voltage in a subsequent lasing with reference to the results of integrated strengths can be employed. However, according to this process, a rather weak light is oscillated even though the formation of spiking is inhibited. Specifically, when irradiation periods and non-lasing periods alternatively succeed, the intensity of a first irradiated pulse in each irradiation period is most unstable and is varied, as shown in FIG. 3. In addition, the history of irradiation intensity differs from point to point to be irradiated. The resulting transistor element and thin film integrated circuit cannot have a significant uniformity in the substrate plane.

To avoid such a spiking, a process is known to start lasing prior to the initiation of irradiation to an area for the formation of element, as shown in FIG. 2A. However, this technique cannot be applied to a process of intermittently repeating the lasing and the movement of stage. To avoid these problems, a process is proposed in Japanese Unexamined Patent Publication (JP-A) No. 5-90191. The process includes the steps of allowing a pulse laser source to continuously oscillate and inhibiting irradiation of a substrate with the laser light by an optic shielding system during the movement of the stage. Specifically, as shown in FIG. 2C, a laser is continuously oscillated at a predetermined frequency, and the movement of stage to a target irradiation position is brought into synchronism with the shielding of an optic path. By this configuration, a laser beam with a stable intensity can be applied to a target irradiation position. However, although this process can stably irradiate the substrate with a laser beam, the process also yields increased excess lasing that does not serve to the formation of a polycrystalline silicon thin film. The productivity is decreased from the viewpoint of the life of an expensive laser source and an excited gas, and the production efficiency of the polycrystalline silicon thin film is deteriorated with respect to power required for lasing. The production costs are therefore increased. When a substrate to be exposed to laser is irradiated with an excessively strong light as compared with a target intensity, the substrate will be damaged. Such an excessively strong light is induced by an irregular irradiation intensity. In LCDs and other imaging devices, a light passing through the substrate scatters in an area where the substrate is damaged, and the quality of image is deteriorated.

A process for reducing and projecting a pattern on a photo mask onto a silicone thin film is disclosed by R. Sposili and J. Im in "Sequential lateral solidification of thin silicon films on $SiO_2$", *Applied Physics Letters*, vol. 69 (1996), p. 2864 (Reference 2), and by J. Im, R. Sposili, and M. Crowder in "Single-crystal Si films for thin film transistor devices", *Applied Physics Letters*, vol. 70, (1997), p. 3434 (Reference 3). The process disclosed in these publications performs an about 1:5 reduction projection alignment using a 308-nm excimer laser, a variable-energy attenuator, a variable-focus field lens, a patterned-mask, a two-element imaging lens, and a sub-micrometer-precision translation stage. By this configuration, the process attains a beam size and a travel pitch of a substrate stage, both of the order of micrometers.

However, a laser beam applied onto the photo mask has a spatial intensity profile depending on the light source, and when the process is applied to the processing of a large substrate as mentioned above, the strength of a patterned light passing through the center of the mask and that passing through the periphery of the mask critically differ from each other. Accordingly, a crystalline silicon thin film having a desired uniformity cannot be significantly obtained. In addition, as an ultraviolet radiation with a short wavelength is reduced and projected, the focal depth of the beam is small and the irradiation depth is liable to shift due to warp or deformation of the substrate. With an increasing area of the substrate, the mechanical precision of the stage cannot be significantly ensured, and a little tilt of the stage or a displacement of the substrate on the stage disturbs a target laser irradiation.

A process is known for the laser irradiation. In this process, a plurality of pulses are applied while the irradiation of each pulse is retarded. This process is disclosed by Ryoichi Ishihara et al. in "Effects of light pulse duration on excimer laser crystallization characteristics of silicon thin films", *Japanese Journal of Applied Physics*, vol. 34, No. 4A, (1995), p. 1759 (Reference 4). According to this reference, the crystallization solidification rate of a molten silicon in a laser recrystallization process is 1 m/sec or more. To achieve a satisfactory growth of crystals, the solidification rate must be reduced. By applying a second laser pulse immediately after the completion of solidification, the second irradiation of laser pulse can yield a recrystallization process with a reduced solidification rate. In viewing a temperature change (a time-hysteresis curve) of silicon as shown in FIG. 4, the temperature of silicon increases with the irradiation of laser energy, for example, as a pulse with an intensity shown in FIG. 5. When a starting material is an amorphous silicon (a-Si), the temperature further increases after the melting point of a-Si, and when the supplied energy becomes less than the energy required for increasing the temperature, the material begins to undergo cooling. At the solidifying point of a crystalline Si, the solidification proceeds for a solidification time and then completes, and the material is cooled to an atmospheric temperature. Provided that the solidification of silicon proceeds in a thickness direction from an interface between silicon and the substrate, an average solidification rate is calculated according to the following equation.

Average solidification rate=(Thickness of silicon)/(Solidification time)

Specifically, if the thickness of silicon is constant, the solidification time is effectively prolonged to reduce the solidification rate. If the process maintains ideal conditions on thermal equilibrium, the solidification time can be prolonged by increasing an ideally supplied energy, i.e., a laser irradiation energy. However, as pointed out in the above reference, such an increased irradiation energy invites the resulting film to become amorphous or microcrystalline. In an actual melting and recrystallization process, the temperature does not change in an ideal manner as shown in FIG. 4, and the material undergoes overheating when heated and undergoes supercooling when cooled, and attains a stable condition. Particularly, when the cooling rate in cooling procedure is extremely large and the material undergoes an excessive supercooling, the material is not crystallized at around its solidification point, and becomes an amorphous solid due to quenching and rapid solidification. Under some conditions, thin films are converted not into an amorphous solid but into microcrystals, as shown in the above Reference 4. Such a microcrystalline thin film has an extremely small grain size as compared with a polycrystalline thin film or a single-crystal thin film. Thus, the microcrystalline thin film includes a multitude of grain boundaries each having a large grain boundary potential. If the thin film is applied to, for example, a thin film transistor, the resulting thin film transistor will have a decreased ON-state current or an increased OFF-state leak current.

Separately, processes are known, which include a step for the formation of a-Si thin film as a material to be irradiated with laser, a step for irradiating the thin film with a laser, a step for hydrogenation with plasma, and a step for the formation of a gate insulating film, in this order or in a modified order, while the material thin film is kept from exposure to the air. These processes are disclosed in the following publications.

Japanese Unexamined Patent Publication No. 5-182923 discloses a technique of subjecting an amorphous semiconductor thin film to a heat treatment and irradiating the treated thin film with a laser beam while keeping the thin film from exposure to the air.

Japanese Unexamined Patent Publication No. 7-99321 discloses a technique of moving a substrate having a laser-induced crystallized polycrystalline silicon thin film to a plasma-enhanced hydrogenation step and a formation step of a gate insulating film while keeping the substrate from exposure to the air.

Japanese Unexamined Patent Publication No. 9-7911 discloses a technique of moving a substrate having a laser-induced crystallized polycrystalline silicon thin film to a formation step of a gate insulating film while keeping the substrate from exposure to the air.

Japanese Unexamined Patent Publication No. 9-17729 discloses a technique of moving a substrate having a laser-induced crystallized polycrystalline silicon thin film to a formation step of a gate insulating film while keeping the substrate from exposure to the air. By this configuration, the surface of the polycrystalline silicon is kept from adhesion of impurities.

Japanese Unexamined Patent Publication No. 9-148246 discloses a technique of sequentially performing the formation of an amorphous silicon thin film, laser-induced crystallization, hydrogenation, and the formation of a gate insulating film, without exposing the work to the air.

Japanese Unexamined Patent Publication No. 10-116989 discloses a technique of sequentially performing the formation of an amorphous silicon thin film, laser-induced crystallization, hydrogenation, and the formation of a gate insulating film, without exposing the work to the air.

Japanese Unexamined Patent Publication No. 10-149984 discloses a technique of sequentially performing the formation of an amorphous silicon thin film, laser-induced crystallization, hydrogenation, and the formation of a gate insulating film, without exposing the work to the air.

Japanese Unexamined Patent Publication No. 11-17185 discloses a technique of sequentially performing the formation of an amorphous silicon thin film, laser-induced crystallization, the formation of a gate insulating film, and the formation of a gate electrode, without exposing the work to the air.

These concepts and techniques have been proposed to solve the following problems. Specifically, the surface of silicon formed by laser-induced crystallization is very active, and when the surface is exposed to the air, impurities are liable to adhere to the surface. Deteriorated or dispersed characteristics of the resulting TFT may therefore result.

Accordingly, the present inventors compared the performance between when an excimer laser-induced crystallization process and a silicon oxide film formation process are performed in the same system (including transfer of the substrate to another system without exposing the substrate to the air) and when the film is once exposed to the air. The results of this experiment revealed that the former technique can inhibit adhesion of dusts and particles and therefore greatly effectively improves yields of products. However, by increasing levels of cleanliness of clean room surroundings, equivalent advantages as above can be obtained to some extent. To improve the yields, a system including a film forming system and a cleaning mechanism of the substrate in the same system is most effective. This is because particles are adhered to the substrate during film-formation under some conditions in an a-Si film forming step, and the film must be exposed to the air to thereby be cleaned outside the system.

In contrast, differences in production processes do not significantly affect the performances of thin film transistors. The reasons for this may be supposed as follows. For example, K Yuda et al. disclose a fixed oxide film charge density ($10^{11}$ to $10^{12}$ cm$^{-2}$) of a silicon oxide film and an interface state density ($6\times10^{10}$ cm$^{-2}$ eV$^{-2}$ or less) between a silicon substrate and the silicon oxide film in "Improvement of structural and electrical properties in low-temperature gate-oxides for poly-Si TFTs by controlling O$_2$/SiH$_4$ ratios", *Digest of Technical Papers* 1997 *International Workshop on Active Matrix Liquid Crystal Displays*, Sep. 11–12, 1997, Kogakuin Univ., Tokyo, Japan, 87 (Reference 5). The above silicon oxide film is formed at a temperature of about 300° C. to 350° C. with plasma or formed through a heat treatment at about 600° C. The silicon substrate is generally subjected to an "RCA cleaning", is washed with water and is then introduced into a film forming system. In the RCA cleaning, the substrate is cleaned with an acidic solution, heated where necessary, such as a sulfuric acid-hydrogen peroxide mixture, a hydrochloric acid-hydrogen peroxide-water mixture, an ammonia-hydrogen peroxide-water mixture, or a hydrofluoric acid-water mixture. The aforementioned interface state density is obtained from a sample of a single-crystal silicon substrate that is exposed to the air after the formation of a clean surface (cleaning) and is then moved to the film-formation step.

Focusing attention to a trap state density of the laser-induced crystallized silicon film, H. Tanabe et al. disclose a trap state density of a crystallized silicon of $10^{12}$ to $10^{13}$ cm$^{-2}$ in thin film transistors with laser-induced crystallized silicon films, in "Excimer laser crystallization of amorphous silicon films", *NEC Research and Development*, vol. 35, (1994), 254 (Reference 6). These transistors exhibit satisfactory properties of a field effect mobility of 40 to 140 cm$^2$ Nsec.

The trap state density of the silicon film is significantly larger than the interface state density (or fixed oxide film charge density) of the silicon film. Specifically, to obtain satisfactorily advantages of a clean surface of a sample that is obtained by forming a silicon film and a gate insulating film in the same system without exposing the substrate to the air, the performance (the trap state density) of the silicon film is still insufficient.

As a means for reducing damage by plasma and forming a gate insulating film of good quality, a remote plasma-enhanced chemical vapor deposition (CVD) process has been proposed. For example, Japanese Unexamined Patent Publication (JP-A) No. 5-21393 discloses a configuration in which a plasma generating chamber is separated from a substrate processing chamber. This configuration is supposed to attain such a low fixed oxide film charge density of $10^{11}$ to $10^{12}$ cm$^{-}$2 and a low interface state density of $6\times10^{10}$ cm$^{-}$2 eV$^{-2}$ or less as mentioned above. However, this advantage is restricted by the performances of a silicon film which is previously formed.

SUMMARY OF THE INVENTION

Accordingly, an object of the invention is to provide a process for forming a semiconductor thin film with a reduced trap state density by light irradiation and to provide a process and system for applying the above process to large substrates with a high reproducibility.

Another object of the invention is to provide a means for forming a satisfactory gate insulating film on the semiconductor thin film of good quality and to provide a system for producing a field effect transistor having a satisfactory semiconductor-insulating film interface, i.e., satisfactory properties.

(1) The invention provides, in a first aspect, a semiconductor thin film forming system for modifying a predetermined region of a semiconductor thin film by exposing the semiconductor thin film to a projected light patterned through plural patterns formed on a photo mask. The system includes a mechanism for uniformizing the light to be applied in such a manner that the intensity of the light in a predetermined area on the photo mask distributes within a range of ±11.2% of the average intensity of the light in the area. According to the configuration, the exposure light is uniformized to a spatial uniformity of about ±11.2% or less with, for example, a beam homogenizer and is then applied onto the photo mask. At least the spatial distribution of peak intensity of the light projected and applied on the semiconductor thin film is uniformized to an identical extent with that of the intensity distribution on the photo mask. As a result, the overall exposed regions of the semiconductor thin film can be modified by laser irradiation in a desired manner.

(2) In a second aspect, the invention provides a semiconductor thin film forming system for modifying a predetermined region of a semiconductor thin film by exposing the semiconductor thin film to a projected light patterned through an exposure pattern formed on a photo mask, and the semiconductor thin film is formed on a substrate held on a substrate stage. The system includes a mechanism for sequentially scanning the semiconductor thin film with the patterned light by individually or concurrently driving the photo mask and the substrate stage. When an area on the substrate projected and irradiated with the light through the photo mask has a size smaller than that of the substrate, the substrate is moved to an irradiation area by action of the substrate stage. A mask stage is moved with response to the irradiation of a laser beam while the substrate is fixed, and target regions of the thin film can be sequentially exposed to light.

(3) The invention provides, in a third aspect, a semiconductor thin film forming system for modifying a predetermined region of a semiconductor thin film by exposing the semiconductor thin film to a projected light patterned through an exposure pattern formed on a photo mask. The system includes a focusing mechanism for obtaining the focus of the patterned light on the predetermined region of the semiconductor thin film when the semiconductor thin film is exposed to the projected patterned light. When the substrate is moved to an irradiated area by action of the substrate stage, the focus may be shifted and the focal position may differ between the center and the periphery of the substrate. The shift is caused by warp, deformation of the substrate, variation of thickness, or variation of the degree of verticality of the substrate stage relative to the exposure axis. Even in this case, the above configuration can adjust the focus as the need arises, and can provide exposure all over the substrate in a desired manner with a good reproducibility.

(4) According to a fourth aspect, the invention provides a semiconductor thin film forming system for modifying a predetermined region of a semiconductor thin film by exposing the semiconductor thin film to a projected exposure beam patterned through a pattern formed on a photo mask. The system includes a tilt correcting mechanism (or a leveling mechanism) for correcting the tilt of the projected patterned beam relative to the semiconductor thin film. When the substrate is moved to an irradiated area by action of the substrate stage, the focal axis may be shifted and differ between the center and the periphery of the substrate. This shift is caused by warp, deformation of the substrate, variation of thickness, or variation of the degree of verticality of the substrate stage relative to the exposure axis. Even in this case, the above configuration can correct the tilt or level of the substrate as the need arises, and can provide exposure all over the substrate in a desired manner with a good reproducibility.

(5) The invention provides, in a fifth aspect, a semiconductor thin film forming system for modifying a predetermined region of a semiconductor thin film by exposing the semiconductor thin film to a projected exposure beam patterned through a pattern formed on a photo mask. The system includes an alignment mechanism (or an alignment function) for aligning the patterned exposure beam relative to a mark formed on a substrate, on which the semiconductor thin film is deposited. By specifying an exposure area with reference to the alignment mark previously fomned, a semiconductor thin film can be exposed and modified in a target region under target exposure conditions. For example, a channel region of a transistor alone can be exposed and modified. Specifically, source-drain and channel regions can be sequentially patterned and formed according to the modified regions in successive steps.

(6) In a sixth aspect, the invention provides a semiconductor thin film forming system for modifying a predetermined region of a semiconductor thin film by exposing the semiconductor thin film to a projected light patterned through a pattern formed on a photo mask. The system includes a mechanism (or a function) for holding a substrate on a stage, the semiconductor thin film being deposited on the substrate. When an area on the substrate projected and irradiated with the light through the photo mask has a size smaller than that of the substrate, the substrate is moved to an irradiated area by action of the substrate stage. A mask stage is moved according to the irradiation of a laser beam while the substrate is fixed, and target regions of the film are sequentially exposed to light. In this case, the substrate on the stage is displaced due to, for example, the movement of the substrate stage. Particularly when a rotation correction (θcorrection) is required, corrections upon the dislocation of the substrate deteriorate throughput, and the substrate must be fixed and held. When the substrate is heated on the stage, the substrate warps or bends due to heating, which causes shift of the focus or tilt of the substrate from the exposure axis. The above configuration can avoid these problems.

(7) In a seventh aspect, the invention provides a semiconductor thin film forming system for modifying a predetermined region of a semiconductor thin film by exposing the semiconductor thin film to a projected exposure beam patterned through a pattern formed on a photo mask. The system includes a composing mechanism for composing a plurality of laser beams into the exposure beam.

(8) In the system just mentioned above, the plurality of laser beams preferably comprises first and second laser beams, and the composing mechanism preferably composes the first and second laser beams in such a manner that the second laser beam is applied onto the semiconductor thin film with a delay relative to the first laser beam.

FIG. 6 shows the relationship of the maximum cooling rate (cooling rate, K/sec) obtained by mathematical calculation with the threshold irradiation intensity between crystallization and microcrystallization. In this case, a 75-nm silicon thin film is irradiated with an excimer laser with a wavelength of 308 nm, and the threshold is obtained by a scanning electron microscopic (SEM) observation of the silicon thin film after laser irradiation. FIG. 5 shows an emission pulse shape of the laser used in the experiment. This pulse shape exhibits a long emission time five times or more that of a rectangular pulse with a pulse width of 21.4 nsec described in the Reference 6. Even a single pulse irradiation with the pulse shape in question is therefore expected to reduce the solidification rate as described in the Reference 6.

FIG. 7 shows a calculated temperature-time curve of silicon in laser recrystallization using the pulse shape in question. Specifically, FIG. 7 shows the temperature change of a silicon thin film 75 nm thick on a $SiO_2$ substrate when an XeCl laser having a wavelength of 308 nm is applied at an irradiation intensity of 450 $mJ/cm^2$. About 60 nsec into the irradiation, a second emission peak nearly completes, and the temperature attains the maximum and then begins to decrease. In this connection, in the mathematical calculation, a melting-solidification point of amorphous silicon is employed as the melting-solidification point, and the behavior of the material around the solidification point differs from that in the actual case. Particularly when a crystallized film is obtained, the crystallization completes at the solidification point of the crystalline silicon.

The curve has a large gradient upon the initiation of cooling, but has a very small gradient at about 100 nsec, i.e., at a third emission peak. At an elapsed time of 120 nsec, the light emission completely ceases, and the silicon is then solidified through another rapid cooling process. Generally, when a liquid is solidified through "quenching" which is greatly out of a thermal equilibrium process, a sufficiently long solidification time cannot be obtained to form a crystal structure, and the resulting solid is amorphous (non-crystal).

The maximum cooling rate was estimated from a temperature-time curve of silicon as shown in FIG. 7. FIG. 6 shows the estimated maximum cooling rates after the completion of light emission with respect to individual irradiation intensities. The figure shows that the cooling rate increases with an increasing irradiation intensity.

Separately, the structure of the silicon thin film after laser irradiation was observed with a scanning electron microscope. As a result, the grain size once increased with an increasing irradiation intensity, but microcrystallization was observed at a set irradiation intensity of about 470 $mJ/cm^2$. When the film was irradiated with three laser pulses, the grain size markedly increased even at a set irradiation intensity of about 470 $mJ/cm^2$, while a microcrystallized region partially remained (FIG. 8). This large increase of the grain size differs from the behavior of the grain size in the one-pulse irradiation. In this connection, an actual irradiation intensity is 5% to 10% higher than the set level, typically in initial several pulses of excimer laser. The threshold intensity at which microcrystallization occurs can be therefore estimated as about 500 $mJ/cm^2$.

Based on these results, the cooling rate at 500 $mJ/cm^2$ as shown in FIG. 6 is estimated, and microcrystallization is found to occur at a cooling rate of about $1.6 \times 10^{10\circ}$ C./sec or more. When the film to be irradiated is an a-Si film, the microcrystallization occurs at an irradiation intensity of about 500 $mJ/cm^2$ or more. Likewise, when the film to be irradiated is a poly-Si film, the microcrystallization may occur at an irradiation intensity about 30 $mJ/cm^2$ higher than that in the a-Si at the same cooling rate of about $1.6 \times 10^{10\circ}$ C./sec. By controlling the cooling rate to $1.6 \times 10^{10\circ}$ C./sec or less, therefore, the resulting crystal can be kept from becoming microcrystalline or amorphous and can satisfactorily grow.

Next, the case where a delayed second laser light is irradiated with a delay relative to a first laser light will now be described. As is described above, a laser light at a late light emission stage suppresses the increase of the cooling rate, and the cooling rate after the completion of light emission controls the crystallization. The last supplied energy is supposed to initialize precedent cooling processes. Specifically, by supplying an additional energy, a precedent cooling process is once initialized and a solidification process is repeated again, even if the crystal becomes amorphous or microcrystalline in the precedent cooling process. This is probably because the interval of light irradiation is very short of the order of nanoseconds, and loss of the energy by thermal conduction to the substrate and radiation to the atmosphere is small. The energy previously supplied therefore remains nearly as intact. In this assumption, a long time interval sufficient to dissipate heat is not considered. Accordingly, by controlling the cooling rate after the completion of a second heating by the additionally supplied energy, the crystal is expected to grow satisfactorily. As shown in FIG. 9, the cooling rate is controlled to a desired level by controlling the delay time of the second laser irradiation.

Next, the spatial intensity distribution of an irradiated beam will be described below. In laser irradiation with plural slits, the spatial distribution in a slit and the spatial intensity distribution between slits should be preferably constant. However, these intensities vary plus or minus several percents to plus or minus twenty percents due to restriction of designing and production of such optic devices. At worst, the intensities vary or distribute within a range of plus or minus several tens of percents. Such a high variation is caused by the change of the excimer laser beam with time or consumption of the optical system, or adhesion of foreign substances to the optical system. FIG. 10 shows the change of the average crystal grain size d obtained from a microscopic photograph as shown in FIG. 8. The average crystal grain size d depends on the irradiation intensity and the number N of irradiation times (the number of irradiated pulses), and is expressed by the formula $d=KN^n$, wherein K is a constant and n is an inclination. FIG. 10 indicates that the inclination n of the grain size changes with respect to the number N of irradiation times changes on the border of an irradiation intensity of about 450 $mJ/cm^2$. When target production conditions are designed based on the irradiation intensity and the number N of irradiation times per irradiated site, it is preferred not to concurrently employ a condition where $n=1/4$ and a condition where $n=1/7$, both in the spatial intensity distribution. Even if the intensity spatially varies, irradiation of the film should be preferably performed in such a manner that the irradiation intensity falls in a range of, for example, 521 to 470 $mJ/cm^2$ (a range of ±5.2% of an average intensity of 495 $mJ/cm^2$) or of 424 to 339 $mJ/cm^2$ (a range of +11.2% of an average intensity of 381.5 $mJ/cm^2$).

By this configuration, a laser-crystallized Si thin film exhibiting a minimized difference in average grain size can be obtained.

(9) In an eighth aspect, the invention provides a semiconductor thin film forming system having a process chamber, and the process chamber serves to modify a predetermined region of a semiconductor thin film by exposing the semiconductor thin film on a substrate to a projected light patterned through a pattern formed on a photo mask. The system includes a mechanism for moving the substrate from the process chamber to a different process chamber without exposing the substrate to the atmosphere (or the air).

(10) In the system just mentioned in (9), the different process chamber is preferably an insulating film forming chamber for the formation of an insulating film on the substrate.

By forming a semiconductor film-gate insulating film in the same system without exposing the film to the air, the trap state density of the semiconductor thin film becomes equal to or less than the interface state density, and the film can be sufficiently maintained clean to thereby yield a satisfactory semiconductor-insulating film interface.

(11) In the system according to the eighth aspect, the different process chamber may be preferably a semiconductor film forming chamber for the formation of a semiconductor film on the substrate.

(12) In the system according to the eighth aspect, the different process chamber may be preferably a heat treatment chamber for treating the substrate with heat.

(13) Preferably, the different process chamber in the system according to the eighth aspect is a plasma treatment chamber for subjecting the substrate to a plasma treatment by treating the substrate with plasma.

(14) In the system according to the eighth aspect, the process chamber is preferably a laser treatment chamber for modifying the predetermined region of the semiconductor thin film by exposing the semiconductor thin film on the substrate to a projected laser beam patterned through the pattern formed on the photo mask. The different process chamber is preferably another laser treatment chamber.

By these configurations, the invention can provide high-performance and multi-functional systems for the formation of semiconductors, can provide processes for producing thin film transistors with a high reproducibility, and can provide high-performance thin film transistors.

Specifically, the invention can provide 1) a highly stable semiconductor thin film processing system by which a cleaning process with cleaning solutions can be eliminated, 2) a multifunctional system by which a multitude of processes can be performed in the same system to yield a space-saving semiconductor processing system with a reduced area of the overall facilities, and 3) a process for producing a high performance thin film transistor at low costs, which can maintain the clean surface (interface) of silicon without the use of cleaning solutions.

(15) The different process chamber in the system indicated in one of (9) to (13) preferably includes a plasma generating source for generating plasma in a predetermined area of the different process chamber. The substrate is preferably placed in an area in the different process chamber other than the predetermined area.

(16) In the preferred system indicated in (13), the different process chamber includes a plasma generating source for generating plasma in a predetermined area of the different process chamber. The different process chamber serves to subject the substrate to the plasma treatment by reacting an excited gas with a different gas. The excited gas is excited by the plasma generated in the predetermined area. The different gas is introduced into the different process chamber without passing through the predetermined area.

By the configuration where the plasma generating chamber is separated from the substrate process chamber, damage induced by plasma can be reduced to yield a satisfactory gate insulating film. In addition, the trap state density of the semiconductor thin film becomes equal to or less than the interface state density, and a satisfactory semiconductor-insulating film interface can be obtained.

BRIEF DESCRIPTION OF THE DRAWINGS

FIGS. 2A to 2D are timing charts showing conventional and invented operation procedures of laser annealing.

FIGS. 13A to 13E are diagrams showing an embodiment (mask projection process) of the invented exposure system.

FIGS. 18A to 18G2 are sectional views showing the invented process for producing TFT.

FIGS. 19A to 19G2 are sectional views showing the invented process for producing TFT using an alignment mark.

FIGS. 20A to 20G2 are sectional views showing the invented process for producing TFT including the formation of an alignment mark.

DESCRIPTION OF THE PREFERRED EMBODIMENT

The embodiments of the invention will now be illustrated in detail with reference to the drawings.

Figure 11:
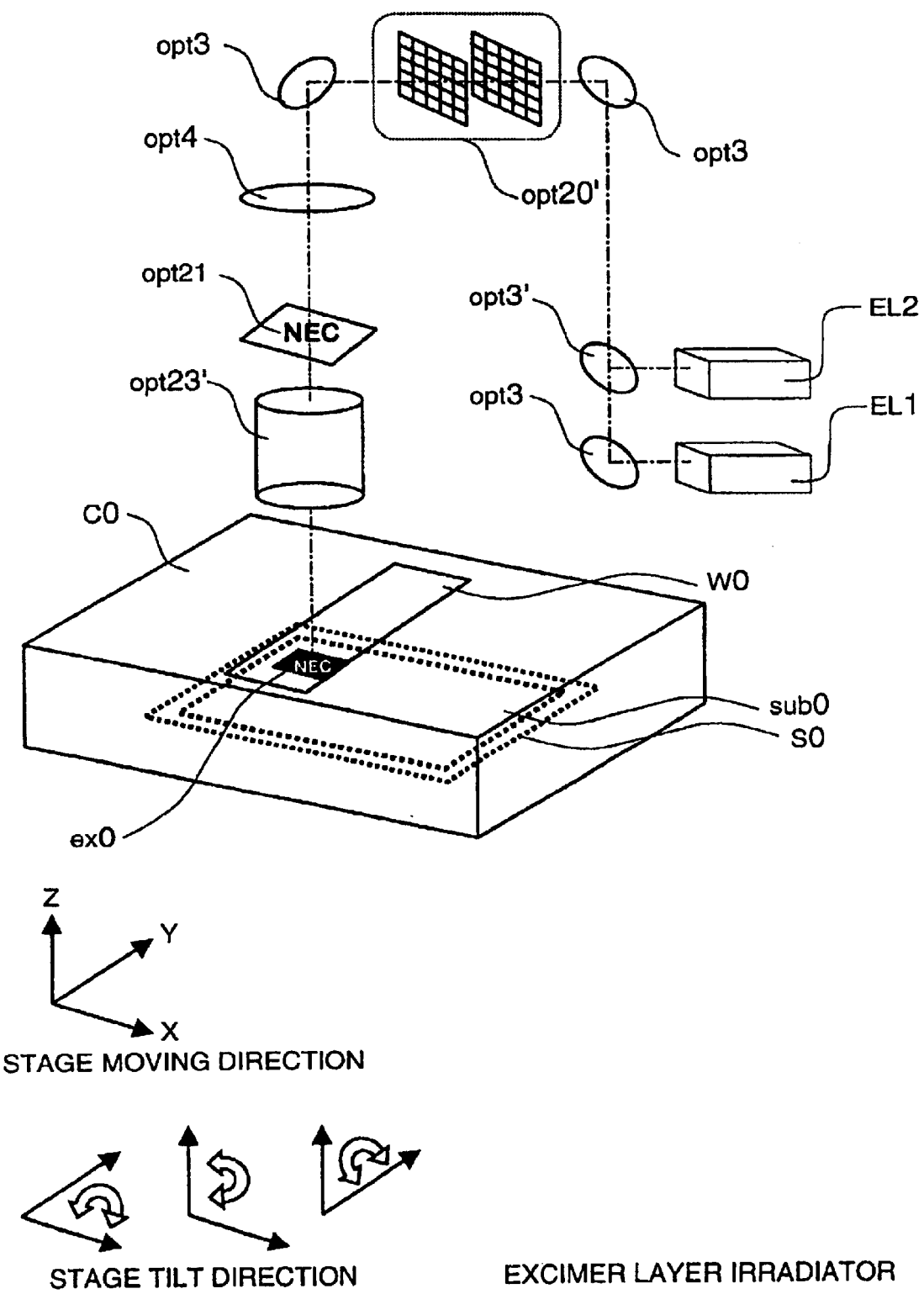
FIG. 11 is a diagram showing the overall configuration of an embodiment of the invented exposure system.

FIG. 11 shows an embodiment of the invention. Pulsed ultraviolet (UV) beams are supplied from a first excimer laser EL1 and a second excimer laser EL2 and are introduced via mirrors opt3 and otp3' and lenses opt4 to a homogenizer opt20'. The intensity profile of the beam is adjusted in the homogenizer so as to attain a target uniformity in a photo mask opt21, for example, an in-plane distribution of ±5%. Original beams supplied from the excimer lasers may have an intensity profile or total energy which varies pulse to pulse. The system therefore preferably includes a mechanism for adjusting the spatial intensity distribution and pulse-to-pulse intensity variation on the photo mask to achieve a higher uniformity. The homogenizer generally includes a fly-eye lens or a cylindrical lens. The patterned light formed by the photo mask is applied via a reduction projection optical system opt23' and a laser inlet window W0 onto a substrate sub0 placed in a vacuum chamber C0. The substrate is mounted on a substrate stage S0, and a target region, for example, a pattern transfer region ex0, can be exposed to the patterned light by operating the substrate stage. In FIG. 11, the reduction projecting optical system is illustrated, but the system can include a 1:1 projecting optical system or an enlargement projecting optical system. An optional region on the substrate is irradiated with the patterned light by moving the substrate stage in X-Y direction in the figure. The photo mask is mounted on a mask stage (not shown), and the beam to be applied on the substrate can be controlled also by moving the photo mask within a region capable of being exposed.

To apply a target patterned light onto the substrate under desired conditions, a mechanism is required. An illustrative mechanism will now be described. As an optical axis should be delicately and precisely adjusted, in the following example, the optical axis is once adjusted and then fixed, and the position of the substrate is adjusted to control the irradiation. For adjusting the position of the irradiated surface of the substrate relative to the optical axis, the position of the surface in a direction of the focus (Z direction) and the verticality relative to the optical axis must be corrected. Of the θxy tilt correction direction, θxz tilt correction direction, θyz tilt correction direction, X exposure region moving direction, Y exposure region moving direction, and Z focusing direction in the figure, the verticality relative to the optical axis is corrected by adjusting in the θxy tilt correction direction, θxz tilt correction direction, and θyz tilt correction direction. The position of the irradiated surface of the substrate is controlled to an appropriate position according to the focal depth of the optical system by adjusting the Z focusing direction.

Figure 12:
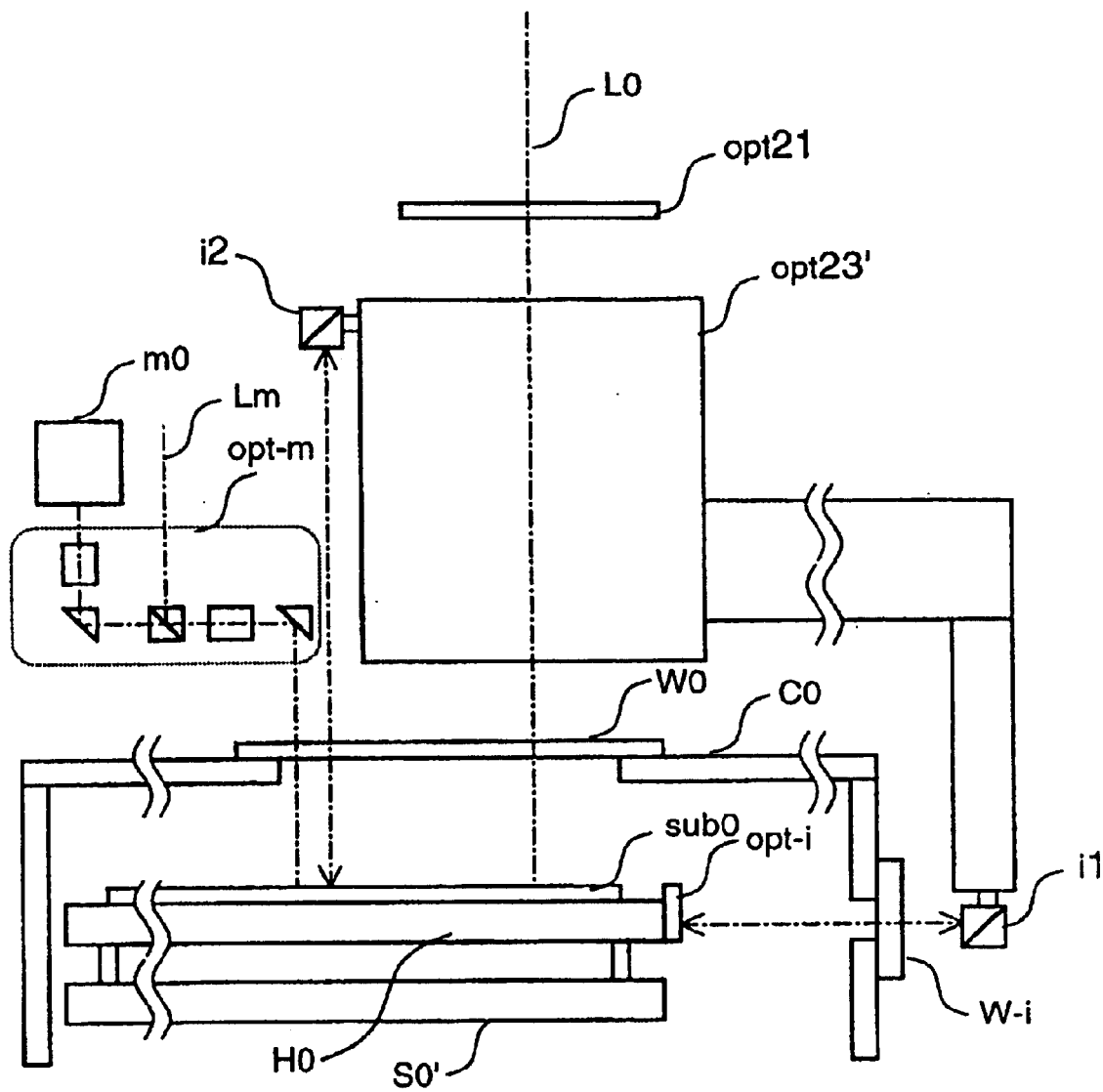
FIG. 12 is a diagram showing an embodiment (aligning process) of the invented exposure system.

FIG. 12 is an illustrative side sectional view of the adjustment and alignment mechanism of the substrate. The photo mask opt21, the reduction projection optical system opt23', and the laser inlet window W0 are arranged with respect to an exposure axis L0, as shown in the figure. The substrate sub0 placed in a vacuum chamber C0 is mounted on a heater H0 with a substrate adhesion mechanism, and a substrate-XYZθxyθxzθyz-stage S0'. In this embodiment, a vacuum chamber is used, but an actual light irradiation should be preferably performed in an atmosphere of, for example, an inert gas, hydrogen gas, oxygen gas, or nitrogen gas. The inside of the chamber is once evacuated and is then replaced with the above-mentioned gas. The pressure in the chamber may be around atmospheric (barometric) pressure. By using a heater with a substrate adhesion mechanism, the substrate can be heated at a temperature of from room temperature to about 400° C. in light irradiation procedure. When the inside pressure is set around barometric pressure, the substrate can be adhered to the heater through a vacuum chucking mechanism. Accordingly, the misalignment of the substrate can be inhibited even if the substrate stage moves in the chamber, and the supplied substrate can be surely fixed to the substrate stage even if the substrate has some warp or bending. In addition, the shift of the focal depth due to heat-induced warp or bending can be minimized.

Laser interferometers i1 and i2 make alignment of the substrate and a measurement of the position of the substrate in Z direction, via a length measuring window W-i and a length measuring mirror opt-i. To align the substrate, the position of an alignment mark on the substrate is determined with an off-axis microscope m0, a microscope light source Lm, and a microscope element opt-m. A target exposure position can be determined using information about the substrate position obtained from the laser interferometer system. In FIG. 12, the off-axis alignment is illustrated, but the invented system can also employ through-the-lens alignment or through-the-mask (through-the-reticle) alignment. In the measurement, measurement errors can be averaged by making measurements from plural measuring points and determining a linear coordinate based on the measured data through the least square method.

FIGS. 13A to 13E show the relationship between a mask pattern and an alignment mark. The mask includes a mask non-exposure area mask1 and a mask exposure area mask2. For example, when an excimer laser is used as the light source, a film that absorbs and reflects ultraviolet radiation is formed on a quartz substrate. The ultraviolet radiation passes through such a quartz substrate. The film is formed from, for example, aluminum, chromium, tungsten, or other metals, or is a dielectric multilayer film, and is then patterned by photolithography and etching processes to yield the mask. According to a target pattern on the mask (indicated by the white areas in FIG. 13A), a silicon film is exposed to yield exposed Si portions (Si2) in a non-exposed Si (Si1) as shown in FIGS. 13B and 13C. Where necessary, alignment and adjustment is conducted to make a mark on the mask mark1 agree with a mark on the substrate mark2 prior to exposure. A predetermined and designed region on the silicon thin film can be therefore exposed. In the thin film transistor forming process using a silicon thin film, if the exposure process is a first process requiring the alignment (i.e., no alignment mark is formed prior to the exposure process), an exposed mark mark3 should be preferably formed by exposure concurrently in the exposure process of the silicon thin film. By this procedure, an alignment mark can be formed using an optical color difference between a-Si and crystalline Si. By performing, for example, photolithography in a successive process with reference to the above alignment mark, transistors and other desired mechanisms and functions can be formed in target regions which are exposed and modified. Subsequent to the exposure process, an Si oxide film is formed on the silicon thin film and a target region of the silicon film is removed by etching. FIGS. 13D and 13E show the state just mentioned above. A removed Si region (Si3) is a region where the laminated silicon film and Si oxide film are removed by etching. In this configuration, Si oxide films (Si4 and Si5) are laminated on the non-exposed Si (Si1) and the exposed Si (Si2). By forming island structures including a silicon film covered with an oxide film as stated above, desired channel-source-drain regions of a thin film transistor or alignment marks necessary for successive processes can be formed. In such a transistor, elements are separated from one another.

Figure 14A:
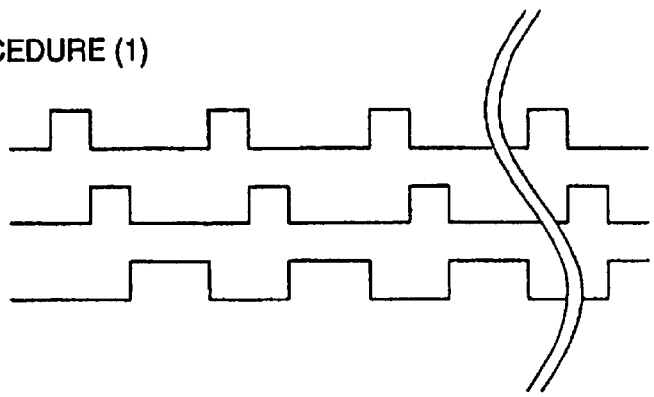
FIGS. 14A and 14B are diagrams showing embodiments (control procedures) of the invented exposure system.
Figure 14B:
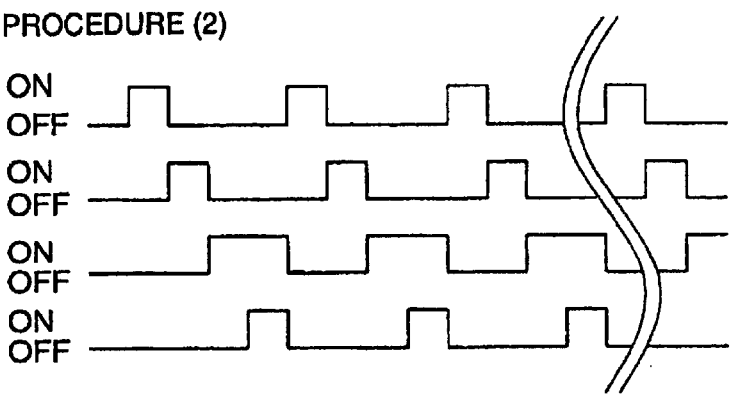

FIGS. 14A and 14B are timing charts of essential control procedures. In the illustrative control procedure (1), the substrate is moved to a target exposure position by operating the substrate stage. Next, the exposure position is accurately adjusted by focusing or alignment operation. In this procedure, the exposure position is adjusted to achieve a target predetermined accuracy of error of, for example, about 0.1 $\mu$m to 100 $\mu$m. On completion of this operation, the substrate is irradiated with light. On completion of a series of these operations, the substrate is moved to a successive exposure position. On completion of irradiation of all the necessary regions on the substrate, the substrate is replaced with a new one, and the second substrate to be treated is subjected to a series of the predetermined operations.

In the illustrative control procedure (2), the substrate is moved to a target exposure position by operating the substrate stage. Next, the exposure position is accurately adjusted by focusing or alignment operation. In this procedure, the exposure position is adjusted to achieve a target predetermined accuracy of error of, for example, about 0.1 $\mu$m to 100 $\mu$m. On completion of this operation, the mask stage starts to operate. In the chart shown in FIG. 14B, the substrate is irradiated with light after the initiation of the mask stage operation to avoid variation of moving steps during startup. Naturally, a region at a distance from the alignment position is to be exposed due to the movement of the stage, and an offset corresponding to the shift must be previously considered. To avoid unstable operations, the light source may be operated prior to the light irradiation to the substrate, and the substrate may be irradiated with light by opening, for example, a shutter. Particularly, when an excimer laser is employed as the light source and lasing periods and suspension periods are repeated in turn, several tens of pulses emitted at early stages are known to be particularly unstable. To avoid irradiation with these unstable laser pulses, the beams can be intercepted according to the operation of the mask stage. On completion of irradiation of all the necessary regions on the substrate, the substrate is replaced with a new one, and the second substrate to be treated is subjected to a series of the predetermined operations.

In this connection, an a-Si thin film 75 nm thick was scanned with a 1 mm×50 m beam at a 0.5-$\mu$m pitch in a minor axis direction. When the scanning (irradiation) was performed using one light source at a laser irradiation intensity of the irradiated surface of 470 mJ/cm$^2$, a continuous single-crystal silicon thin film in the scanning direction was obtained. In addition, a beam from a second light source was applied with a delay time of 100 nsec to yield a laser irradiation intensity of the irradiated surface of 150 mJ/cm$^2$, and a continuous single-crystal silicon thin film in the scanning direction was obtained, even at a scanning pitch of 1.0 $\mu$m. The trap state density in the crystallized silicon film was less than $10^{12}$ cm$^{-2}$.

Figure 15:
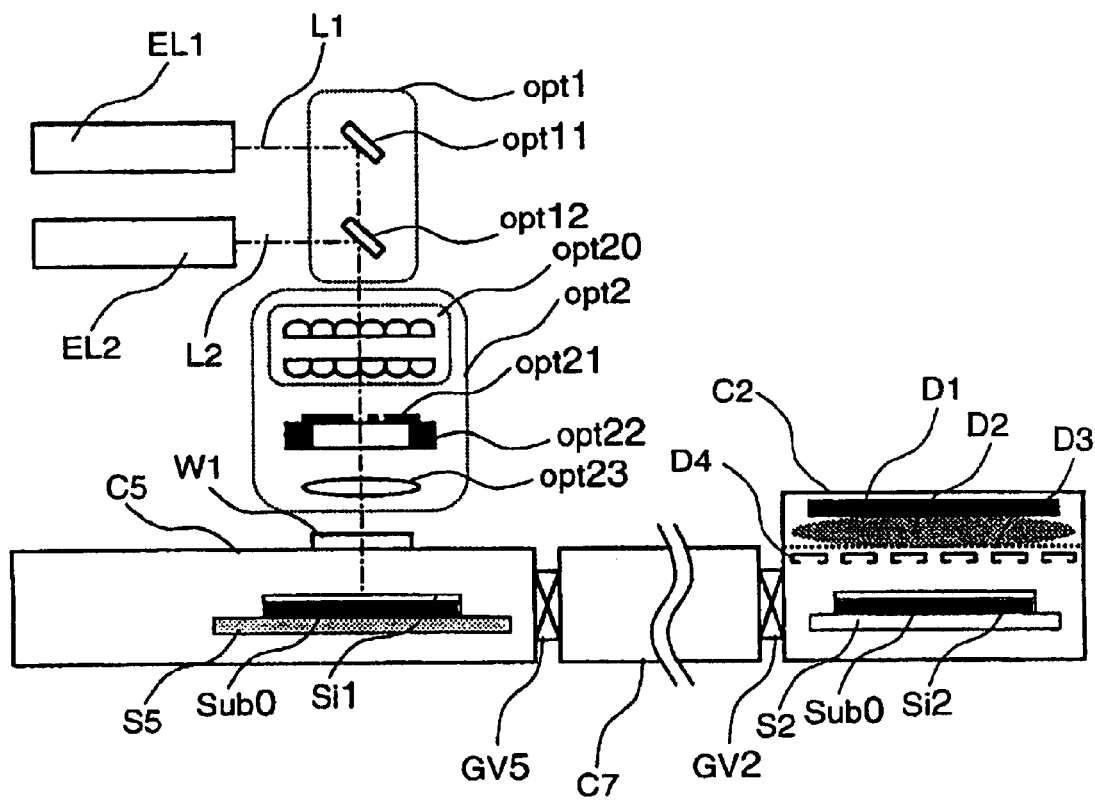
FIG. 15 is a side sectional view showing the invented exposure system, transfer chamber, and plasma-enhanced CVD chamber.

FIG. 15 is a side sectional view of an embodiment of the invented semiconductor thin film forming system. The system includes a plasma-enhanced CVD chamber C2, a laser irradiation chamber C5, and a substrate transfer chamber C7. In the system, the substrate can be transferred via gate valves GV2 and GV5 without exposing to an atmosphere outside the system. The transfer can be performed in vacuo or in an atmosphere of an inert gas, nitrogen gas, hydrogen gas or oxygen gas, in high vacuum, under reduced pressure or under pressure. In the laser irradiation chamber, the substrate is placed on a substrate stage S5 with the aid of a chucking mechanism. The substrate stage S5 can be heated to about 400° C. In the plasma-enhanced CVD chamber, the substrate is placed on a substrate holder S2. The substrate holder S2 can be heated to about 400° C. The figure illustrates the following state. A silicon thin film Si1 is formed on a glass substrate Sub0, and the substrate is then brought into the laser irradiation chamber. The surface silicon thin film is modified into a crystalline silicon thin film Si2 by laser irradiation, and the substrate is then transferred to the plasma-enhanced CVD chamber.

Laser beams are brought into the laser irradiation chamber in the following manner. The laser beams are supplied from an excimer laser 1 (EL1) and an excimer laser 2 (EL2), pass through a first beam line L1 and a second beam line L2 and a laser composing optical system opt1, a mirror opt11, a transmissive mirror opt12, a laser irradiation optical system opt2, a homogenizer opt20, a photo mask opt21 mounted and fixed on a photo mask stage opt22, a projection optical system opt23, and a laser inlet window W1, and reach the substrate surface. In this figure, two excimer lasers are illustrated, but a different number (one or more) of light sources can be employed in the system. The light source is not limited to the excimer laser and includes, for example, carbon gas laser, yttrium-aluminum-garnet (YAG) laser, and other pulse lasers. In addition, laser pulses can be made and applied onto the substrate by using argon laser or another continuous wave (CW) light source and a high speed shutter.

In the plasma-enhanced CVD chamber, a radio frequency (RF) electrode D1 and a plasma confinement electrode D3 constitute a plasma generating region D2 at a position at a distance from a region where the substrate is placed. For example, oxygen and helium are supplied to the plasma generating region, and a silane gas is supplied to the substrate using a material gas inlet system D4. By this configuration, a silicon oxide film can be formed on the substrate.

Figure 16:
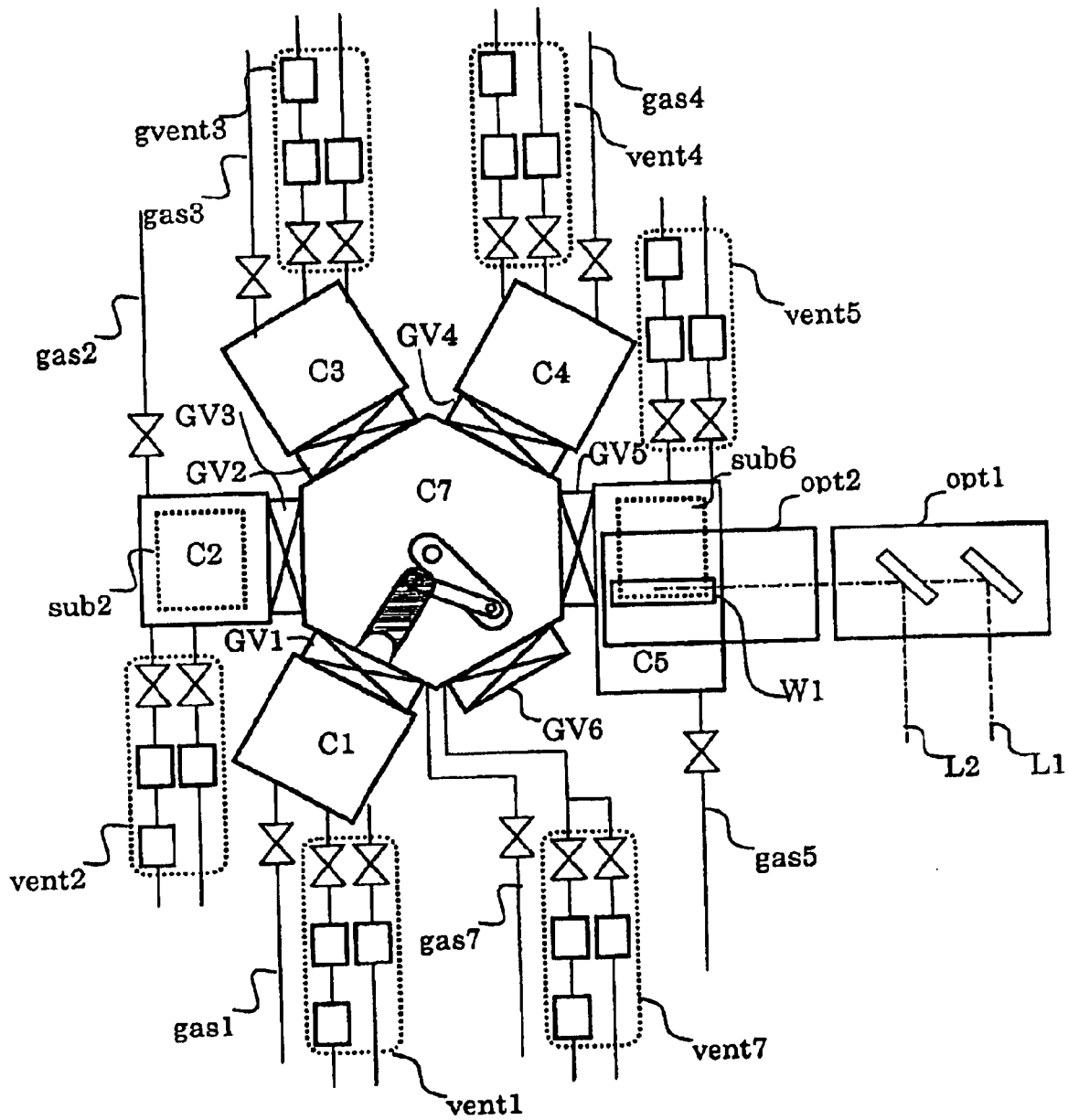
FIG. 16 is a top view of the invented composite system including, for example, an exposure system, transfer chamber, and plasma-enhanced CVD chamber.

FIG. 16 is a top view of another embodiment of the invented semiconductor thin film forming system. A substrate transfer chamber C7 is respectively connected to a load-unload chamber C1, a plasma-enhanced CVD chamber C2, a substrate heating chamber C3, a hydrogen plasma treatment chamber C4, and a laser irradiation chamber C5 via gate valves GV1 through GV6. Laser beams are supplied from a first beam line L1 and a second beam line L2 and are applied to the substrate surface via a laser composing optical system opt1, a laser irradiation optical system opt2, and a laser inlet window W1. Gas supply systems gas1 to gas7, and ventilators vent1 to vent7 are connected to the individual process chambers and the transfer chamber. By this configuration, desired gas species can be supplied, and target process pressures can be set. In addition, the ventilation and degree of vacuum can be controlled. Substrates sub2 and sub6 to be processed are placed horizontally as indicated by dotted lines in the figure.

Figure 17:
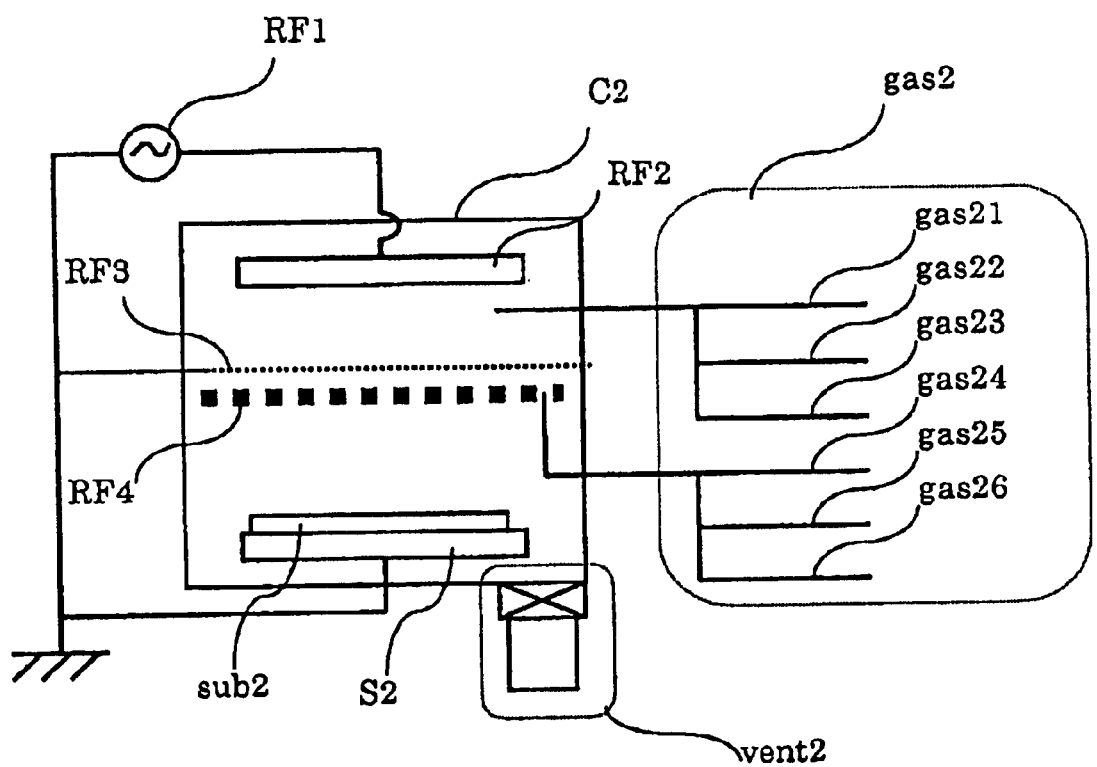
FIG. 17 is a side sectional view of the invented plasma-enhanced CVD chamber.

FIG. 17 is a schematic diagram of the plasma-enhanced CVD chamber C2. A radio frequency power source RF1 supplies a radio frequency electrode RF2 with power. As the frequency, a high frequency of 13.56 MHz or more is suitable. Plasmas are generated between an electrode RF3 with gas supply holes, and the radio frequency electrode RF2. Radicals are formed by plasma reaction and are introduced through the gas supply holes of the electrode into a region where the substrate is placed. Another gas is introduced by a flat gas supply system RF4 without exposure to the plasmas, and a gas phase reaction occurs to form a thin film on the substrate sub2. A substrate holder S2 is designed to heat the substrate from room temperature to about 500° C. using, for example, a heater. A silicon oxide film can be formed by reacting oxygen radicals with silane gas. In this reaction, the ventilator vent2, the gas supply system gas2, an oxygen gas line gas21, a helium gas line gas22, a hydrogen gas line gas23, a silane gas line gas24, a helium gas line gas25, and an argon gas line gas26 are used as shown in the figure. When a silicon oxide film was formed at a substrate temperature of 300° C., at a pressure of 0.1 Torr, at an RF power of 100 W, at a silane flow rate of 10 standard cubic centimeters per minute (sccm), at an oxygen flow rate of 400 sccm, and at a helium flow rate of 400 sccm, the resulting silicon oxide film was found to have a satisfactory property of a fixed oxide film charge density of $5 \times 10^{11}$ cm$^{-2}$. A more satisfactory oxide film can be formed by increasing the ratio of the oxygen flow rate to the silane flow rate. The plasma-enhanced CVD chamber is not limited to a parallel plate RF plasma-enhanced CVD system as stated above. The CVD process also includes a CVD process under reduced pressure, a CVD process at normal pressure, or other processes without the use of plasma, as well as plasma-enhanced CVD processes using microwaves or electron cyclotron resonance effect.

Table 1 shows illustrative gas species required when the plasma-enhanced CVD system shown in FIG. 17 is used for the formation of thin films other than silicon oxide films.
Table 1: Illustrative combinations of gas species

TABLE 1

Illustrative combinations of gas species

| | $SiO_2$ formation | $Si_3N_4$ formation | Si formation | Si formation | Hydrogenation |
|---|---|---|---|---|---|
| gas21 | $O_2$ | $N_2$ | | | |
| gas22 | He | Ar | | Ar | |
| gas23 | | | $H_2$ | $H_2$ | $H_2$ |

A silicon nitride $Si_3N_4$ film can be formed by using nitrogen $N_2$ or ammonia with an argon Ar carrier gas, and silane $SiH_4$ with an argon carrier gas. A silicon thin film can be formed by using hydrogen $H_2$ and silane, or using hydrogen with an argon carrier gas and silicon tetrafluoride $SiF_4$ with an argon carrier gas. In addition to these film forming processes, the plasma-enhanced CVD system can perform hydrogen plasma treatments of silicon thin films or of silicon oxide films.

FIGS. 18A to 18G2 are process flow charts showing an application of the invented semiconductor thin film forming system to a production process of thin film transistors. The process includes the following steps.

In Step A (FIG. 18A), a glass substrate sub0 is cleaned to remove organic substances, metals, fine particles and other impurities. Onto the cleaned glass substrate, a substrate covering film T1 and a silicon thin film T2 are sequentially formed. As the substrate covering film, a silicon oxide film is formed to a thickness of 1 µm by low pressure vapor deposition (LPCVD) process at 450° C. with silane and oxygen gases as materials. By using the LPCVD process, the overall exterior surface of the substrate can be covered with a film, except for a region where the substrate is held (this embodiment is not shown in the figure). Alternatively, the process can employ, for example, a plasma-enhanced CVD process using tetraethoxysilane (TEOS) and oxygen as materials, a normal pressure CVD process using TEOS and ozone as materials, or the plasma-enhanced CVD process shown in FIG. 17. An effective substrate covering film includes such a material as to prevent the diffusion of impurities in the substrate material. Such impurities adversely affect semiconductor elements. The substrate may comprise, for example, a glass having a minimized alkali metal concentration or a quartz or glass having a polished surface. The silicon thin film is formed to a thickness of 75 nm by LPCVD at 500° C. with a disilane gas as a material. Under these conditions, the resulting film is to have a hydrogen atom concentration of 1 atomic percent or less, and the film can be prevented from, for example, roughening due to emission of hydrogen in the laser irradiation process. Alternatively, the plasma-enhanced CVD process shown in FIG. 17 or a conventional plasma-enhanced CVD process can be employed. In this case, a silicon thin film having a low hydrogen atom concentration can be obtained by adjusting the substrate temperature or the flow rate ratio of hydrogen to silane or the flow rate ratio of hydrogen to silicon tetrafluoride.

In Step B (FIG. 18B), the substrate prepared in Step A is subjected to a cleaning process to remove organic substances, metals, fine particles, surface oxide films and other unnecessary matter. The cleaned substrate is then introduced into the invented thin film forming system. The substrate is irradiated with a laser beam L0 to convert the silicon thin film to a crystallized silicon thin film T2'. The laser-induced crystallization is performed in a high purity nitrogen atmosphere of 99.9999% or more at a pressure of 700 Torr or more.

In Step C (FIG. 18C), after the completion of Step B, the process chamber is evacuated, and the substrate is then transferred via a substrate transfer chamber to a plasma-enhanced CVD chamber. As a first gate insulating film T3, a silicon oxide film is deposited to a thickness of 10 nm at a substrate temperature of 350° C. from material silane, helium, and oxygen gases. Where necessary, the substrate is then subjected to hydrogen plasma treatment or to heating and annealing. Steps A to C are conducted in the invented thin film forming system.

In Step D (FIG. 18D), islands composed of laminated silicon thin film and silicon oxide film are then formed. In this step, the etching rate of the silicon oxide film should be preferably higher than that of the silicon thin film according to etching conditions. By forming a stepped or tapered pattern section as illustrated in the figure, the gate leak is prevented, and a thin film transistor having a high reliability can be obtained.

In Step E (FIG. 18E), the substrate is then cleaned to remove organic substances, metals, fine particles and other impurities, and a second gate insulating film T4 is formed to cover the above-prepared islands. In this example, a silicon oxide film 30 nm thick is formed by the LPCVD process at 450° C. from material silane and oxygen gases. Alternatively, the process can employ, for example, the plasma-enhanced CVD process using tetraethoxysilane (TEOS) and oxygen as materials, the normal pressure CVD process using TEOS and ozone as materials, or the plasma-enhanced CVD process as shown in FIG. 17. Next, an n+silicon film 80 nm thick and a tungsten silicide film 110 nm thick are formed as gate electrodes. The $n^+$ silicon film should be preferably a phosphorus-doped crystalline silicon film formed by the plasma-enhanced CVD process or LPCVD process. The work is then subjected to photolithography and etching processes to yield a patterned gate electrode T5.

Figure 1:
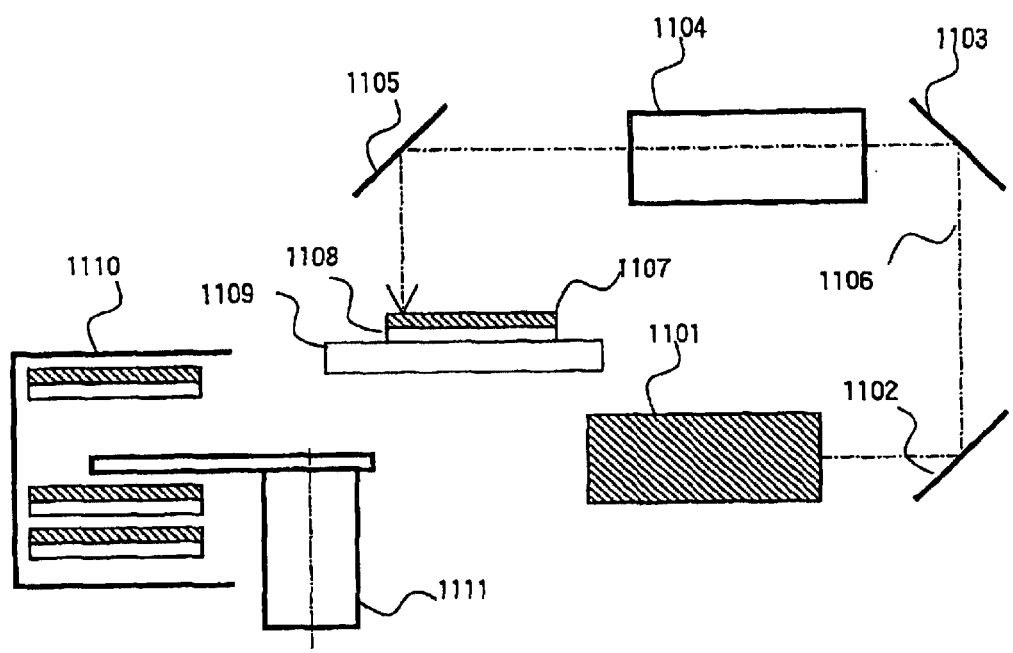
FIG. 1 is a schematic diagram of a conventional excimer laser annealer.
Figure 3:
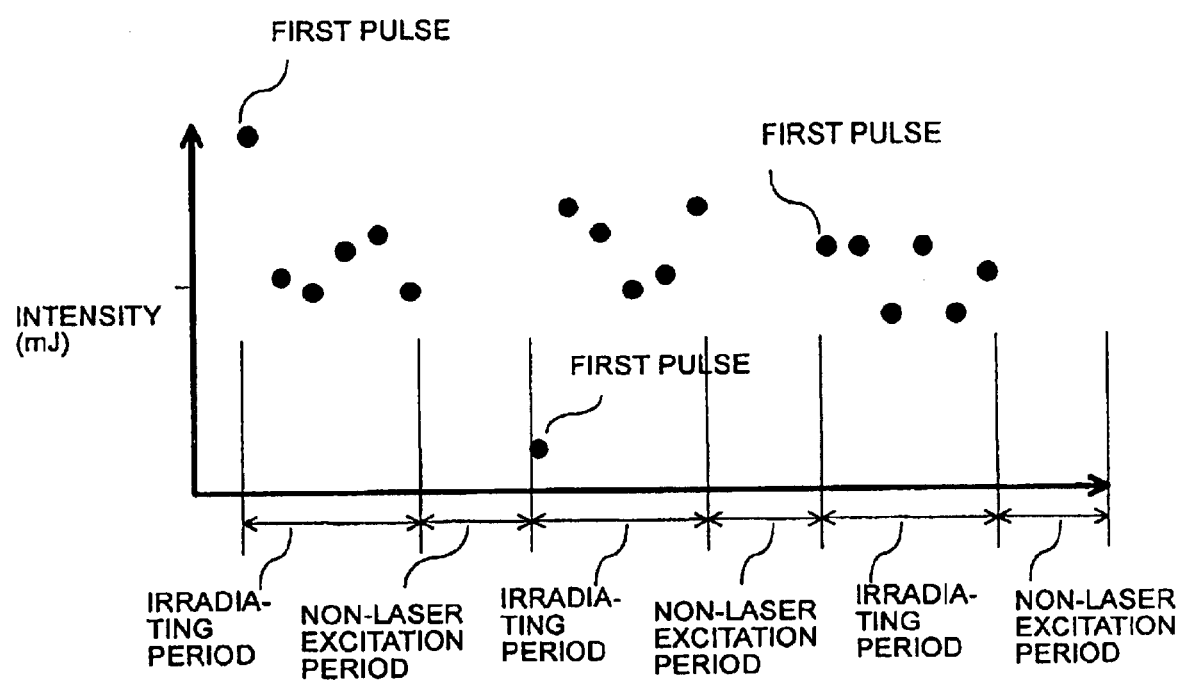
FIG. 3 is a diagram showing the pulse-to-pulse stability of laser pulse intensities.
Figure 4:
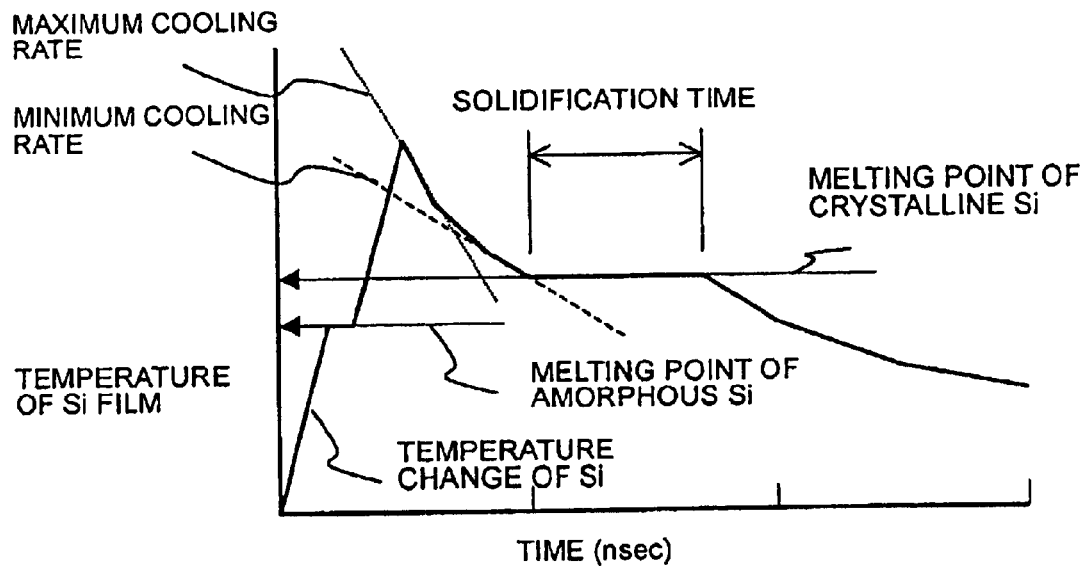
FIG. 4 is a diagram showing an illustrative temperature change of a silicon film.
Figure 5:
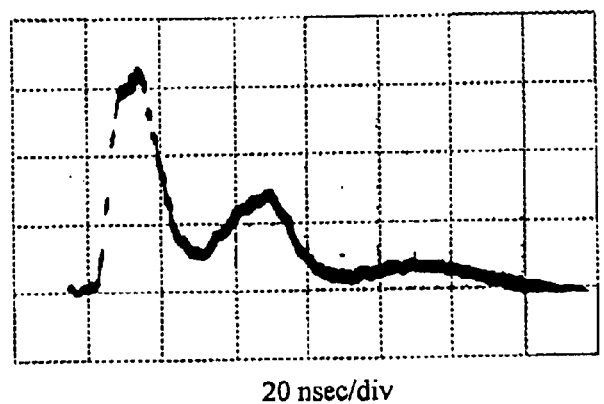
FIG. 5 is a diagram showing an illustrative laser pulse shape.
Figure 6:
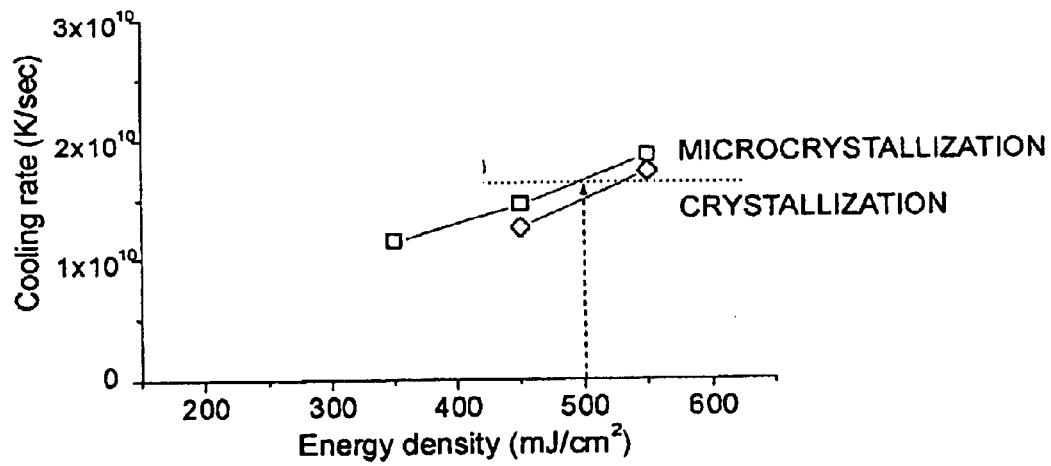
FIG. 6 is a diagram showing the relationship between the irradiation intensity and the cooling rate, and the cooling rate at which the film becomes amorphous.
Figure 9:
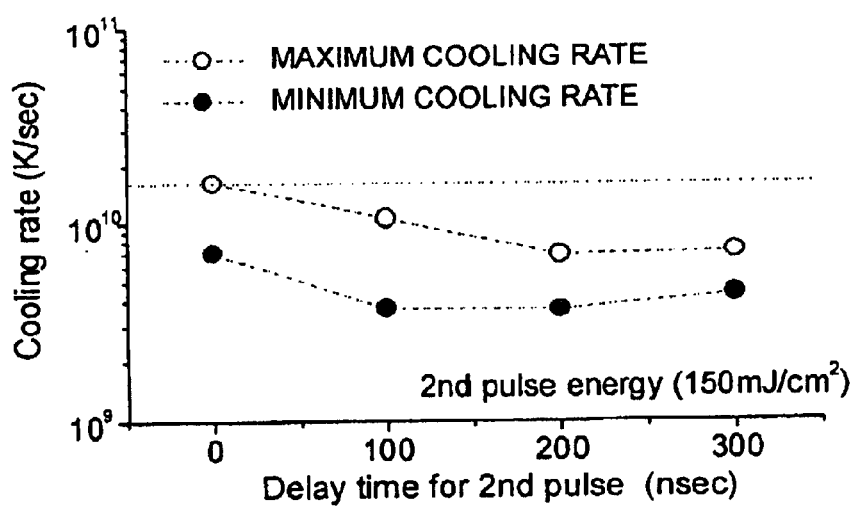
FIG. 9 is a diagram showing the maximum cooling rate after the supply of a second pulse, and the cooling rate around the solidification point.
Figure 7:
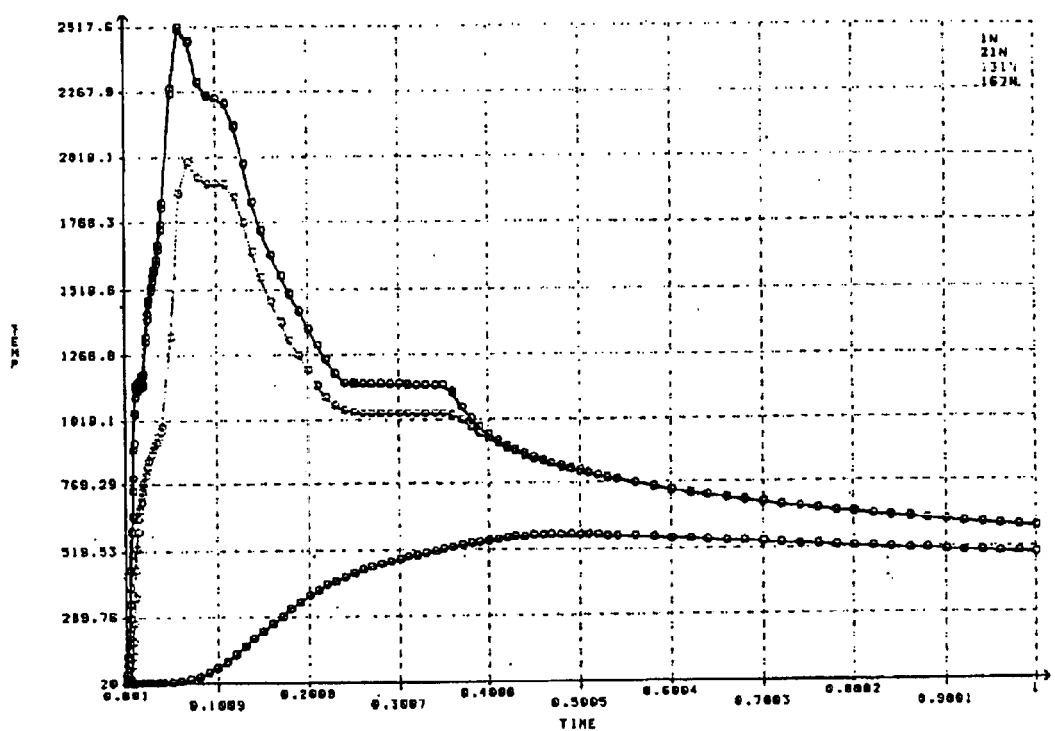
FIG. 7 is an illustrative diagram of calculated temperature changes of a silicon thin film.
Figure 8:
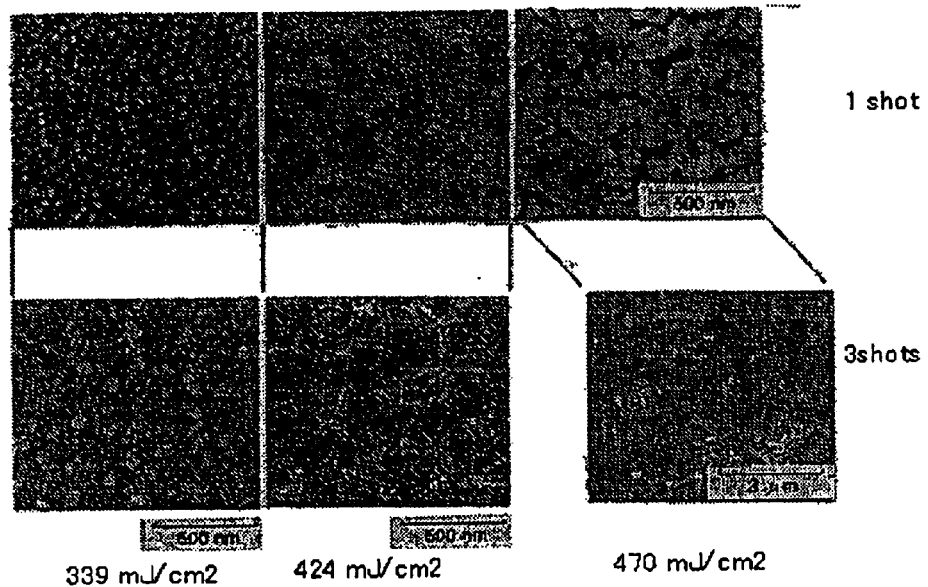
FIG. 8 is a diagram showing crystal forms of silicon thin films corresponding to individual irradiation intensities.
Figure 10:
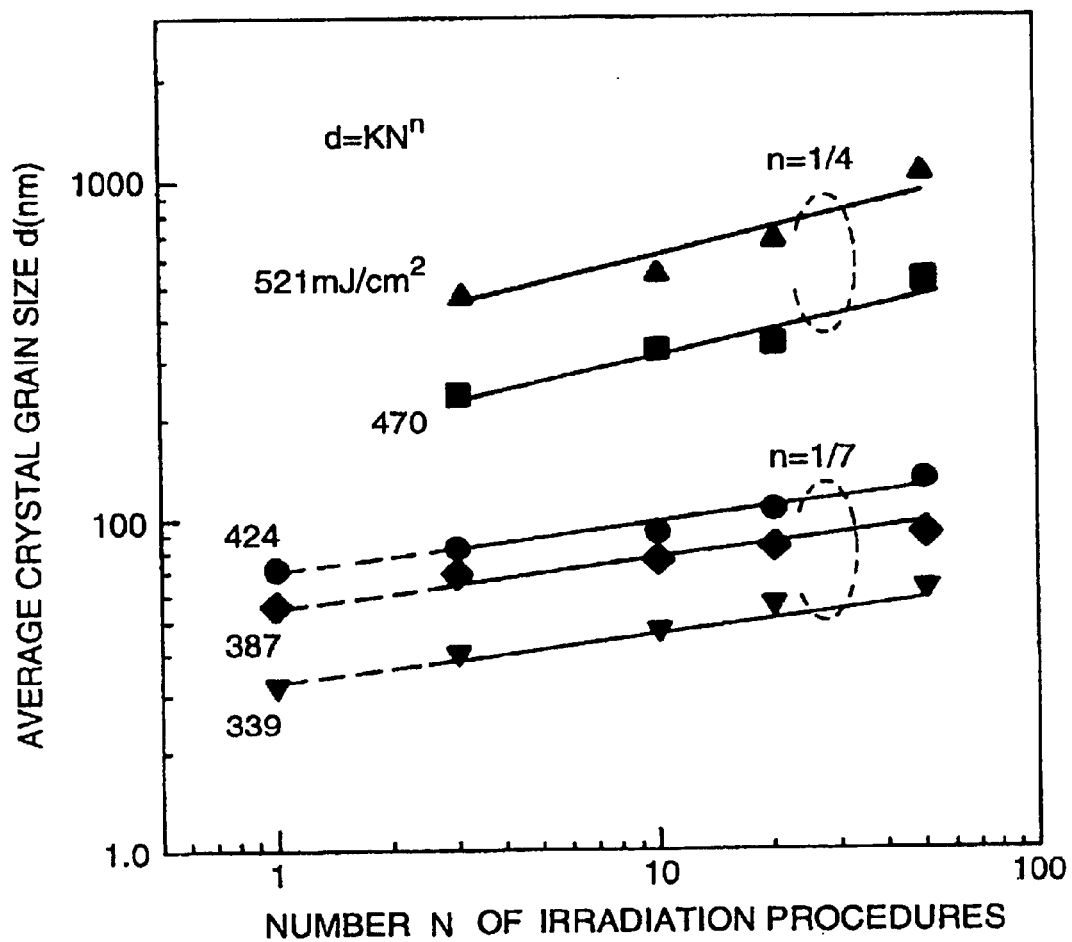
FIG. 10 is a diagram showing the relationship between the average crystal grain size and the process condition.

In Step F1 or F2 (FIG. 18F1 or 18F2), a doping region T6 or T6' is then formed using the gate as a mask. When a complementary metal oxide semiconductor (CMOS) circuit is prepared, an n-channel TFT requiring an $n^+$ region, and a $p^-$ channel TFT requiring a $p^+$ region are separately formed. The doping technique includes, for example, ion doping where injected dopant ions are not subjected to mass separation, ion injection, plasma-enhanced doping, and laser-enhanced doping. According to the application of the product or the used technique for doping, the surface silicon oxide film remains intact (FIG. 18F2) or is removed (FIG. 18F1) prior to doping.

In Step G1 or G2 (FIG. 18G1 or 18G2), an interlayer insulating film T7 or T7' is deposited, and a contact hole is formed, and a metal is deposited thereon. The work is then subjected to photolithography and etching to yield a metallic wiring T8. Such interlayer insulating films include, but are not limited to, a TEOS-based oxide film, a silica coating film, and an organic coating film that can provide a flat film. The contact hole can be formed by photolithography and etching with a metal. Such metals include low resistant aluminum, copper, and alloys made from these metals, as well as tungsten, molybdenum, and other refractory metals. The process including these steps can produce a thin film transistor having high performance and reliability.

FIGS. 19A to 19G2 illustrate an embodiment where an alignment mark is previously formed and laser irradiation is performed with reference to the alignment mark. FIGS. 20A to 20G2 illustrate another embodiment where an alignment mark is formed concurrently with laser irradiation. These embodiments are based on the TFT manufacture process flow, and are basically similar to the process shown in FIGS. 18A to 18G2. The distinguishable points of these embodiments are described below.

In FIG. 19A, a glass substrate sub0 is cleaned to remove organic substances, metals, fine particles, and other undesired matter. On the cleaned substrate, a substrate covering film T1 and a tungsten silicide film are sequentially formed. The work is then patterned by photolithography and etching to form an alignment mark T9 on the substrate. A mark protective film T10 is formed to protect the alignment mark, and a silicon thin film is then formed.

In FIG. 19B, upon laser light exposure, a target region is exposed to light with reference to the alignment mark. The alignment in the successive step can be performed with reference to the preformed alignment mark or to an alignment mark formed by crystallized silicon thin film patterning (not shown).

In FIG. 20B, a crystallized alignment mark T9' is formed concurrently with laser irradiation to the silicon thin film. The crystallized alignment mark is formed by utilizing a difference in modification between an exposed region and a nonexposed region.

In FIG. 20D, alignment in the photolithography process is performed by using the crystallized alignment mark T9'. The work is then subjected to an etching process to form islands composed of laminated silicon thin film and silicon oxide film.

Figure 21:
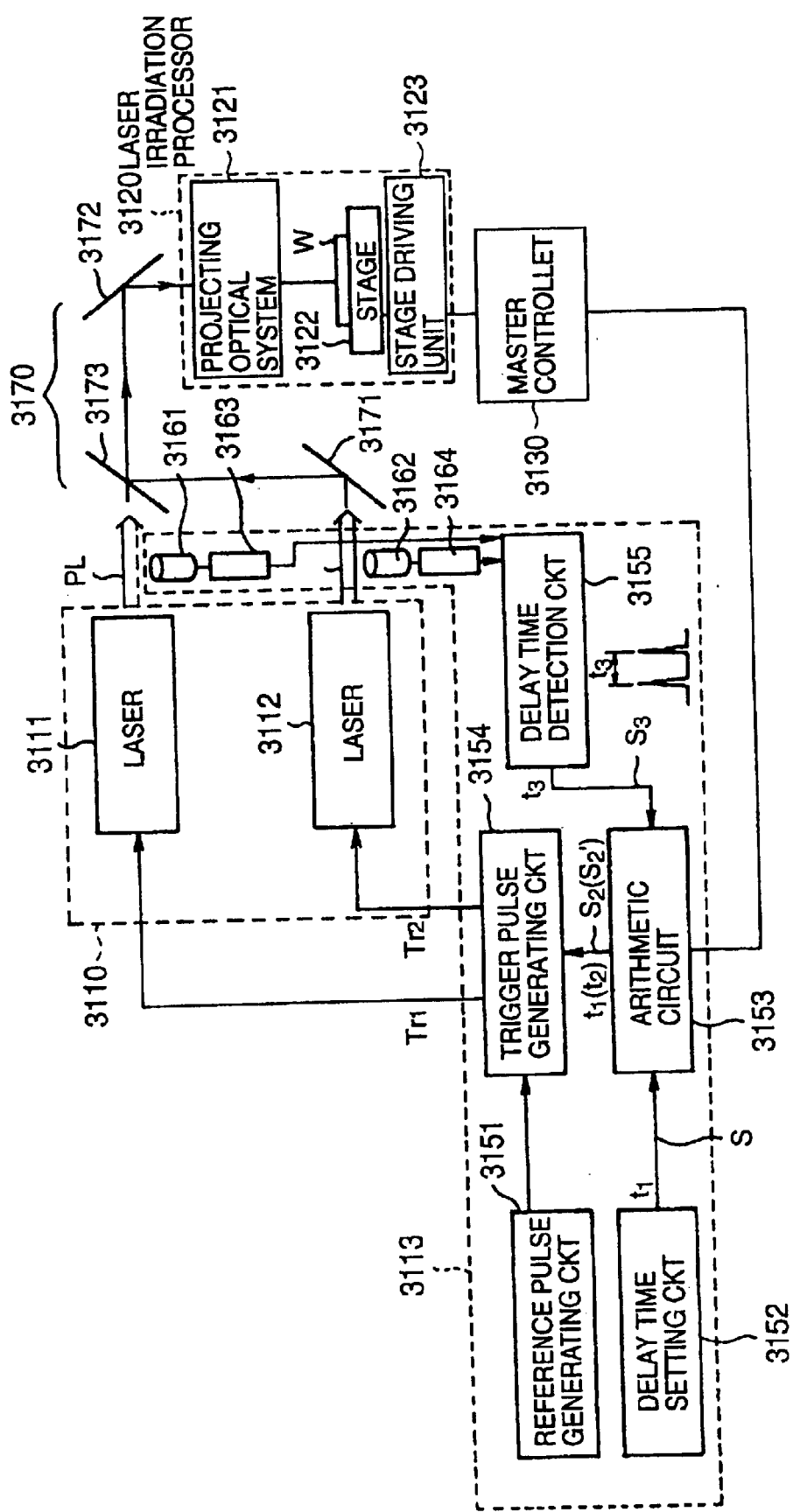
FIG. 21 is a block diagram showing an embodiment of the control procedure for delayed pulse lasing with plural light sources according to the invention.

FIG. 21 shows a laser annealer for heating and laser-annealing an amorphous semiconductor with synchronizing pulses. The annealer includes a laser unit 3110, a laser irradiation processing unit 3120, and a master controller 3130. The laser unit 3110 produces laser beams with target wavelengths and waveforms. The laser irradiation processing unit 3120 actually subjects a substrate W to processing with the laser beam from the laser unit 3110. The master controller 3130 generally controls the operations of these units. The work substrate W is made from, for example, a glass plate. On the surface of the substrate, for example, an amorphous Si layer as an amorphous semiconductor is deposited. The laser beam processing converts an exposed region in the amorphous Si layer into a polycrystalline Si (poly-Si) layer.

The laser unit 3110 includes a pair of first and second lasers 3111 and 3112, and a laser controller 3113. The lasers 3111 and 3112 produce pulsed laser beams. The laser controller 3113 respectively controls the excitation timings of the lasers 3111 and 3112 to produce a pair of pulsed laser beams with an appropriate differential time, and serves as a delay controller. The first laser 3111 is a main laser, and the substrate W is first irradiated with a laser beam from the first laser 3111. The second laser 3112 is a subsidiary laser and the substrate W is irradiated with a laser beam from the second laser 3112 after the irradiation of the first laser. Each of the laser beams from the first and second lasers 3111 and 3112 is appropriately adjusted to have an optimum differential time and power for the processing of the substrate W. The both pulsed laser beams PL are superimposed via a composing optical system 3170 to yield a synchronizing pulsed beam for processing.

The laser controller 3113 comprises, for example, a computer and a signal shaping circuit. Specifically, the laser controller includes a reference pulse generating circuit 3151, a delay time setting circuit 3152, an arithmetic circuit 3153, a trigger pulse generating circuit 3154, first and second photosensors 3161 and 3162, a pair of amplifiers 3163 and 3164, and a delay time detecting circuit 3155. The reference pulse generating circuit 3151 produces a reference pulse. The delay time setting circuit 3152 previously sets an interval of generation, i.e., differential time, of a pair of the pulsed laser beams PL that constitute the synchronizing pulsed laser beam. The arithmetic circuit 3153 sets the excitation timings of the first and second lasers 3111 and 3112 with reference to a signal output from, for example, the delay time setting circuit 3152, and generates a command signal corresponding to the excitation timings. The trigger pulse generating circuit 3154 receives the output of the command signal from the arithmetic circuit 3153 and generates first and second trigger signals to trigger the first and second lasers 3111 and 3112. The first and second photosensors 3161 and 3162 respectively serve for high speed photoelectric conversion of laser outputs from the first and second lasers 3111 and 3112 and serve as photodetectors. The amplifiers 3163 and 3164 respectively amplify the outputs from the first and second photosensors 3161 and 3162. The delay time detecting circuit 3155 receives photo detection signals from the both amplifiers 3163 and 3164 and detects a differential time between the both photo detection signals.

The delay time setting circuit 3152 sets such a differential time (hereinafter referred to as "set differential time t1" that the waveform of the synchronizing pulsed beam is optimum for the processing of the substrate W. The synchronizing pulsed beam is formed by superimposing the laser beams from the first and second lasers 3111 and 3112. The set differential time t1 can be set by externally entering from, for example, a keyboard or by reading out a set level previously stored according to the type of the substrate W.

The arithmetic circuit 3153 generates a command signal S2 corresponding to the set differential time t1 set in the delay time setting circuit 3152. The arithmetic circuit 5153 also calculates a corrected differential time t2 from the set differential time t1 and generates a command signal S2' corresponding to the corrected differential time t2. The corrected differential time t2 is calculated with reference to the output of a measured differential time t3 from the delay time detecting circuit 3155.

The trigger pulse generating circuit 3154 receives the command signal S2 or S2' produced from the arithmetic circuit 3153 and subjects the signal to an appropriate processing. When triggered by the reference pulse from the reference pulse generating circuit 3151, the trigger pulse generating circuit 3154 respectively generates first and second trigger signals Tr1 and Tr2 with a time delay or shift of the differential time t1 (t2) to trigger the first and second lasers 3111 and 3112.

The delay time detecting circuit 3155 cuts a pair of photodetection signals from the amplifiers 3163 and 3164 with a predetermined threshold, and detects a delay time t3 between a pair of laser beams produced by the first and second lasers 3111 and 3112. The delay time t3 is determined with reference to a difference of start-up timings of the signals.

Into the laser irradiation processing unit 3120, the synchronizing pulsed laser beam is launched. The synchronizing pulsed laser beam comes out from the laser unit 3110 and is composed via a composing optical system 3170 including, for example, mirrors 3171 and 3172, and a half mirror 3173. The laser irradiation processing unit 3120 comprises a reduction projection optical system 3121, a stage 3122, and a stage driving unit 3123. The reduction projection optical system 3121 converts the synchronizing pulsed laser beam into a beam having a target profile and energy density distribution and projects the processed beam onto the substrate W. The stage 3122 supports the substrate W and moves with the substrate W in scanning-operation. The stage driving unit 3123 controls the operations of the stage 3122.

The operations of the laser annealer shown in FIG. 21 will be illustrated below. The master controller 3130 controls the laser controller 3113 to make the first and second lasers 3111 and 3112 to generate a pair of pulsed laser beams PL with a delay time of the set differential time t1. Both pulsed laser beams PL are superimposed via the composing optical system 3170 to yield a synchronizing pulsed laser beam for processing having a predetermined waveform, and the synchronizing pulsed laser beam is applied onto the substrate W. The synchronizing pulsed laser beam is triggered by the reference pulse from the reference pulse generating circuit 3151, and the irradiation of the synchronizing pulsed laser beam onto the substrate W is repeated in a cycle corresponding to the cycle of the reference pulse.

In this procedure, the delay time t3 produced by the delay time detecting circuit 3155 is monitored to find a shift $\Delta t$ of the actual delay time t3 from the set differential time t1. Thus, the corrected differential time t2 is calculated from $\Delta t$ and t1 according to the following equation.

$$t2 = t1 - \Delta t = 2 \times t1 - t3$$

The corrected differential time t2 is set as a new set point. By this procedure, the pair of pulsed laser beams PL with a time delay substantially identical to the set differential time t1 can be generated from the first and second lasers 3111 and 3112. Specifically, if a delay time t3' produced by the delay time detecting circuit 3155 is out of a predetermined range (upper limit and lower limit) due to response characteristics or changes with time of the first and second lasers 3111 and 3112, a new corrected differential time t2' is calculated from a new shift $\Delta t'$ and t1 [$t2' = t1 - \Delta t'$] and is set as a new set point. By repeating these procedures, the time interval of the pair of pulsed laser beams PL constituting the synchronizing pulsed laser beam can be maintained constant. Specifically, even if the lasers 3111 and 3112 have different characteristics from each other, and the response time from the trigger to exciting the laser varies due to changes with time or changes in operation conditions, a synchronizing pulsed laser beam having a stable waveform can be applied onto the substrate W.

Figure 22:
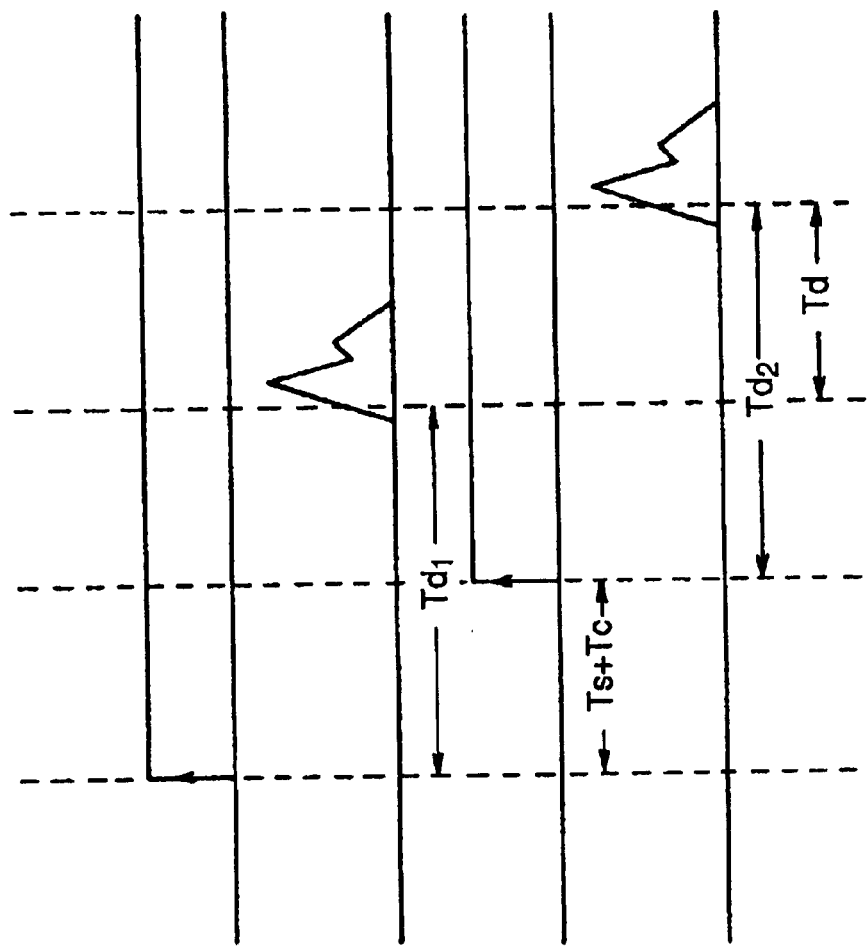
FIGS. 22A to 22D are diagrams showing an embodiment of the control procedure for delayed pulse lasing from plural light sources according to the invention.

FIGS. 22A to 22D are timing charts illustrating operation timings of the system shown in FIG. 21. FIG. 22A shows the trigger signal Tr1 produced from the pulse generating circuits 3151 and 3154. FIG. 22B shows the pulsed laser beam PL launched from the first pulse laser 3111. FIG. 22C shows the trigger signal Tr2 produced via the delay time setting circuit 3152 and the arithmetic circuit 3153 from the trigger pulse generating circuit 3154 (these circuits are referred to as "trigger delay circuits"). FIG. 22D shows the pulsed laser beam PL launched from the second pulse laser 3112. As obvious from these figures, when a delay time Ts is set in the trigger delay circuits 3154 and 3152, a desired pulse time interval Td (=Td2−Td1+Ts+Tc) can be theoretically obtained.

Next, a system and a process for focusing will be described as an embodiment of the invention.

Figure 23:
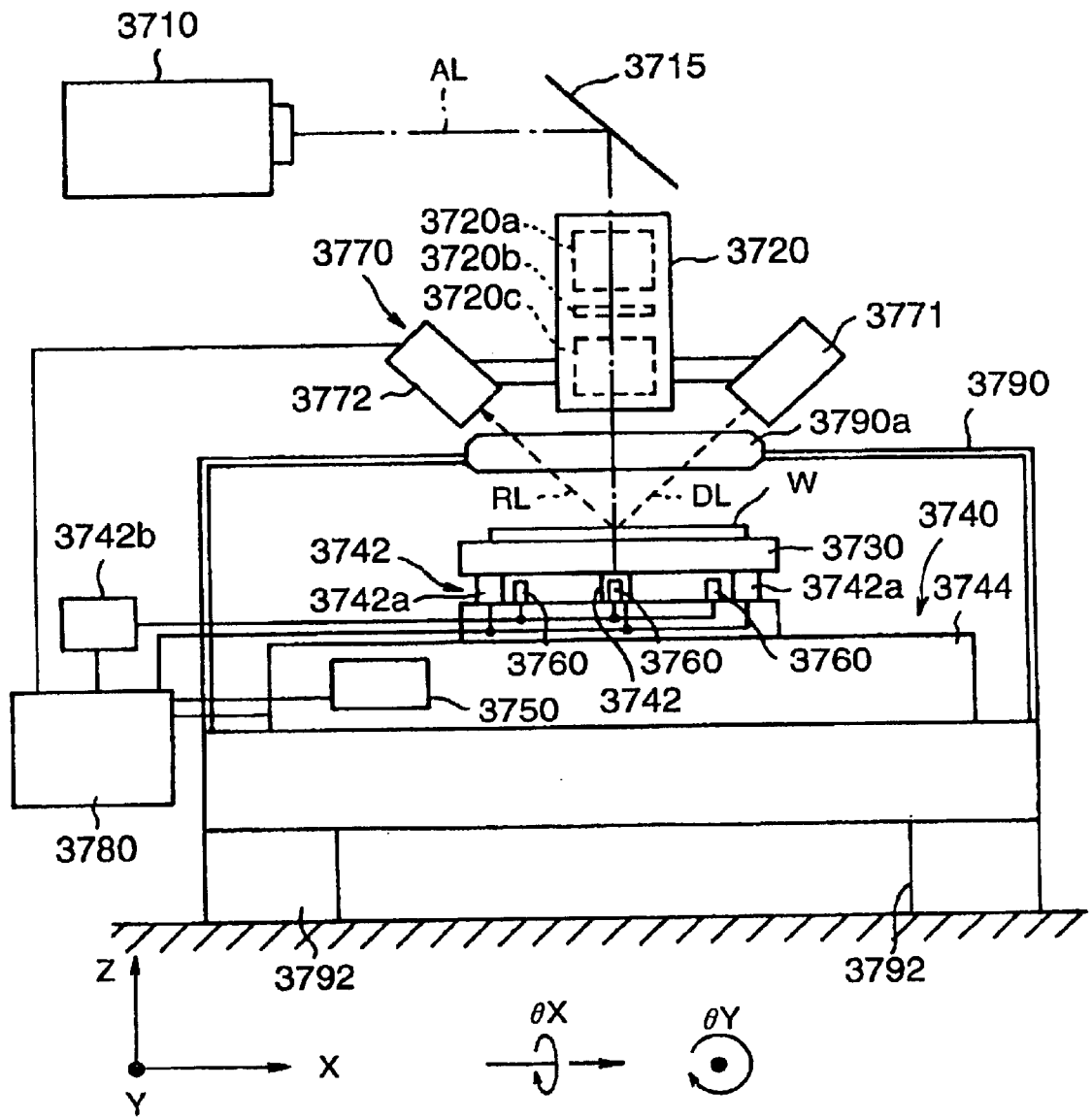
FIG. 23 is a diagram showing the invented laser annealer including a focusing system.

FIG. 23 is a diagram showing the overall configuration of a laser annealer including the focusing system according to the embodiment. This laser annealer serves to subject a work W to be processed to a heat treatment. The work W comprises a glass plate and a semiconductor thin film of, for example, amorphous Si formed on the glass plate. The laser annealer includes a laser source 3710, an irradiation optical system 3720, a stage 3730, a stage driving unit 3740, and a master controller 3780. The laser source 3710 produces an excimer laser and other laser light AL for heating the semiconductor thin film. The irradiation optical system 3720 converts the laser light AL into a line or spot and launches the laser beam onto the work W at a predetermined illumination, and serves as a processing optical system. The stage 3730 supports and holds the work W, is smoothly movable in the X-Y plane, and is capable of tilting around the X and Y axes. The stage driving unit 3740 is a driving means for moving or tilting the stage 3730 with the work W mounted thereon to a necessary degree relative to, for example, the irradiation optical system 3720. The master controller 3780 generally controls the operations of individual components of the laser annealer. In this configuration, the stage 3730 and the stage driving unit 3740 constitute a stage unit, and are housed in a chamber 3790. The chamber 3790 serves to evacuate the work W and its surroundings and to adjust the atmosphere surrounding the work W. The chamber 3790 is placed via a vibration isolator 3792 on a floor.

The laser annealer further comprises, as a focusing unit, a traveling distance measuring sensor 3750, a tiltmeter 3760, and a non-contact displacement gauge 3770, in addition to the stage 3730, the stage driving unit 3740, and the master controller 3780. The traveling distance measuring sensor 3750 detects the travel of the stage 3730 as an optical or electric signal. The tiltmeter 3760 detects the height and tilt of the stage 3730 relative to the stage driving unit 3740 as optical or electric information. The non-contact displacement gauge detects signals corresponding to the height and tilt of the work W relative to the irradiation optical system 3720.

The irradiation optical system 3720 includes a homogenizer 3720a, a mask 3720b, and a projection lens 3720c. The homogenizer 3720a ensures the laser light AL to have a uniform distribution. The laser light AL is launched from the laser source 3710 via a mirror 3715 into the homogenizer 3720a. The mask 3720b has a slit for throttling the laser light AL from the homogenizer 3720a into a predetermined beam form. The projection lens 3720c reduces and projects the slit image from the mask 3720b onto the work W. The irradiation optical system 3720 is arranged to face the work W via a process window 3790a in the chamber 3790, and is fixed to the chamber 3790 by a member not shown.

The stage driving unit 3740 includes a tilting unit 3742 and an XY stage unit 3744. The tilting unit 3742 makes the stage 3730 tilt around the X and Y axes. The XY stage unit 3744 allows the stage 3730 together with the tilting unit 3742 to smoothly move in the X-Y plane. The tilting unit 3742 comprises three supporting members 3742a and a supporting member driving unit 3742b. The supporting members 3742a each have a cylinder housed in a bellow and are capable of expanding and contracting to a selected length. The supporting member driving unit 3742b operates the supporting members 3742a to expand and contract. By adjusting the lengths of the three supporting members 3742a through the supporting member driving unit 3742b, the tilt and distance of the stage 3730 relative to the irradiation optical system 3720 can be appropriately finely adjusted. Specifically, the work W can be adjusted relative to the irradiation optical system 3720 in the position (distance) in the Z axis direction, tilt angle OX around the X axis, and tilt angle OY around the Y axis. The three tiltmeters 3760 extend from the tilting unit 3742 side to immediately below the stage 3730 and are eddy current sensors or electrostatic capacitance sensors. The outputs from these sensors accurately show to what degree the stage 3730 tilts relative to the stage driving unit 3740.

The non-contact displacement gauge 3770 is a laser displacement gauge, and includes a projecting unit 3771 and a light receiving unit 3772. The projecting unit 3771 is a projection means for launching a detective light DL to a flat region as a measuring target T on the work W. The light receiving unit 3772 receives a regularly reflected light RL from the measuring target T, and produces information about the incident position of the regular ly reflected light RL. The projecting unit 3771 and the light receiving unit 3772 are arranged to face each other with the interposition of the irradiation optical system 3720. Specifically, the projecting unit 3771 launches the detective light DL in a direction inclining at a predetermined angle relative to the optical axis of the irradiation optical system 3720. Into the light receiving unit 3772, the reflected right RL enters in a direction. This direction inclines in an opposed direction to the detective light DL at the predetermined angle relative to the optical axis of the irradiation optical system 3720. The master controller 3780 also serves as an arithmetic means for obtaining measurements including information corresponding to the height of the measuring target T, with reference to the information about the incident position detected in the light receiving unit 3772. Thus, the master controller 3780 constitutes a portion of the non-contact displacement gauge 3770.

The projecting unit 3771 comprises a light source for generating the detective light and a projecting optical system, and launches a spot beam of the detective light DL through the process window 3790a to the measuring target T on the work W. The light receiving unit 3772 includes an image-forming optical system and a line sensor. The image-forting optical system gathers the reflected light RL from the measuring target T, and the gathered reflected light RL enters the line sensor. The line sensor extends in the X-Z plane in a direction perpendicular to the optical axis of the reflected light RL, and detects changes of the vertical position (height) of the work W. This configuration utilizes the fact that the height of the work W is in a linear relationship with a position detecting signal from the line sensor. However, when the work W inclines relative to the optical axis of the irradiation optical system 3720, the output of the non-contact displacement gauge 3770 reflects not only the vertical position (height) of but also the tilt of the work W. The tilt of the work W is corrected using the tilting unit 3742 to bring the normal line of the work W in parallel with the optical axis of the irradiation optical system 3720. At this point, the three supporting members 3742a constituting the tilting unit 3742 are expanded or contracted to an identical degree to adjust the distance between the work W and the irradiation optical system 3720. This procedure will be described in detail later.

The measuring targets T1, T2, and T3 are located at apexes of a regular triangle. Each of the measuring targets is arranged at an identical distance from a processing region (in the figure, the center of the work W) on the work W. By controlling the XY stage unit 3744, the detective light DL from the projecting unit 3771 can be sequentially launched into each of the measuring targets T1, T2, and T3 on the work W. When the tilt of the work W is to be corrected, the tilting unit 3742 is operated so as to average the outputs of the light receiving unit 3772 on the individual measuring targets T1, T2, and T3. The arrangement of the measuring targets T1, T2, and T3, and the total number of such measuring targets can be appropriately modified according to, for example, a required precision. Particularly, if the work W has warp or other deformations on its surface, three or more measuring targets must be newly selected for each processing region to be measured in the vicinity of the processing region in question. The above-described measuring targets T1, T2 and T3 have only to be flat surfaces, and require no specific mark insofar as they can produce a regularly reflected light.

The operations of the laser annealer according to the present embodiment will now be illustrated. Initially, the work W is transferred to and mounted on the stage 3730 in the laser annealer. The work W on the stage 3730 is aligned relative to the irradiation optical system 3720. The irradiation optical system 3720 serves to guide the annealing laser light AL. Next, the mask 3720b of the irradiation optical system 3720 is moved, or the stage 3730 is appropriately moved relative to the irradiation optical system 3720. Concurrently with this procedure, the laser light AL from the laser source 3710 is converted into a line or spot and is launched onto the work W. On the work W, an amorphous Si or another amorphous semiconductor thin film is formed, and a desired region of the semiconductor is annealed and recrystallized by irradiation and scanning of the thin film with the laser light AL. The resulting semiconductor thin film has satisfactory electric characteristics.

The alignment operation of the height and tilt of the work W on the stage 3730 relative to the irradiation optical system 3720 will now be illustrated in further detail. Initially, three apexes of a regular triangle centering on a processing region of the work W are defined as the measuring targets T1, T2, and T3. By controlling the XY stage unit 3744, the work W is appropriately moved in the X-Y plane to sequentially move each of the measuring targets T1, T2, and T3 on the work to a measuring point of the non-contact displacement gauge 3770. During this procedure, the detective light DL is launched from the projecting unit 3771 into each of the measuring targets T1, T2, and T3. The reflected light RL from each of the measuring targets T1, T2, and T3 is converted into a signal corresponding to the incident position in the light receiving unit 3772. In the master controller 3780, measurements about the heights of the individual measuring targets T1, T2, and T3 are obtained with reference to the signals about the incident positions from the light receiving unit 3772. The measurements obtained from the three points T1, T2, and T3 are supposed to include errors due to the tilt of the work W. In this procedure, these errors are neglected, and the tilt angles θX and θY of the work W are adjusted by the tilting unit 3742 so as to control the heights of the three points T1, T2, and T3 to an identical level. Then, the work W is appropriately moved in the X-Y plane by the action of the XY stage unit 3744, and measurements about the heights of the individual measuring targets T1, T2, and T3 on the work W are obtained. By repeating the height measuring and the adjustment of the tilt angles of the three points T1, T2, and T3 in the above manner, tilt-induced errors in height measurements are gradually decreased. Ultimately, when the measurements of the three points T1, T2, and T3 agree with each other, θX=0 and θY=0, i.e. the tilt of the work becomes zero. At this stage, any one measurement of the heights constitutes the height of the processing region on the work W. Ultimately, the tilting unit 3742 is operated as a Z stage to move the stage 3730, i.e., the work W, up or down to a target height.

The invention is illustrated with reference to the embodiments as above, but these embodiments are not intended to limit the scope of the invention. For example, the system can include three or more non-contact displacement gauges 3770. In this case, the individual non-contact displacement gauges 3770 are arranged to make measurements of three different points on the work W concurrently. This configuration can rapidly correct the tilt of the work W without moving the work W by action of the XY stage unit 3744.

In the above embodiment, the tilting unit 3742 is operated as the Z stage. However, the system can include an independent Z stage to completely separately adjust the tilt and height of the work W.

The above embodiment employs a work W comprising a glass substrate and a semiconductor thin film formed thereon. However, the work may be made of any material insofar as the material can produce a regularly reflected light.

The above focusing system is installed in a laser annealer for annealing the semiconductor layer on the work W with the laser light AL. The focusing system can be also applied to not only annealers for semiconductor materials but also pulsed laser processors by appropriately modifying the configurations of, for example, the laser source 3710 and the irradiation optical system 3720. Such pulsed laser processors can serve to, for example, modify, cut or weld various materials.

Figure 24:
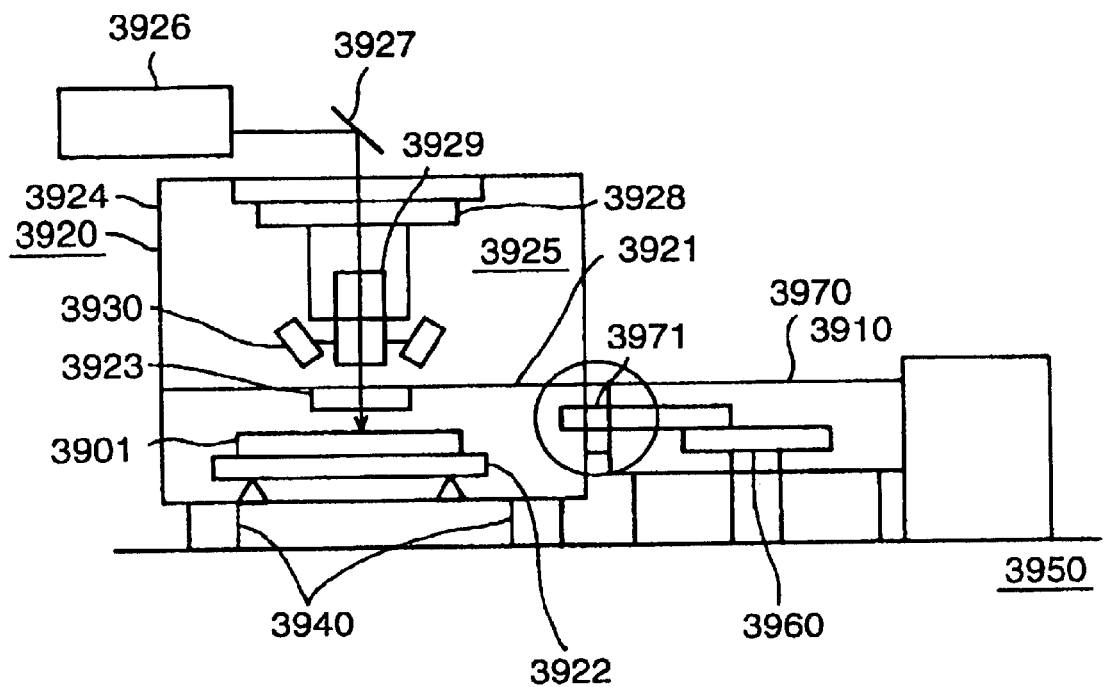
FIG. 24 is a schematic diagram of the invented composite system.

FIG. 24 is a schematic diagram of the configuration of a composite system according to the invention. The illustrated system includes a CVD system 3910 as a primary processing unit, and a laser annealer 3920 as a secondary processing unit. The CVD system 3910 forms a film on a glass substrate (work), and the laser annealer 3920 subjects the film-formed glass substrate to laser annealing.

The laser annealer 3920 comprises a sealable process chamber 3921. The process chamber 3921 houses a processing stage 3922 for mounting a glass substrate 3901 after film-formation. A ceiling of the process chamber 3921 has a process window 3923 for passing a laser beam from the following laser irradiating system. The upper space of the process chamber 3921 houses a frame 3924 constituting the laser irradiating system 3925.

The laser irradiating system 3925 receives a laser beam produced by a laser 3926 via a reflecting mirror 3927, shapes the laser beam to have a predetermined profile and apply the shaped laser beam to focus on the glass substrate 3901. In this system, only a configuration for a rectangular beam is described. Another configuration for a long beam will be described later.

The laser irradiating system 3925 includes, for example, a mask stage 3928 supporting a mask, an optical lens system 3929, and a sensor 3930 as components for a rectangular beam. The sensor 3930 serves to detect the position of focus of the beam on the glass substrate 3901 and is used for precisely adjusting the position of focus.

The laser annealer 3920 is placed on a floor 3950 via plural vibration isolation stages as mentioned below.

Figure 25:
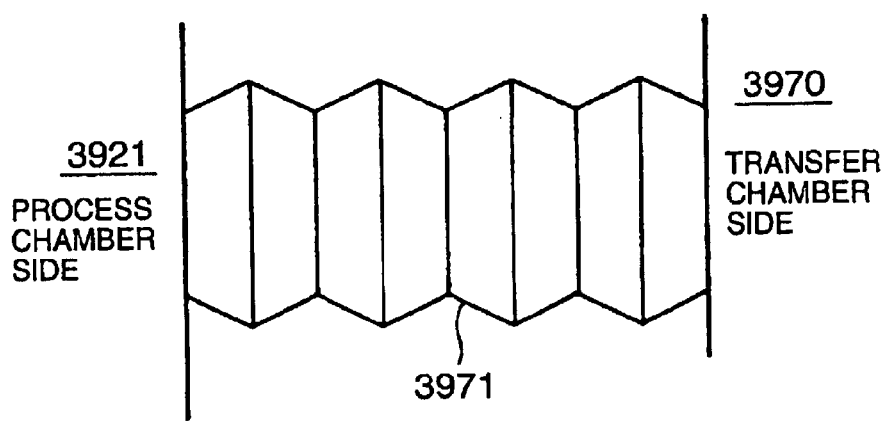
FIG. 25 is an enlarged view of the bellow shown in FIG. 24.

The CVD system 3910 is connected to the process chamber 3921 via a transfer chamber 3970. The transfer chamber 3970 houses a substrate moving robot 3960 as a moving mechanism. Particularly, as shown in FIG. 25, the process chamber 3921 is to be connected to the transfer chamber 3970 with the interposition of the bellow 3971. The connection portion between the process chamber 3921 and the transfer chamber 3970 is a place where the substrate moving robot 3960 holds the glass substrate in the CVD system 3910 and delivers the substrate to the process chamber 3921. To maintain the inside of the process chamber 3921 in vacuo or at a constant pressure, the connection portion must be cut off from the air, and the bellow 3971 performs this function. The transfer chamber 3970 requires a gate valve mechanism to inhibit the communication between the CVD system 3910 and the process chamber 3921. Such gate valve mechanisms are well known and are not illustrated herein.

Figure 26:
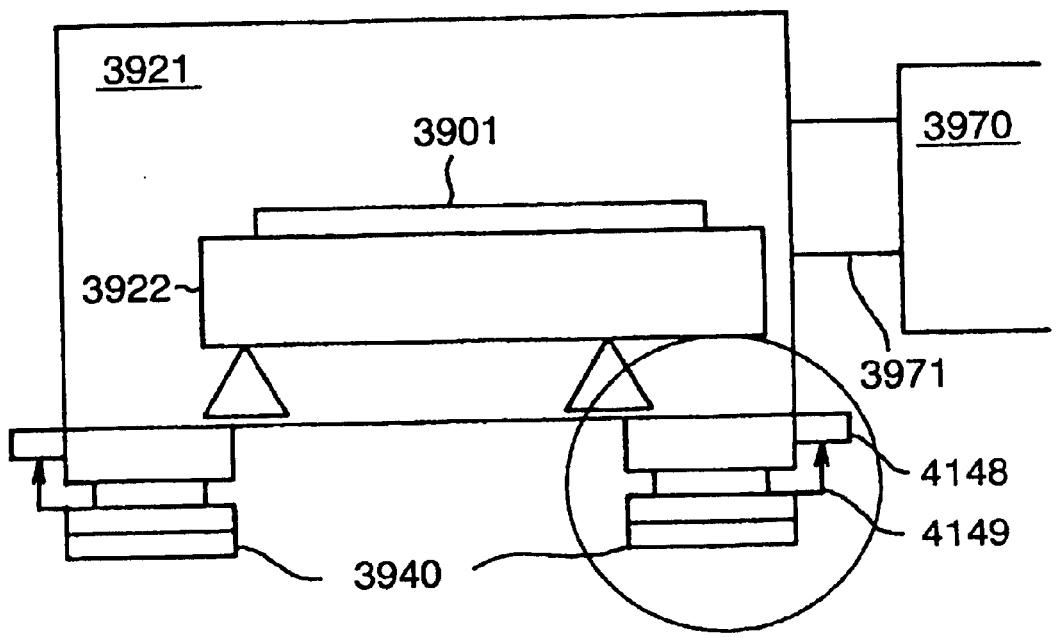
FIG. 26 is a diagram showing the relationship between the process chamber and the vibration isolation stage shown in FIG. 24.
Figure 27:
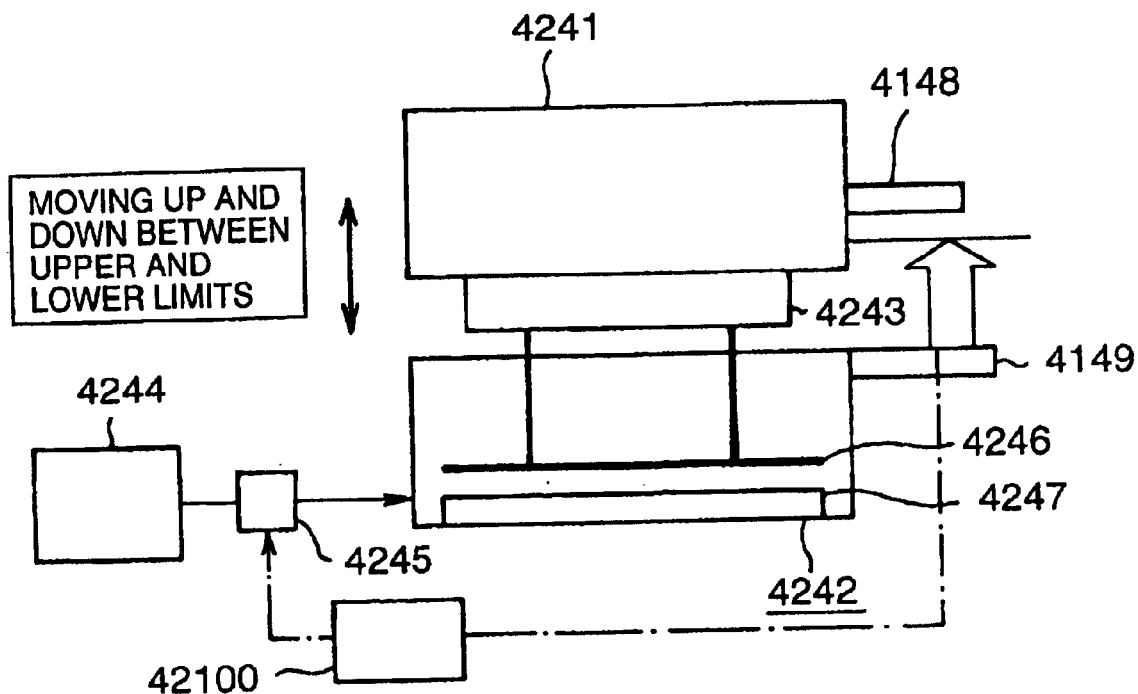
FIG. 27 is an enlarged view showing the configuration of the vibration isolation stage shown in FIG. 26.

Next, the configuration of the vibration isolation stages, essential units of the invented vibration isolation system, will be illustrated with reference to FIGS. 26 and 27. Each of the vibration isolation stages 3940 comprises an upper seating 4241, and an air damper 4242 connected via a vibration isolation rubber 4243 to the upper seating 4241. On the upper seating 4241, the process chamber 3921 is mounted. To the air damper 4242, compressed air is supplied from a compressor 4244 via a control valve 4245. The air damper 4242 includes a piston unit 4246 and a first stopper member 4247. The piston unit 4246 moves up and down according to the supplied compressed air. The first stopper member 4247 defines a lower limit position of the piston unit 4246 during vibration.

The upper seating 4241 comprises a second stopper member 4148. The second stopper member 4148 defines on-off of operations of the vibration isolation stages 3940, and specifies an upper limit position of the vibration isolation stages 3940, specifically, an upper limit position in a height direction of a casing which houses the air damper 4242. The casing which houses the air damper 4242 includes a position detector 4149 for detecting a relative distance between the casing and the second stopper member 4148. The position detector 4149 also serves to limit the displacement of the casing or the process chamber as follows. If the process chamber 3921 or the casing which houses the air damper 4242 displaces to a degree exceeding a predetermined allowable range, a portion of the position detector 4149 is engaged with the second stopper member 4148, and this engagement limits the displacement as shown in FIG. 26.

A detective signal is sent out from the position detector 4149 to a controller 42100 as a feedback signal. The controller 42100 controls the control valve 4245 with reference to the relative distance between the second stopper member 4148 and the position detector 4149 indicated by the detective signal. The controller 42100 thus operates the vibration isolation stages 3940 to eliminate the vibration of the process chamber 3921.

Particularly, when the controller 42100 detects that the relative distance becomes equal to or less than a predetermined level, for example, such that a portion of the position detector 4149 comes in contact with the second stopper member 4148, the controller 42100 stops the control operation to the control valve 4245 to cease the vibration isolation function. Contact of a portion of the position detector 4149 with the second stopper member 4148 means that up-and-down movements of the upper seating 4241 or of the air damper 4242 exceed the allowable range. In this connection, the second stopper member 4148 is configured in such a manner that the position of the second stopper member in a vertical direction can be changed by a screw or another adjusting means.

As is thus described, each of the vibration isolation stages 3940 has a feedback control function. According to this function, the vibration isolation stage 3940 controls the pressure of the compressed air which defines the vibration isolation property to thereby eliminate vibration, when the relative distance between the second stopper member 4148 and the position detector 4149 changes. In addition, if the up-and-down movements of the upper seating 4241 or of the air damper 4242 exceed the allowable range, the vibration isolation stage 3940 deactivates the feedback control function. The position of the second stopper member 4148 can be adjusted up and down by hand, and a position at which the vibration isolation function is stopped can be optionally set.

Specifically, the vibration isolation stage 3940 exerts its function from a point where the piston unit 4246 comes in contact with the first stopper member 4247 to a point where a portion of the position detector 4149 comes in contact with the second stopper member 4148. If the distance between these two points is set at 200 $\mu$m, the vibration isolation stage 3940 functions within a range of up-and-down movements of $\pm 100$ $\mu$m.

Operations in a high precision scanning with rectangular beams will now be described. When rectangular beams are used for processing, the vibration in the process chamber 3921 is mainly derived from vibration that travels from the CVD system 3910 or the floor 3950. This vibration has an amplitude of at most plus or minus several tens of micrometers, and the bellow 3971 does not displace to a significant degree due to scanning. To surely activate the vibration isolation function in scanning operation with a rectangular beam, the relative distance between the second stopper member 4148 and the position detector 4149 in the vibration isolation stage 3940 should be set at a level somewhat greater than an expected displacement. For example, the relative displacement is set at 200 $\mu$m. In this case, vibrations from the floor 3950 are absorbed by the plural vibration isolation stages 3940 through the feedback control function, and vibrations from the CVD system 3910 are absorbed by the bellow 3971.

Next, operations in a low precision scanning with long beams will be described. When long beams are used for processing, the processing stage 3922 in the process chamber 3921 moves, and the location of center of gravity of the processing stage 3922 in the process chamber 3921 shifts, and the overall process stage is liable to tilt to a great degree. If the tilt is small, the same vibration isolation function works as in the processing with rectangular beams. However, if the tilt is large, the second stopper member 4148 limits the function and the vibration isolation stage 3940 stops its function. If the vibration isolation stage 3940 does not function, the process chamber 3921 and the bellow 3971 integrally move, and the relative position between the process chamber 3921 and the bellow 3971 does not shift. Accordingly, the bellow 3971 is not destroyed even if it undergoes large displacement. In this connection, the scanning precision with long beams allows large vibrations several tens of times of that in scanning with rectangular beams, and such vibrations do not affect the scanning precision.

Figure 28:
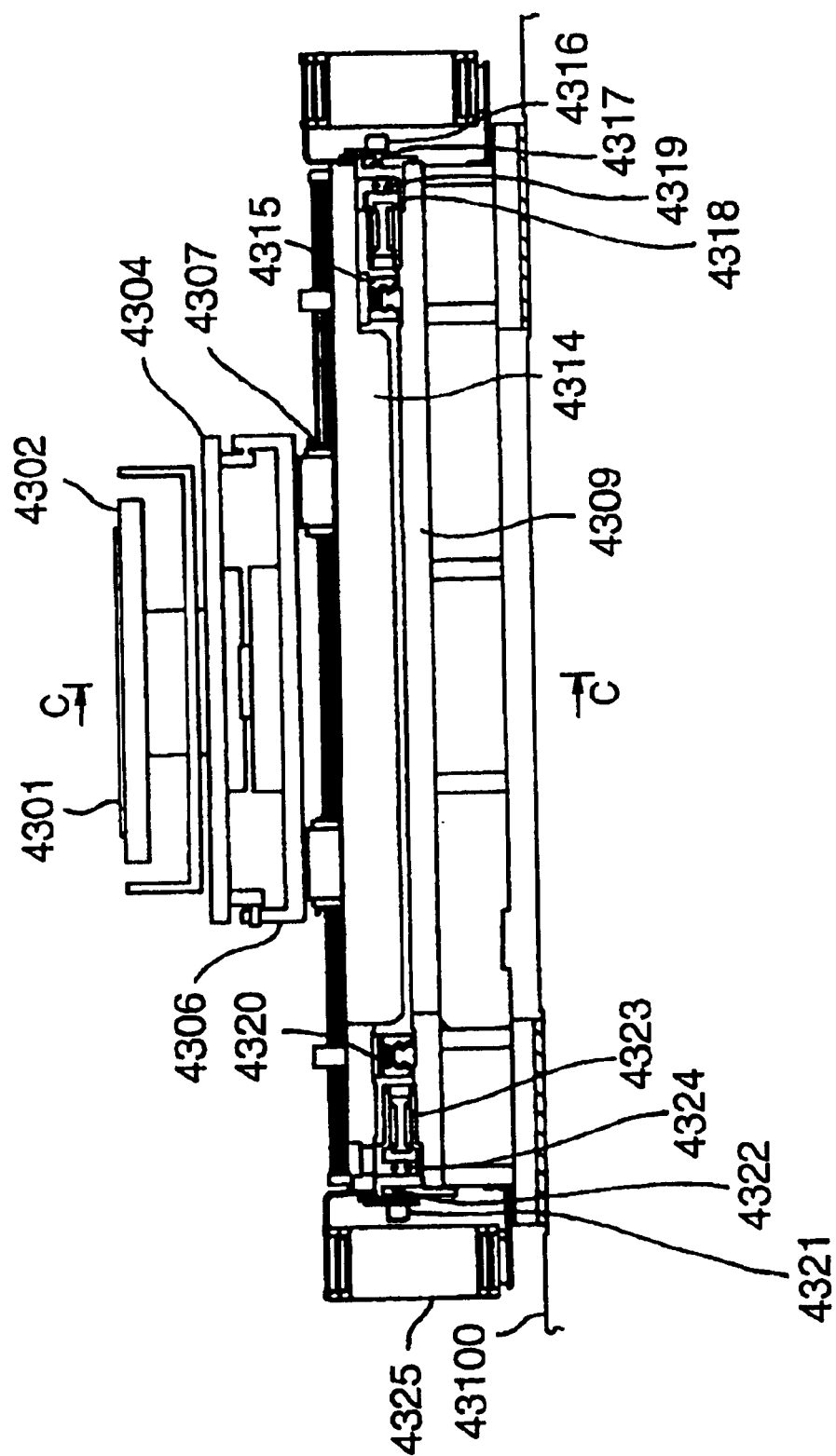
FIG. 28 is a sectional view of the invented vacuum linear actuator driving unit.
Figure 29:
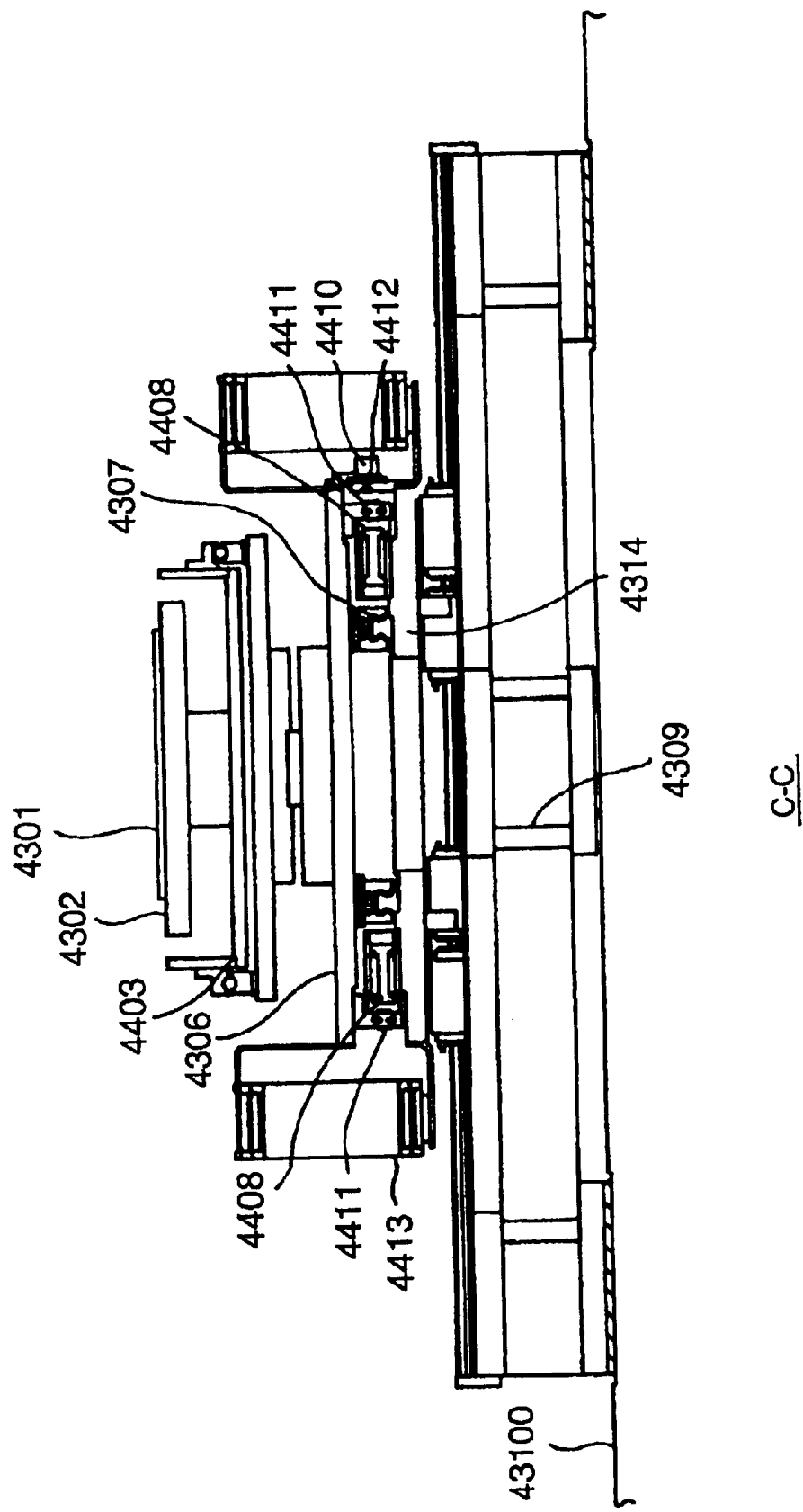
FIG. 29 is a vertical sectional view taken along line C—C in FIG. 28.
Figure 30:
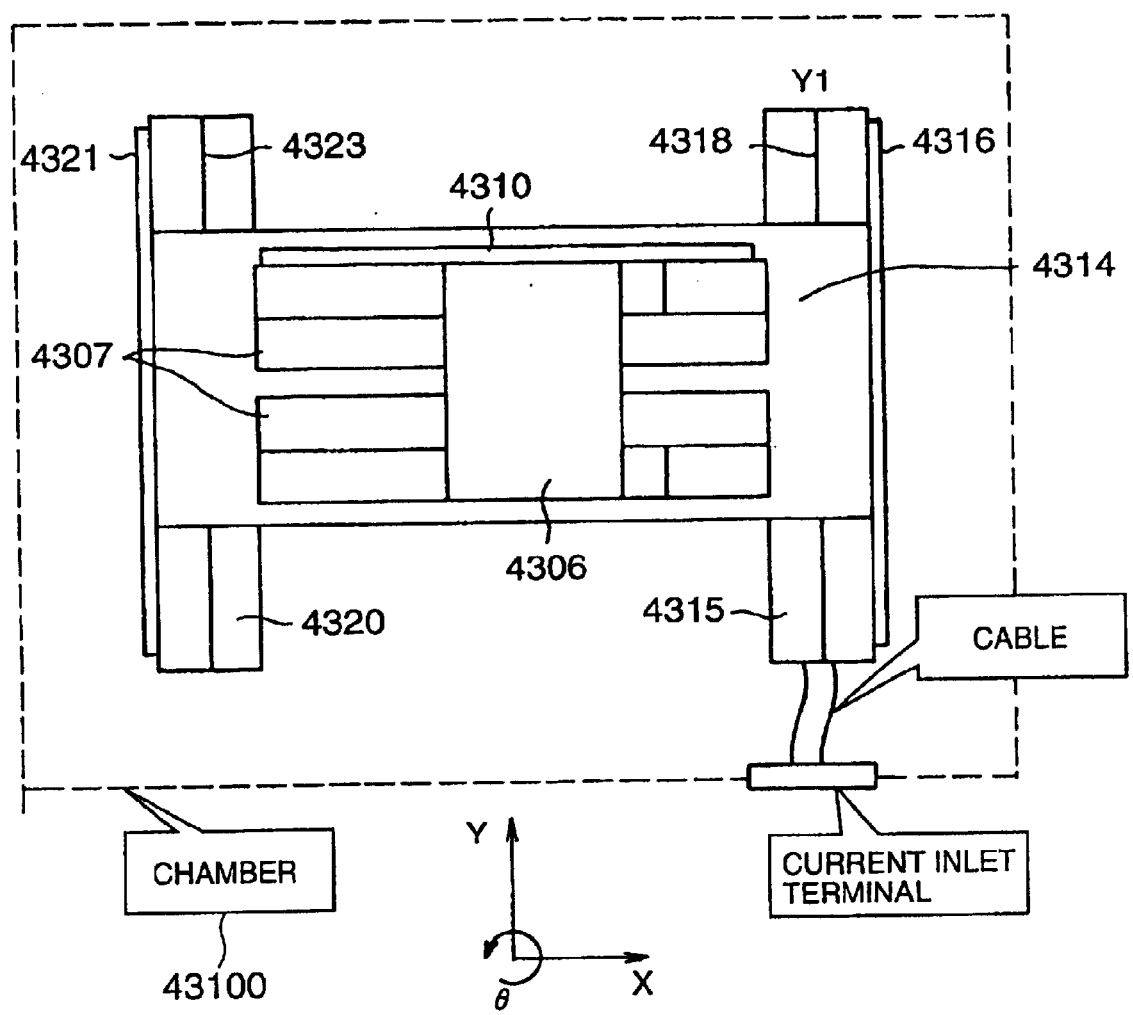
FIG. 30 is a diagram showing the schematic configuration of the driving unit shown in FIG. 28.

Subsequently, an embodiment of the mechanical configuration of the invented vacuum linear actuator mechanism will be illustrated in detail with reference to FIGS. 28 and 29. A configuration suitable for use in a vacuum chamber for laser annealing will be described herein. Such a vacuum chamber is symbolically indicated by dashed lines 43100 in FIG. 30, and includes any vacuum chamber insofar as it is usable in an atmosphere at a pressure from atmospheric pressure to about $1.0 \times 10^{-6}$ Torr.

The vacuum chamber 43100 houses a stage base 4309 as a fixed base member at the bottom. At both side ends of the stage base 4309, Y axis linear bearings 4315 and 4320 are mounted. The Y axis linear bearings 4315 and 4320 extend in parallel with each other in the Y axis direction, and serve to linearly guide a Y axis base 4314 which is assembled on these bearings. At both side ends of the Y axis base 4314, a pair of X axis linear bearings 4307 are mounted. The X axis linear bearings 4307 extend in parallel with each other in the X axis direction, and serve to linearly guide an X axis base 4306 assembled on these bearings. To the X axis base 4306, a trolley 4403 is attached. The trolley 4403 supports a stage 4302 including a heating heater. On the stage 4302, a work (e.g., a glass) 4301 is placed.

The X axis base 4306 is driven by a pair of X axis linear motors 4408. The X axis linear motors 4408 are arranged on the Y axis base 4314 adjacent to the X axis linear bearings 4307. The position of the X axis base 4306 is detected by an X axis linear encoder 4410. The X axis linear encoder 4410 is arranged on the Y axis base 4314 adjacent to one of the X axis linear motors 4408. This configuration serves to directly drive the X axis base 4306 and to directly detect its position. This eliminates deterioration of precision due to backlash according to conventional technologies, and can yield quick responses.

The Y axis base 4314 is driven by two linear motors 4318 and 4323. The linear motors 4318 and 4323 are placed on the stage base 4309 and can be independently controlled. The position of the Y axis base 4314 is detected at two points opposite to each other by two linear encoders 4316 and 4321. The linear encoders 4316 and 4321 are arranged on the stage base 4309 adjacent to the linear motors 4318 and 4323, respectively. This configuration also eliminates deterioration of precision due to backlash and can yield quick responses, as in the X axis. In addition, the position in the Y axis direction is detected by the linear encoders 4316 and 4321 at two points at opposite ends of the Y axis base 4314. This configuration can detect and control minute rotation of the Y axis base 4314 with reference to a difference between individual measurements. The minute rotation of the Y axis base 4314 means a rotation around the Z axis which is perpendicular to X- and Y-axes, and is hereinafter referred to as "rotation θ around the Z axis".

To prevent heat irradiated by the heater of the stage 4302 from transferring into the X axis base 4306 and the Y axis base 4314, a water-cooled plate 4304 is arranged between the trolley 4403 and the X axis base 4306. The X axis base 4306 also includes a water-cooling mechanism to prevent troubles in, for example, the linear bearings, due to radiant heat from the heater of the stage 4302. In addition, coils of individual linear motors evolve heat during operation of the stage. Thus, the individual linear motors include X axis motor coil cooling plates 4411 and Y axis motor coil cooling plates 4319 and 4324, respectively, and these cooling plates cool the coils of the linear motors. Likewise, to prevent damage or deterioration of precision due to thermal deformation, the X axis linear encoder 4310 and Y axis linear encoders 4316 and 4321 include, respectively, an X axis encoder cooling plate 4412 and Y axis encoder cooling plates 4317 and 4322. These plates maintain the encoders at constant temperatures.

The system further includes a cable guide 4413 corresponding to the X axis linear encoder 4410, and cable guides 4325 respectively corresponding to the Y axis linear encoders 4316 and 4321. These cable guides guide cables for detective signals from the X axis linear encoder 4410 and the Y axis linear encoders 4316 and 4321 to a fixed unit, as these encoders move.

Figure 31:
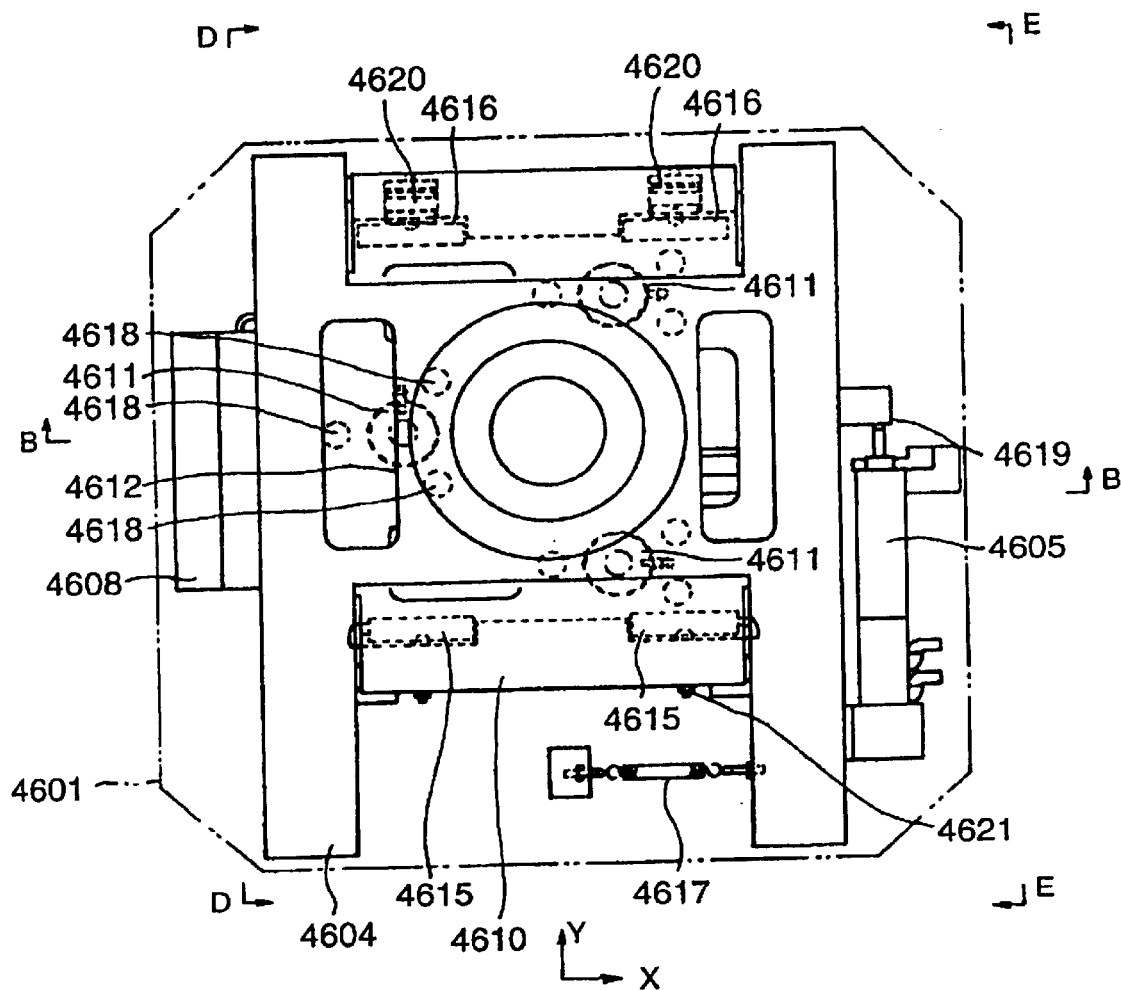
FIG. 31 is a top view of the invented mask stage driving mechanism.
Figure 32:
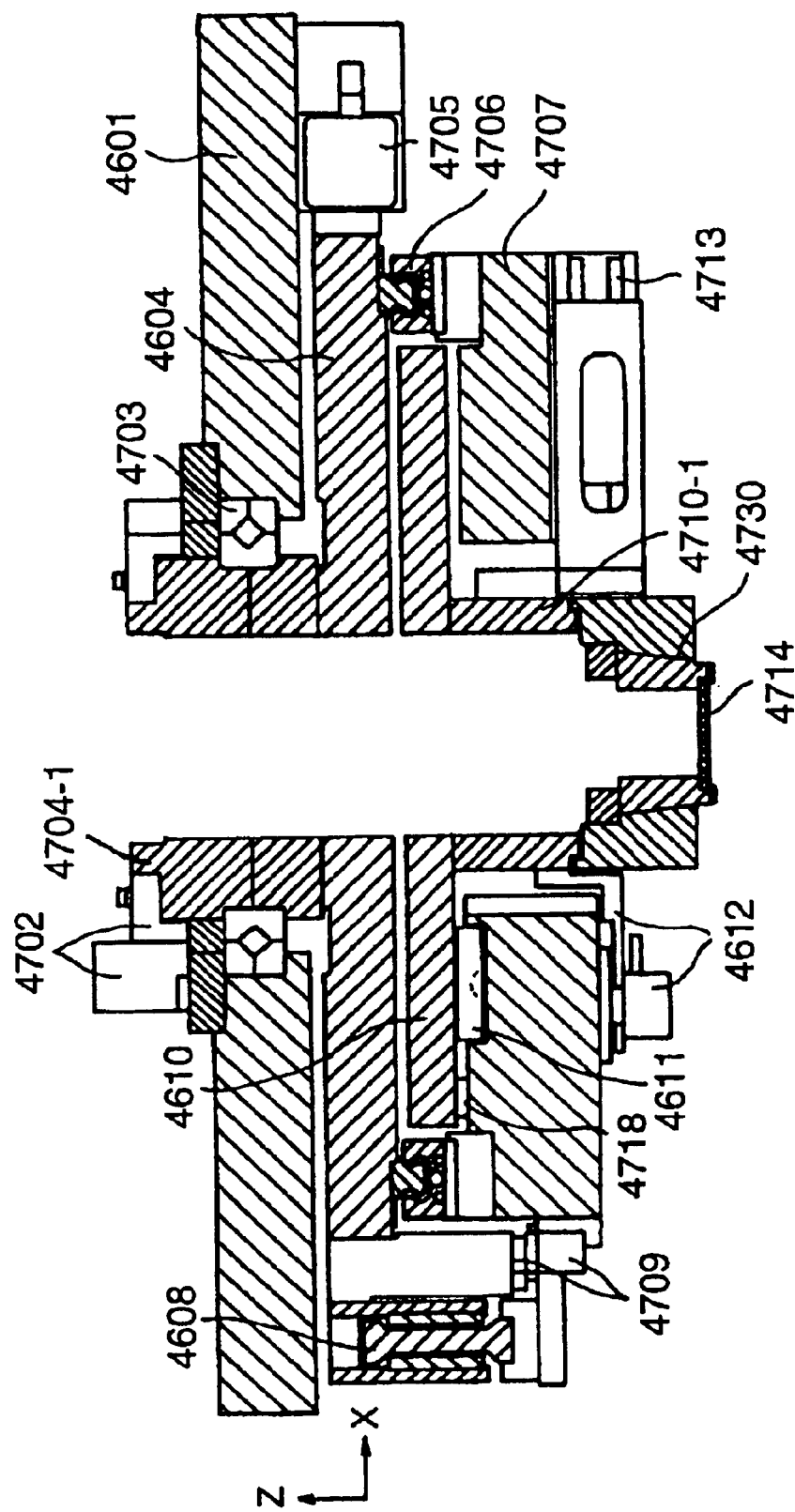
FIG. 32 is a vertical sectional view taken along line B—B in FIG. 31.

An embodiment of the invented mask stage driving mechanism will be illustrated below with reference to FIGS. 31 and 32. The configuration of the stage will now be described from top to bottom in turn. The stage includes a base plate 4601 fixed to a fixed unit not shown. The base plate 4601 has a large round opening in the center. The base plate 4601 includes a cross roller bearing 4703 mounted at the edge of the opening, and comprises a θ axis movable unit 4604 arranged on its lower surface side. The θ axis movable unit 4604 is rotatably arranged around the θ axis, i.e., the Z axis via the cross roller bearing 4703. The θ axis movable unit 4601 also has an opening at its center corresponding to the opening of the base plate 4601. Under the θ axis movable unit 4604, the stage includes a Y axis movable unit 4707. The Y axis movable unit 4707 is movably arranged in the Y axis direction via a pair of Y axis linear bearings 4707. The Y axis linear bearings extend in parallel with each other in the Y axis direction. The Y axis movable unit 4707 also has an opening at its center corresponding to the opening of the base plate 4601.

The Y axis movable unit 4707 comprises an X axis movable unit 4610 in a space formed for ensuring the arrangement of the Y axis linear bearings 4706. Lifting air bearings 4611 and yaw-guide air bearings 4615 and 4616 guide the X axis movable unit 4610 in the X axis direction. The X axis movable unit 4610 also has an opening at its center corresponding to the opening of the base plate 4601.

Specifically, the X axis movable unit 4610 is positioned between the θ axis movable unit 4604 and the Y axis movable unit 4707 and is arranged movably in the X axis direction via plural lifting air bearings 4611. The lifting air bearings 4611 are arranged on a surface of the Y axis movable unit 4707 facing the X axis movable unit 4610. The lifting air bearings 4611 serve to float the X axis movable unit 4610 by blowing compressed air to the lower surface of the X axis movable unit 4610. The mechanism shown in the figures includes three lifting air bearings 4611 arranged at angular intervals of 120 degrees.

The X axis movable unit 4610 is composed of a magnetic material. The Y axis movable unit 4707 further comprises attraction magnets 4618 at plural points on the surface facing the X axis movable unit 4610. In this example, a total of nine magnets 4618, i.e., each three magnets around three lifting air bearings 4611, are arranged. In addition, the X axis movable unit 4610 has two edges in parallel with the X axis direction. By using these edges, the yaw-guide air bearings 4615 and 4616 arranged on the Y axis movable unit 4707 guide the X axis movable unit 4610 in the X axis direction. Each two yaw-guide air bearings 4615 and 4616 are arranged for each of the edges of the X axis movable unit 4610. In addition, the two yaw-guide air bearings 4616 for one edge of the X axis movable unit 4610 respectively include pre-load pistons 4620 in combination to apply a pre-load onto the one edge. With the X axis movable unit 4610, a mask stage 4730 is combined via a boss 4710-1. The mask stage 4730 has an opening at its center and projects from the lower side of the Y axis movable unit 4707, and has a supporting unit for a mask 4714 at its bottom. The opening of the mask stage 4730 is somewhat smaller than the opening of the base plate 4601.

The mask stage is thus configured to have three degrees of freedom in the X, Y, and θ axes. The output axis of a θ axis driving motor 4605 moves in the axial direction according to the rotation of the θ axis driving motor 4605 to push a θ axis driving plate 4619. This operation allows the θ axis movable unit 4606 to rotate counterclockwise around the Z axis relative to its center. The output axis of the θ axis driving motor 4605 is not fixed to the driving plate 4619. A traction spring 4617 is therefore arranged between the base plate 4601 and the θ axis movable unit 4604 to apply a pre-load in a clockwise direction. This configuration prevents backlash and irregular rotation due to, for example, friction of the cross roller bearing 4703. The rotation angle of the θ axis movable unit 4604 is determined by a hollow rotary encoder 4702 to ensure its precision. The rotary encoder 4702 is combined to a rotation axis 4704-1, and the rotation axis 4704-1 is mounted on the 0 axis movable unit 4604 and integrally rotates therewith. Thus, the rotation precision of the e axis movable unit 4604 is ensured.

A Y axis linear motor 4608 is arranged between the edge of the θ axis movable unit 4604 and the edge of the Y axis movable unit, and drives the Y axis movable unit 4707 in the Y axis direction. The position of the Y axis movable unit 4707 is determined by a Y axis linear encoder 4709 arranged in the vicinity of the Y axis linear motor 4608. An X axis linear motor 4713 drives the X axis movable unit 4610. The X axis linear motor 4713 is arranged under the Y axis movable unit 4707, and its movable part is connected to the boss 4710-1 to drive the X axis movable unit 4610 and the boss 4710-1 in the X axis direction. The position of the X axis movable unit 4610 is determined by an X axis linear encoder 4612 arranged between the lower side of the Y axis movable unit 4707 and the boss 4710-1.

The guide mechanism of the X axis movable unit 4610 will be illustrated in further detail below. In an actual operation, a laser light is applied onto a work (not shown) placed under the mask using the opening of the center as an optical path, while the work is scanned with the laser light at a constant speed. The X axis movable unit 4610 therefore requires a high trackability and alignment accuracy (registration). Accordingly, the guide mechanism of the X axis movable unit 4610 employs hydrostatic bearings, and comprises two vertical (radial) and horizontal guide mechanisms. The lifting air bearings 4611 mounted on the Y axis movable unit 4707 and the guide surface of the X axis movable unit 4610 constitute the hydrostatic bearing for vertical guiding. Particularly, to ensure a gap (about 5 to 10 μm) to obtain a high guide rigidity, a pre-load is applied by attraction of the plural magnets 4618 mounted on the Y axis movable unit 4707.

Generally, air bearings are fixed to a movable unit side. However, in this mechanism, lifting air bearings 4611 are fixed not to the X axis movable unit 4610 but to the Y axis movable unit 4707 which constitutes a base for the X axis movable unit 4610. This configuration utilizes a short stroke necessary for the X axis movable unit 4610, and reduces the weight of the X axis movable unit 4610 and decreases the number of connected air-supply tubes to the air bearings. Such air-supply tubes disturb the movement of the X axis movable unit 4610.

Two pairs of the yaw-guide air bearings 4615 and 4616 mounted on the X axis movable unit 4610 constitute the hydrostatic bearing for horizontal guiding of the X axis movable unit 4610. These two pairs of yaw-guide air bearings 4615 and 4616 sandwich the X axis movable unit 4610. The two yaw-guide air bearings 4615 are respectively supported by expanding bolts 4621. Each of the expanding bolts 4621 is mounted on the X axis movable unit 4610 and its tip is in contact with the yaw-guide air bearing 4615. By adjusting the degree of protrusion of each expanding bolt, the horizontal position of the X axis movable unit 4610 can be controlled.

The yaw-guide air bearings 4616 are arranged in an opposite side to the yaw-guide air bearings 4615, and are supported by pre-load pistons 4620 with a constant force. This configuration can maintain constant hydrostatic bearing gaps without being affected by, for example, thermal deformation, mechanical processing precision, and assembling errors of the X axis movable unit 4610, the Y axis movable unit 4707, and other components.

All the support points of the air bearings are spherically supported by ceramic balls. Even if the parallelism between the air bearing surface and a counter surface is lost due to waviness, thermal deformation, and other deformation of the counter surface, such loss in parallelism can be absorbed to some extent.

Figure 33:
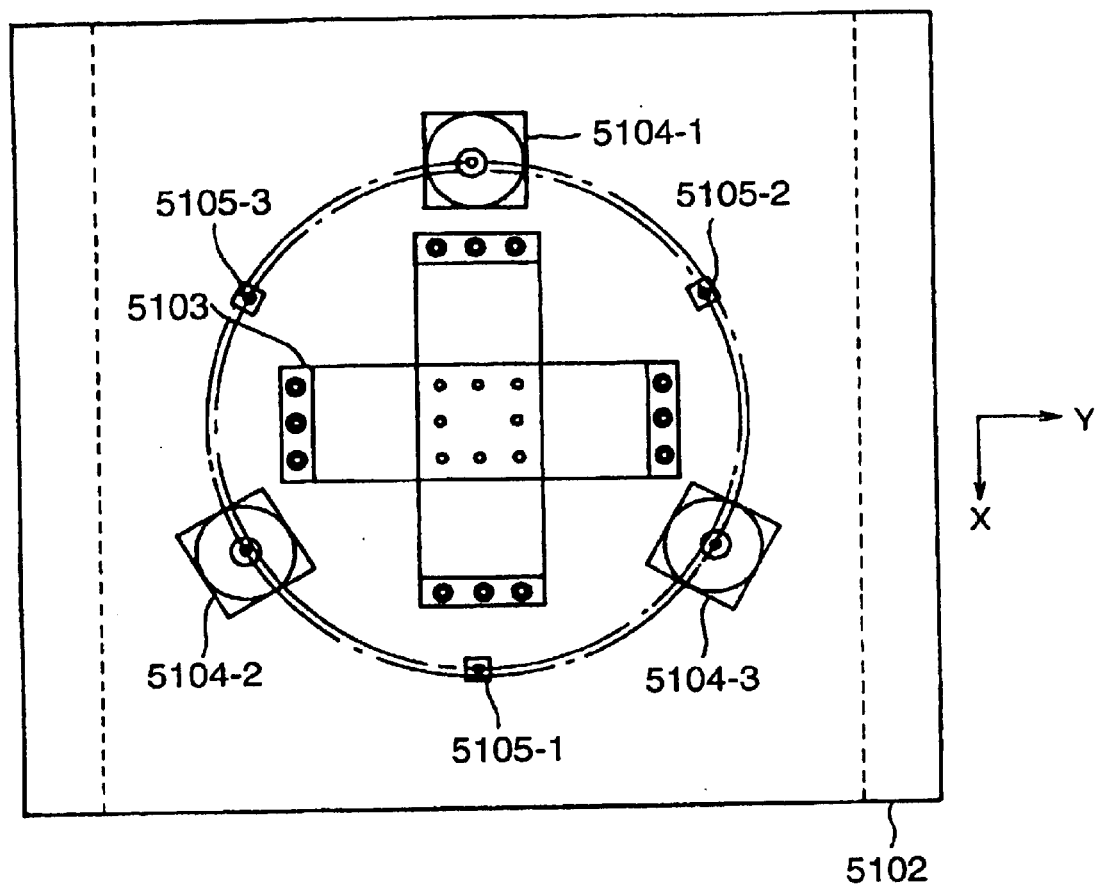
FIG. 33 is a top view showing the invented stage unit including a pneumatic tilt mechanism, where a stage is dismounted.
Figure 34:
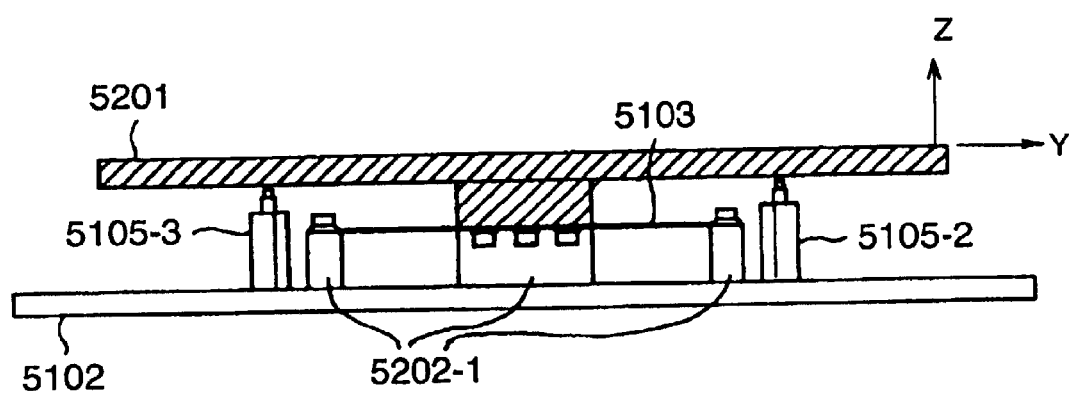
FIG. 34 is a side sectional view of a pneumatic tilt mechanism for use in the invention.

FIGS. 33 and 34 each show a schematic diagram of a stage unit for a vacuum chamber including the invented pneumatic tilt mechanism. The stage unit is placed in a vacuum chamber that can obtain vacuum or reduced pressure. In these figures, the vacuum chamber is not shown.

The invented pneumatic tilt mechanism includes a base 5102, three bellows cylinders 5104-1, 5104-2, and 5104-3, and a plate spring 5103 on the base 5102 to support a stage 5201. The bellows cylinders are pneumatically driven. The plate spring 5103 is in the shape of a cross. The stage 5201 includes a platform on its lower side, and the center (intercept) of the plate 5103 is fixed to the platform with, for example, bolts. Four edges of the plate spring 5103 are respectively fixed via supports 5202-1 to the base 5102.

Each of the bellows cylinders 5104-1, 5104-2, and 5104-3 includes a pneumatic cylinder sealed by bellows. Even if the air is leaked from the pneumatic cylinder, this configuration can prevent the leaked air from migrating into the vacuum chamber.

The pneumatic tilt mechanism allows the plate spring 5103 to support the stage 5201, and permits the bellows cylinders 5104-1, 5104-2, and 5104-3 to expand and contract by supplying compressed air to the bellows cylinders 5104-1, 5104-2, and 5104-3. The pneumatic tilt mechanism thus adjusts the height and tilt of the stage 5201.

Figure 35:
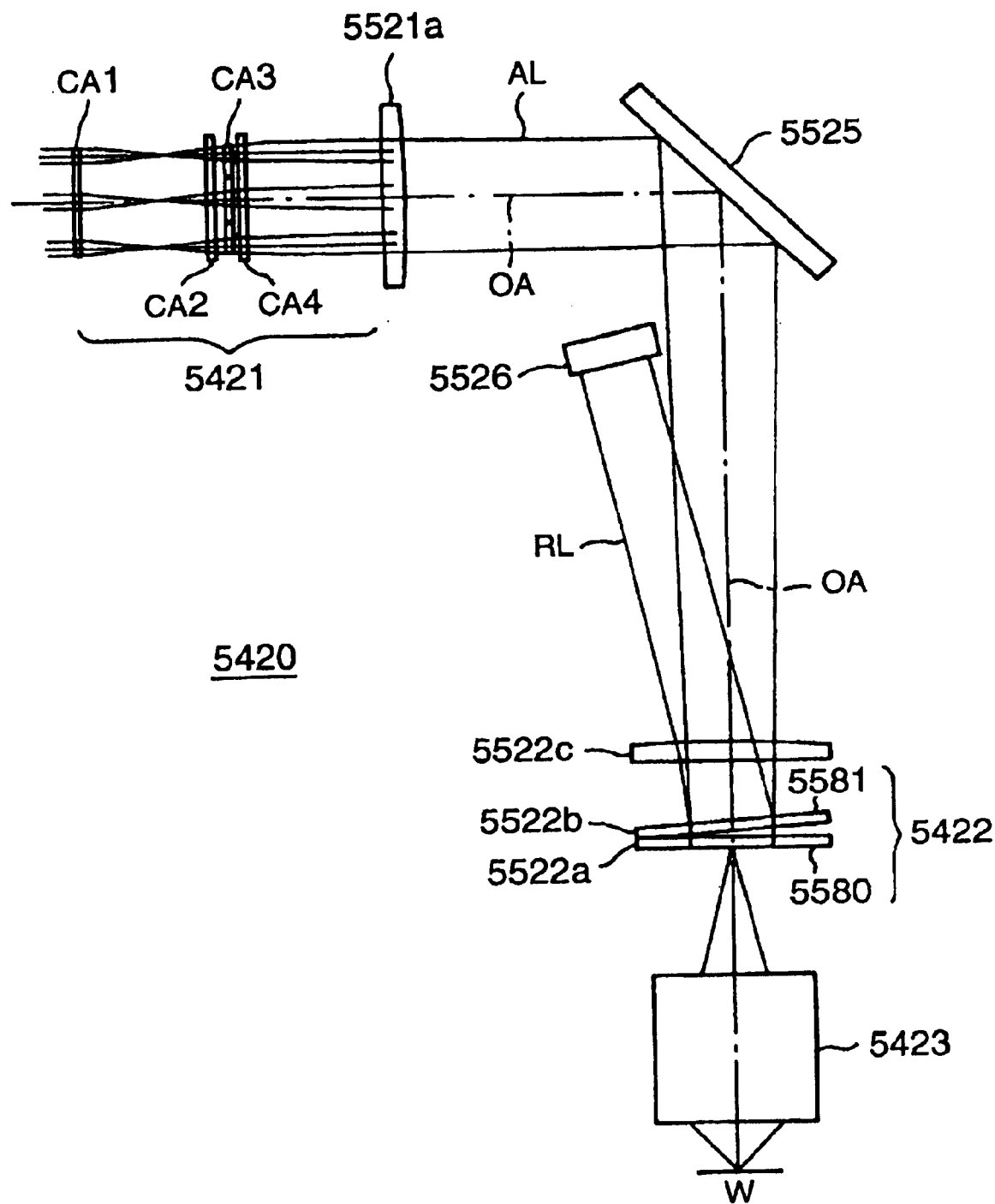
FIG. 35 is a diagram showing the process and system for eliminating reflected light for use in the invention.

FIG. 35 illustrates the configuration of an irradiation optical system 5420. A laser light AL is launched from a laser source (not shown) into a homogenizer 5421. The homogenizer 5421 includes first to fourth cylindrical lens arrays CA1 to CA4, and a condenser lens 5521$a$. The cylindrical lens arrays CA1 to CA4 serve to independently control vertical and horizontal beam sizes. The condenser lens 5521$a$ serves to condense the laser light. The first and third cylindrical lens arrays CA1 and CA3 have a curvature in a cross section in parallel with the paper plane, and the second and fourth cylindrical lens arrays CA2 and CA4 have a curvature in a cross section perpendicular to the paper plane.

The laser light AL is launched from the homogenizer 5421 via a turning mirror 5525 into a mask assembly 5422. The mask assembly 5422 includes a mask 5522a, a reflecting member 5522b, and a field lens 5522c. The mask 5522a has a pattern on its lower surface 5580. The pattern is to be irradiated with the laser light AL and to be applied to a work W. The reflecting member 5522b inhibits the laser light AL from entering the periphery of a light transmitting region (i.e., opening) of the pattern of the mask 5522a and from causing reflected light. The field lens 5522c adjusts the pupil position. The reflecting member 5522b is arranged at an angle to the mask 5522a, and a reflected light RL from an upper surface 5581 of the reflecting member 5522b exits in a direction out of an optical axis OA and enters a beam damper 5526 via the field lens 5522c. The field lens 5522c can be considered to constitute a portion of the homogenizer 5421.

The laser light AL passed through the mask 5522a enters a projection lens 5423. The projection lens 5423 reduces and projects, i.e., forms a slit image onto a processing surface of the work W. The slit image is a transmitted patterned light formed on the mask 5522a which is illuminated by the laser light AL.

Next, a first embodiment of the CVD system according to the invention will be illustrated with reference to FIGS. 36 and 37. In the CVD system shown in FIG. 36, a silicon oxide film as a gate insulating film is formed on a conventional TFT glass substrate 7111, using, preferably, silane as a material gas. A casing 7112 of the CVD system is a vacuum casing, and the inside of the casing is maintained at a desired degree of vacuum during film forming operation by action of an evacuating mechanism 7113. The evacuating mechanism 7113 is connected to an evacuating port 7112b-1 formed in the vacuum casing 7112.

The vacuum casing 7112 houses a partition 7114 at the midpoint in a vertical direction. The partition 7114 is composed of a conductive material and is arranged in a nearly horizontal position, and has, for example, a square plane shape. The periphery of the partition 7114 is in contact with a peripheral wall of the vacuum casing 7112. The partition 7114 serves to separate the inside of the vacuum casing 7112 to two chambers, i.e., upper and lower chambers. The upper chamber forms a plasma-generating space 7115, and the lower chamber forms a film forming space 7116. The partition 7114 has a target specific thickness, and an overall flat form. The plane shape of the partition 7114 is similar to the horizontal sectional shape of the vacuum casing 7112. The partition 7114 has an inner space 7124.

The glass substrate 7111 is placed on a substrate supporting mechanism 7117 in the film forming space 7116. The glass substrate 7111 is substantially in parallel with the partition 7114 and is arranged in such a manner that its film forming surface (upper surface) faces the lower surface of the partition 7114. The potential of the substrate supporting mechanism 7117 is maintained at a grounding potential identical to the potential of the vacuum casing 7112. The substrate supporting mechanism 7117 further includes a heater 7118 inside thereof. The heater 7118 serves to maintain the temperature of the glass substrate 7111 at a predetermined level.

The configuration of the vacuum casing 7112 will now be described. The vacuum casing 7112 comprises an upper casing 7112a and a lower casing 7112b for easier assembling of the casing. The upper casing 7112a forms the plasma generating space 7115, and the lower casing 7112b forms the film forming space 7116. When the upper and lower casings 7112a and 7112b are assembled into the vacuum casing 7112, the partition 7114 is interposed between both of the casings. The partition 7114 is mounted in such a manner that the periphery of the partition comes in contact with a lower insulating member 7122 of annular insulating members 7121 and 7122. The annular insulating members 7121 and 7122 are interposed between the upper casing 7112a and an electrode 7120, when the electrode 7120 is arranged. This configuration separates and forms the plasma generating space 7115 and the film forming space 7116 respectively on the upper side and lower side of the partition 7114. Specifically, the partition 7114 and the upper casing 7112a constitute the plasma generating space 7115. In the plasma generating space 7115, the partition 7114, the upper casing 7112a, and the plate electrode (radio frequency electrode) 7120 constitute a region where a plasma 7119 is generated. The electrode 7120 is located nearly at the midpoint between the partition 7114 and the upper casing 7112. The electrode 7120 has plural holes 7120a. The upper casing 7112a includes the two annular insulating members 7121 and 7122 along the side inner surface thereof. The partition 7114 and the electrode 7120 are supported and fixed by the annular insulating members 7121 and 7122. The annular insulating member 7121 comprises an inlet pipe 7123 to bring an oxygen gas into plasma generating space 7115 from the outside. The inlet pipe 7123 is connected via a mass flow controller (not shown) to an oxygen gas source (not shown). The mass flow controller controls the flow rate.

The partition 7114 separates the inside of the vacuum casing 7112 into the plasma generating space 7115 and film forming space 7116. The partition 7114 has a plurality of through holes 7125. The through holes 7125 meet predetermined conditions and pass through the inner space 7124 and are distributed. Only the through holes 7125 allow the plasma generating space 7115 to communicate with the film forming space 7116. The inner space 7124 formed in the partition 7114 serves to disperse the material gas to thereby uniformly supply the material gas to the film forming space 7116. In addition, the lower wall of the partition 7114 includes plural diffusion holes 7126 to supply the material gas to the film forming space 7116. The through holes 7125 and the diffusion holes 7126 are respectively made so as to meet the following predetermined conditions. To the inner space 7124, an inlet pipe 7128 is connected for bringing the material gas into the inner space 7124. The inlet pipe 7128 is connected to the lateral side of the inner space 7124. The inner space 7124 includes a uniformizing plate 7127 nearly horizontally. The uniformizing plate 7127 has plural perforated holes 7127a so as to homogeneously supply the material gas from the diffusion holes 7126. As shown in FIG. 37, the uniformizing plate 7127 separates the inner space 7124 of the partition 7114 into two, upper and lower spaces 7124a and 7124b. The material gas is supplied via the inlet pipe 7128 into the inner space 7124. By the above configuration, the material gas is supplied into the upper space 7124a, is brought through the holes 7127a of the uniformizing plate 7127 into the lower space 7124b, and is diffused through the diffusion holes 7126 into the film forming space 7116. The configuration can evenly supply the material gas to the overall film forming space 7116.

Figure 37:
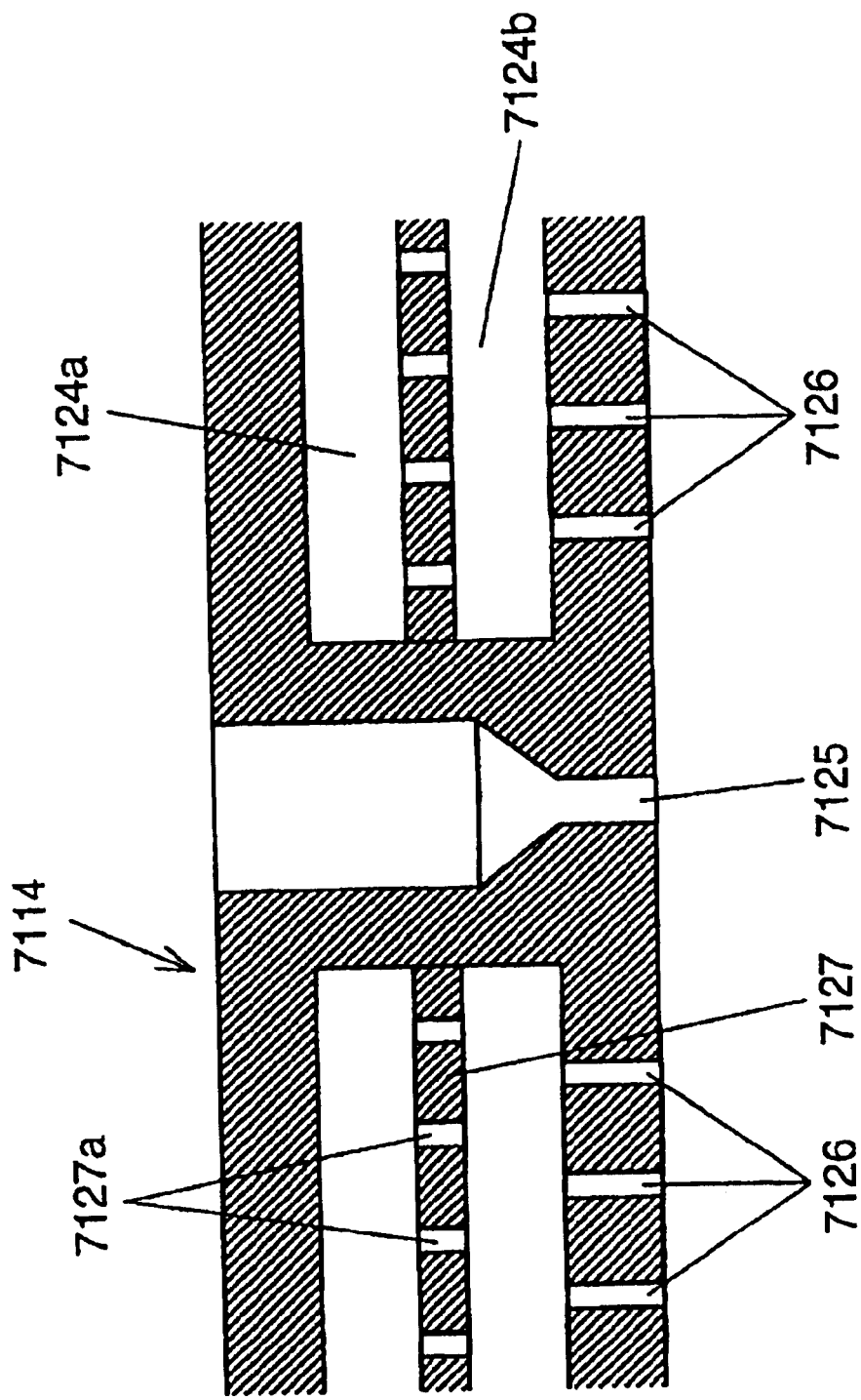
FIG. 37 is an enlarged sectional view of different holes formed in a partition.

FIG. 37 is an enlarged view of a portion of the partition 7114, i.e., essential parts of the through holes 7125, the diffusion holes 7126 and the uniformizing plate 7127. For example, the through holes 7125 have a larger diameter on the plasma generating space 7115 side, and a throttled, smaller diameter on the film forming space 7116 side.

The upper casing 7112a includes a power supply rod 7129 on its ceiling. The power supply rod 7129 is connected to the electrode 7120, and supplies a radio frequency power to the electrode 7120 for discharging. The electrode 7120 serves as a radio frequency electrode. The power supply rod 7129 is thus covered with an insulator 7131 to insulate the rod from other metallic parts.

A process for forming a film with the CVD system configured as above will be described. The glass substrate 7111 is transferred into the vacuum casing 7112 and is placed on the substrate supporting mechanism 7117 by a moving robot not shown. The inside of the vacuum casing 7112 is evacuated and is maintained under reduced pressure at a predetermined degree of vacuum by the evacuating mechanism 7113. An oxygen gas is then supplied through the inlet pipe 7123 into the plasma generating space 7115 in the vacuum casing 7112. The flow rate of the oxygen gas is controlled by the exterior mass flow controller. The flow velocity (u) of the oxygen gas is calculated according to the following equations (1) and (2):

$$Q_{O2}=\rho_{O2}uA \quad (1)$$

$$P_{O2}=(\rho_{O2}RT)/M \quad (2)$$

wherein $Q_{O2}$ is the flow rate of oxygen gas, $P_{O2}$ is the pressure of oxygen gas, $PO_2$ is the density of oxygen gas, R is the gas constant, and T is the temperature.

Separately, silane as the material gas is supplied via the inlet pipe 7128 into the inner space 7124 of the partition 7114. The silane is at first supplied into the upper space 7124a of the inner space 7124, is uniformized through the uniformizing plate 7127, diffuses to the lower space 7124b and is then supplied through the diffusion holes 7126 directly into the film forming space 7116. Specifically, the silane is introduced into the film forming space 7116 without coming in contact with a plasma. As the heater 7118 is energized, the substrate supporting mechanism 7117 in the film forming space 7116 is held at a predetermined temperature in advance.

In this state, a radio frequency power is supplied through the power supply rod 7129 to the electrode 7120. The radio frequency power causes electric discharge to form an oxygen plasma 7119 around the electrode 7120 in the plasma generating space 7115. The generation of the oxygen plasma 7119 invites the formation of radicals (excited active species) and neutral excited species.

In this configuration, the inner space of the vacuum casing 7112 is separated into the plasma generating space 7115 and the film forming space 7116 by the partition 7114 composed of a conductive material. When a film is formed on the surface of the substrate 7111, in the plasma generating space 7115, the oxygen gas is introduced and the radio frequency power is supplied to the electrode 7120 to form the oxygen plasma 7119. Separately, the material gaseous silane is supplied via the inner space 7124 and the diffusion holes 7126 of the partition 7114 and is directly brought into the film forming space 7116. The radicals in the oxygen plasma 7119 generated in the plasma generating space 7115 are brought through the plural through holes 7125 of the partition 7114 into the film forming space 7116, and the silane is brought through the inner space 7124 and the diffusion holes 7126 of the partition 7114 and is directly introduced into the film forming space 7116. The configuration (shape) of the through holes 7125 inhibits back-diffusion of the directly-introduced silane from the film forming space 7116 to the plasma generating space side. As is thus described, the material gaseous silane is directly brought into the film forming space 7116 without coming in direct contact with the oxygen plasma 7119, and the silane can be prevented from vigorously reacting with the oxygen plasma. In this manner, a silicon oxide film is formed on the surface of the substrate 7111 placed in the film forming space 7116 facing the lower side of the partition 7114.

In the above configuration, the sizes and other dimensions of the plural through holes 7125 of the partition 7114 are determined so as to limit the transfer of the oxygen gas to a target range, provided that the oxygen gas in the plasma generating space 7115 constitutes a mass transfer flow in the through holes, and that the silane in the film forming space 7116 diffuses and moves through the through holes 7125 into the plasma generating space 7115. Specifically, the dimensions are determined to meet the relationship uL/D>1, wherein D is the mutual gas diffusion coefficient of the oxygen gas and silane passing through the through holes 7125 of the partition 7114 at a temperature T, L is the length (characteristic length of the through holes) of a portion of the through holes 7125 having the minimum diameter, and u is the gas flow velocity. The requirements in dimensions of the through holes are preferably applied in the same manner to the diffusion holes 7126 in the partition 7114.

The relationship uL/D>1 can be derived in the following manner. For example, the relationship of the oxygen and silane moving through the through holes 7125 is in accordance with the following formula (3), wherein $\rho_{SiH4}$ is the density of the silane gas, $_{SiH4}$ is the diffusion flow velocity, and $D_{SiH4-O2}$ is the mutual gas diffusion coefficient. When the characteristic length of the through hole is defined as L, the equation (3) can be approximated to the following equation (4). By comparing both sides of the equation (4), the diffusion flow velocity of silane $u_{SiH4}$ is expressed by $-D_{SiH4-O2}/L$ When the oxygen flow velocity obtained according to the above equations (1) and (2) is defined as u, and the diffusion flow velocity of silane is defined as $-D_{SiH4-O2}/L$, the ratio between absolute values of these flow velocities, i.e., $|-u/(-D_{SiH4-O2}/L)=uL/D_{SiH4-O2}$ is the ratio of the oxygen mass transfer rate to the silane diffusion rate. The ratio $uL/D_{SiH4-O2}$ of 1 or more means that the flow rate through convection is larger than the flow rate through diffusion. Specifically, the ratio $uL/D_{SiH4-O2}$ set at 1 or more means that the diffusion of silane affects less the transfer of the silane.

$$\rho_{SiH4}u_{SiH4} \approx -D_{SiH4-O2}\rho_{SiH4}/L \quad (4)$$

Next, a practical example will be described below. The value calculated according to the equation (4) is 11, on condition that film-formation is performed at a temperature of the partition of 7114 of 300° C., at a diameter of the through hole 7125 in the partition 7114 of 0.5 mm, a length (L) of 3 mm of the portion having a diameter of 0.5 mm with a total of 500 through holes 7125, at a gas flow rate of oxygen gas of 500 sccm, at a pressure of the film forming space 7116 of 100 Pa. In this case, the mass flow of the oxygen affects the transfer of the silane gas more satisfactorily than the diffusion of the silane gas, and the silane gas is diffused less into the plasma generating space 7115.

As thus described, the partition 7114 having a multitude of the through holes 7125 and diffusion holes 7126 with the above characteristics separates and isolates the plasma generating space 7115 and the film forming space 7116 from each other to respectively form closed chambers. The silane directly brought into the film forming space 7116 cannot significantly come in contact with the oxygen plasma. According to the invented system, the silane can be prevented from vigorously reacting with the oxygen plasma as in conventional equivalents.

Figure 38:
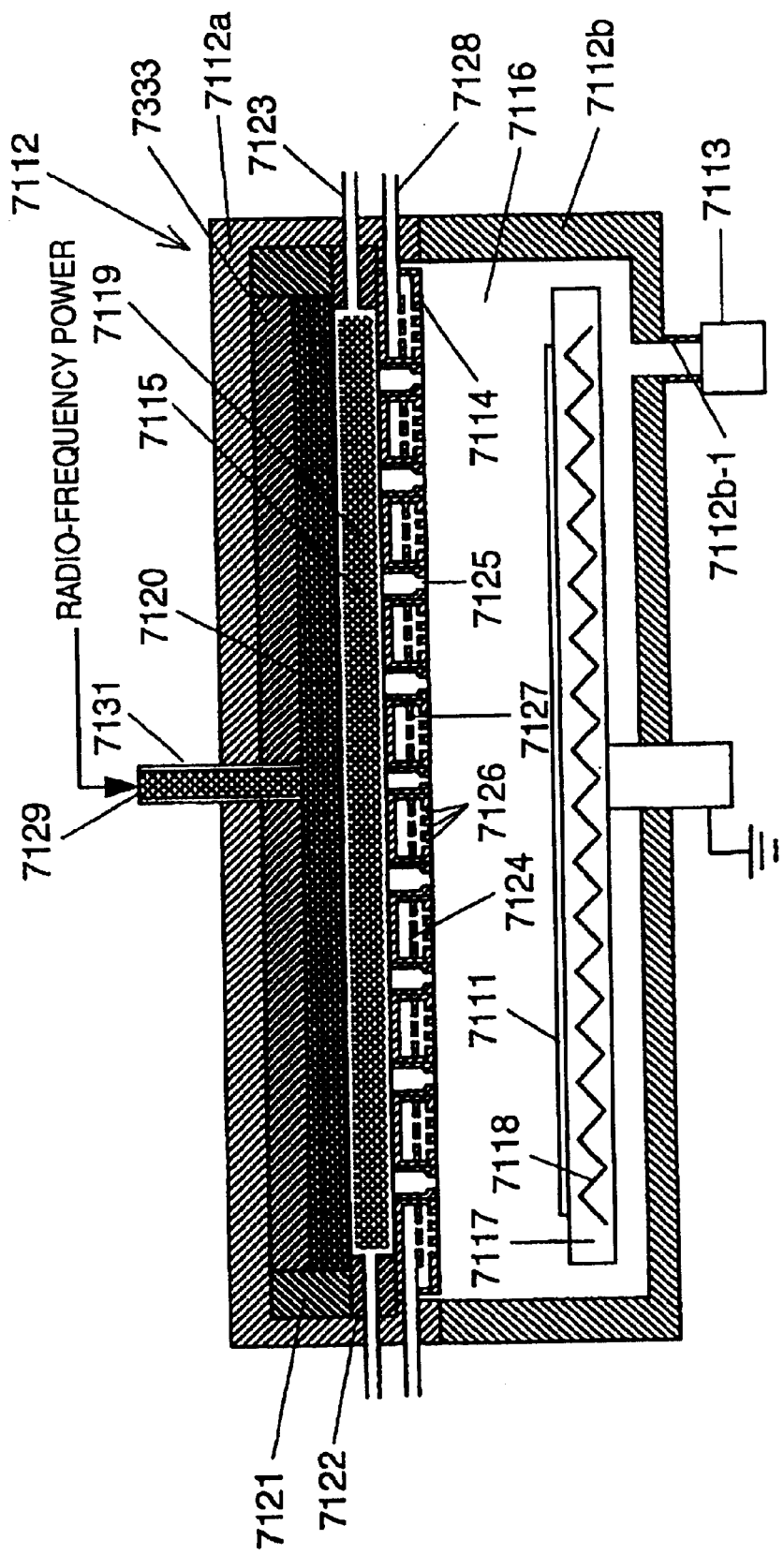
FIG. 38 is a vertical sectional view showing the configuration of another embodiment of the invented system.

Next, a second embodiment of the invented CVD system will now be illustrated with reference to FIG. 38. In FIG. 38, components substantially the same as the components described in FIG. 36 have the same reference numerals, and detailed descriptions of these components are not repeated herein. A characteristic configuration of the second embodiment is that the inside of the ceiling of the upper casing 7112a includes a plate insulating member 7333 and the electrode 7120 is arranged below the plate insulating member 7333. The electrode 7120 is a self plate without the holes 7120a. The electrode 7120 and the partition 7114 constitute the plasma generating space 7115 with a parallel plate electrode configuration. Other configurations are substantially the same as those of the first embodiment. In addition, the operations and advantages of the CVD system according to the second embodiment are the same as in the first embodiment.

Figure 39:
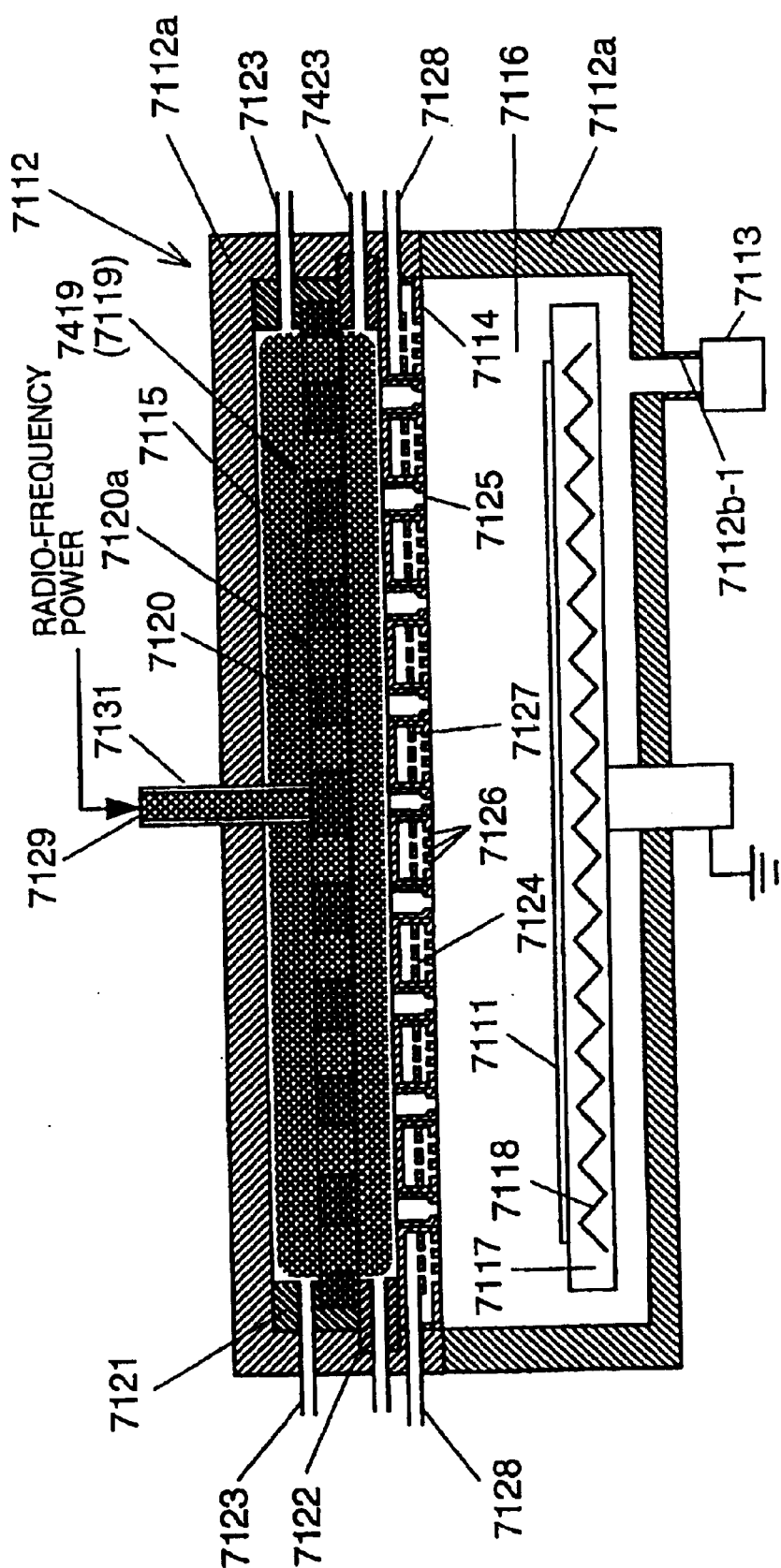
FIG. 39 is a vertical sectional view showing the configuration of a further embodiment of the invented system.

Subsequently, a third embodiment of the invented CVD system will now be illustrated with reference to FIG. 39. In FIG. 39, components substantially the same as the components described in FIG. 36 have the same reference numerals, and detailed descriptions of these components are not repeated herein. The configuration of the third embodiment is characterized in that the annular insulating member 7122 formed inside of the side wall of the upper casing 7112a additionally includes a second gas inlet pipe 7423. The second gas inlet pipe 7423 brings a cleaning gas from the outside into the plasma generating space 7115. The second gas inlet pipe 7423 is connected via a mass flow controller (not shown) for controlling the flow rate to a cleaning gas source (not shown). When a cleaning gas is brought via the second gas inlet pipe 7423 into the plasma generating space 7115 and a radio frequency power is supplied from the radio frequency power source to the electrode 7120, a plasma is generated in the plasma generating space 7115. This plasma serves to form radicals for use in cleaning of the film surface on the substrate 7111. Such cleaning gases include, for example, $NF_3$, $ClF_3$, $C_2F_4$, $C_2F_6$, $H_2$, $O_2$, $N_2$, $F_2$, Ar, and other rare gases and halide gases. Other configurations of this embodiment are the same as those in the first embodiment.

The gas inlet pipe 7123 and the second gas inlet pipe 7423 are controlled to permit the use of either one of these inlet pipes. In the present embodiment, initially the cleaning gas is introduced to clean the film surface on the substrate 7111, and the film forming gas is then introduced to form a gate insulating film on the film surface on the substrate 7111.

Specifically, the substrate 7111 having a laser-annealed film (polysilicon film) on its surface is mounted on the substrate holder 7117, and the cleaning gas is then introduced via the second gas inlet pipe 7423 into the plasma generating space 7115, and a radio frequency power is supplied via the power supply rod 7129 to the electrode 7120. By this procedure, electric discharge is initiated in the plasma generating space 7115 to generate a cleaning gas plasma 7419. As a result, radicals are formed in the plasma and diffuse through the plural through holes 7125 of the partition 7114 into the film forming space 7116. The radicals then clean the surface of the film formed on the substrate 7111. This configuration can remove impurities formed on the film surface of the substrate after laser annealing.

After the substrate cleaning process is completed to satisfy predetermined conditions, the oxygen gas is brought from the gas inlet pipe 7123 into the plasma generating space 7115, and a radio frequency power is supplied via the power supply rod 7129 to the electrode 7120. By this procedure, electric discharge is initiated in the plasma generating space 7115 to yield the oxygen plasma 7119. As a result, radicals are formed in the plasma and diffuse through the plural through holes 7125 of the partition 7114 into the film forming space 7116. Concurrently with the supply of the radicals, the material gas is supplied from the inlet pipe 7128 through the partition 7114 into the film forming space 7116. In the film forming space 7116, the radicals react with the material gas to form a gate insulating film on the film surface on the substrate 7111.

The invented film forming system should be preferably maintained in a vacuum.

Next, a process for the formation of a film using the systems according to embodiments of the invention will be described.

Figure 40:
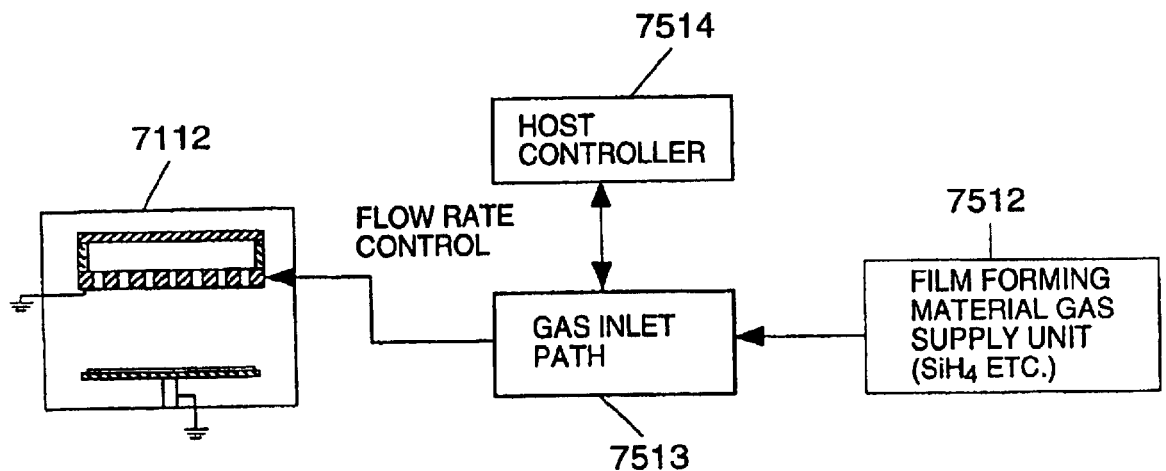
FIG. 40 is a block diagram showing the configuration of the invented silicon oxide thin film forming system.

FIG. 40 is an illustration of the invented film forming system. The numeral 7112 in FIG. 40 is the vacuum casing shown in FIG. 36. The vacuum casing 7112 includes the partition 7114 having a multitude of through holes, the plasma generating space 7115, and the film forming space 7116, and the partition 7114 separates the plasma generating space 7115 from the film forming space 7116.

The overall system in FIG. 40 includes a film forming material gas supply unit 7512. The material gas is supplied from the film forming material gas supply unit 7512 via a gas inlet path 7513 including a mass flow controller (MFC) 7513a into the inner space 7124 in the partition 7114. Such material gases include $SiH_4$ and other silicon hydride compounds ($Si_nH_{2n+2}$, where n is an integer of 1 or more). In the film forming space 7116, the material gas introduced through the inner space 7124 in the partition 7114 reacts with the radicals introduced through the multitude of through holes 7125 in the partition 7114, and the material gas is decomposed to deposit a thin film of silicon oxide on the substrate transferred into the film forming chamber. Thus, a film is formed.

Figure 41:
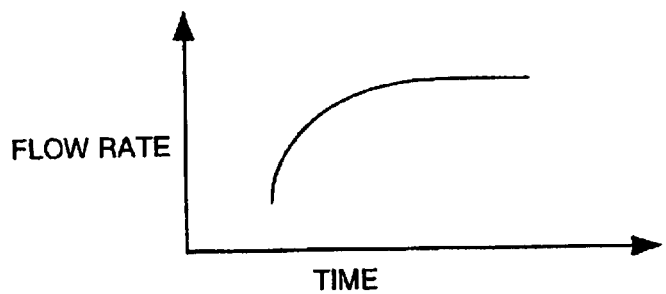
FIG. 41 is a graph showing an illustrative change of material gas supply.

A host controller 7514 functions as a controller of the flow rate of the material gas in an MFC 7513a in the gas inlet path 7513. The controller 7514 can control the flow rate of the material gas in the MFC 7513a to thereby control the supply of the material gas brought into the film forming space 7116 to a predetermined range, as described below. FIG. 41 is a graph showing an illustrative change of the material gas flow rate with the abscissa showing the time (t) and the ordinate showing the flow rate (sccm) of the material gas. In this embodiment, the controller 7514 controls the flow rate of the material gas in the MFC 7513a in such a manner that the flow rate (supply flow rate) of the introduced material gas to the film forming space 7116 is restricted at early stages of electric discharge, i.e., at early stages of film formation, and is then increased. Next, the manner to restrict the supply rate of the material gas will now be described.

Figure 42:
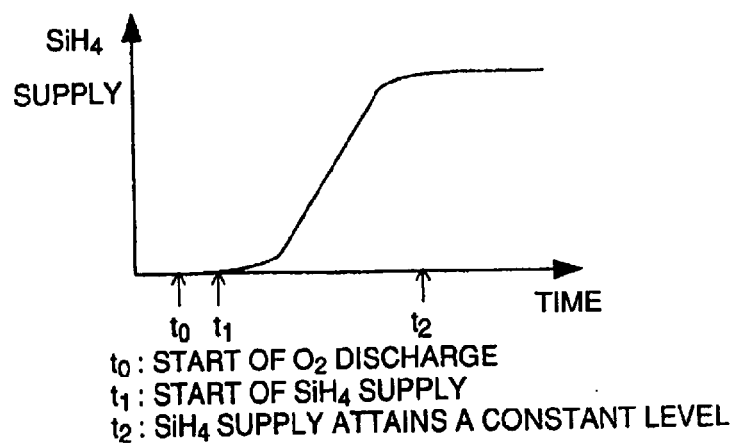
FIG. 42 is a graph showing another illustrative change of material gas supply.

FIG. 42 is a graph showing an illustrative control procedure of the supply flow rate of material gas, $SiH_4$, with the abscissa showing the time and the ordinate showing the supply flow rate. In the time abscissa, times $t_0$, $t_1$, and $t_2$ are set. As the plasma generating gas, for example, oxygen ($O_2$) is employed. The time to is the time when the oxygen gas is supplied into the plasma generating chamber and electric discharge of the oxygen gas is started, i.e., the starting point of film formation. At the time $t_1$, the supply of $SiH_4$ starts. Accordingly, $SiH_4$ is not supplied from the time $t_0$ until the time $t_1$. From the time $t_1$ until the time $t_2$, the supply flow rate of $SiH_4$ gradually increases with time and reaches a constant level at the time $t_2$. From the time $t_2$, the supply rate of $SiH_4$ is maintained at the constant level. By restricting the supply rate of the material gas at early stages of film formation including the initiation of electric discharge (i.e., $t_0$ to $t_1$, and around $t_1$), the formation of a silicon oxide thin film containing excess silicon at early stages of film formation can be avoided. In addition, by gradually increasing the supply rate of the material gas thereafter, the film forming period can be shortened to thereby improve practical utility.

From the time $t_1$ until time $t_2$, the supply rate of the material gas may be controlled to increase according to a step function, a proportional function, a linear function, a quadratic function, an exponential function, and other functions.

In the above embodiments, silane is employed as an example of the material gas. However, the material gas is not limited to silane, and TEOS and other gaseous materials can be also employed. In addition, the invention can be applied to film formation of not only silicon oxide films but also silicon nitride films. The principle of the invention can be applied to every treatment where the material gas comes in contact with a plasma to form particles and the introduction of ions to the substrate adversely affects the process, and can be applied to film formation, surface treatments, isotropic etching, and other treatments. The partition indicated in the embodiments has a dual structure, but it may have a multilayer structure.

According to the invention as thus described, for example, when a silicon oxide film is formed on a large substrate from silane or another material gas, a vacuum casing includes a partition having plural through holes or diffusion holes that meet predetermined conditions. The partition separates the inside of the vacuum casing into a plasma generating space and a film forming space. An active species is formed in the plasma generating space and is brought through the through holes of the partition into the film forming space. Separately, a material gas is brought through an inner space and diffusion holes of the partition and is directly introduced into the film forming space without coming in contact with a plasma. This configuration can inhibit a vigorous chemical reaction between the material gas and the plasma to thereby inhibit the formation of particles and introduction of ions into the substrate.

In addition, the invented system can evenly bring the material gas, and can evenly supply the oxygen gas radicals through the plural through holes formed in the partition. This configuration can yield satisfactory distributions of the radicals and silane or another material in the vicinity of the surface of the substrate to thereby effectively form a film on a large substrate.

Figure 43:
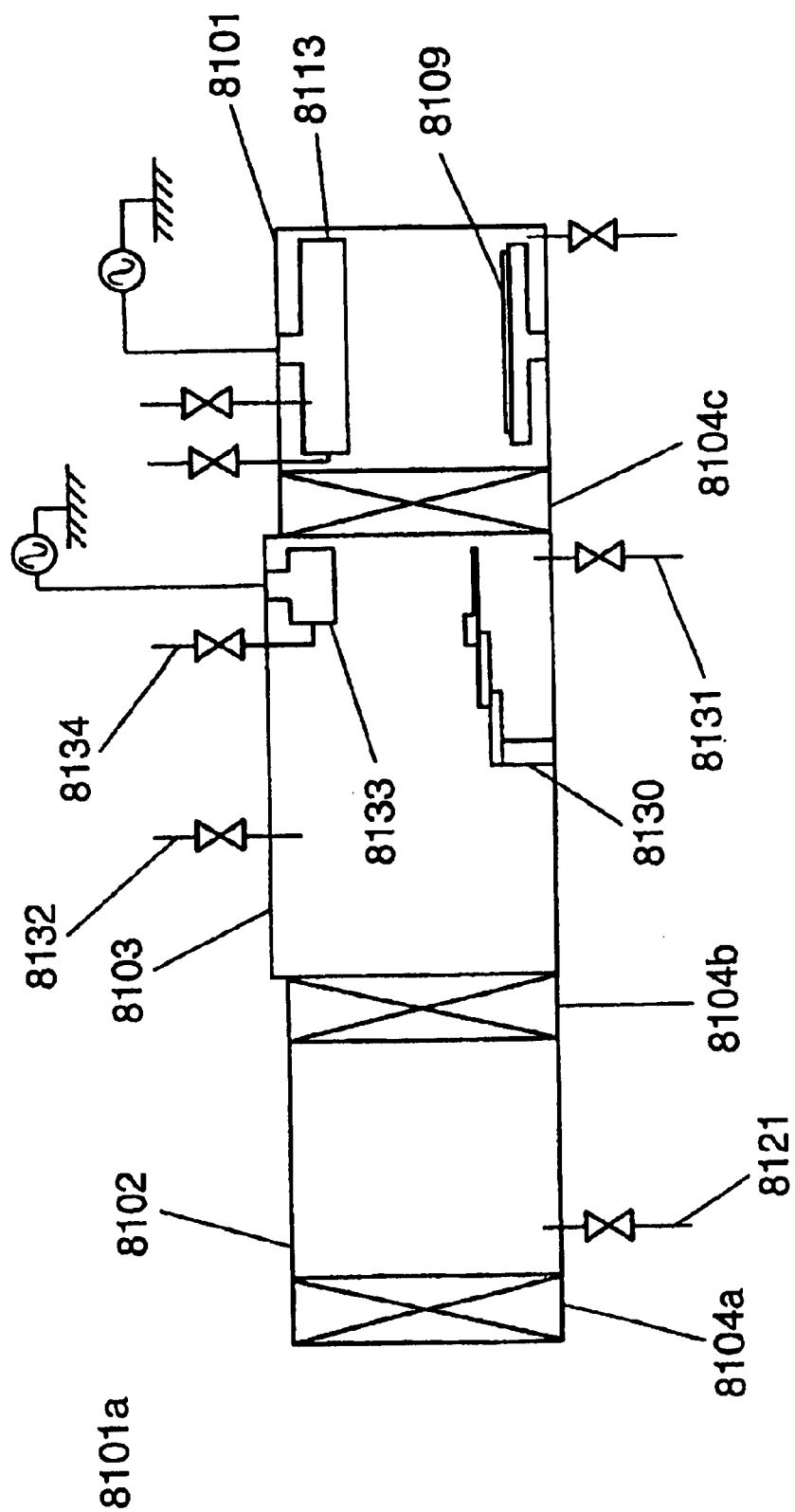
FIG. 43 is a schematic side sectional view of an embodiment of the invented thin film forming system.

FIG. 43 is a side sectional view of a clustered tool type system. This system includes a film forming chamber 8101, a load-lock chamber 8102, and a transfer chamber 8103. The film forming chamber 8101 serves to form a silicon oxide film as a gate insulating film on a substrate 8109. The transfer chamber 8103 includes a moving robot 8130 as a moving means. The film forming chamber 8101 includes a CVD unit 8113 inside thereof. In the CVD unit 8113, a plasma is generated, and active species taken out from the plasma serve to form a silicon oxide film. The configuration of transfer chamber 8103 characterizes the system according to the present embodiment. As shown in FIG. 43, the transfer chamber 8103 has a gas inlet system (hereinafter referred to as "pressure regulating gas inlet system") 8132. The pressure regulating gas inlet system 8132 brings a gas not adversely affecting the film formation into the inside the system to regulate the inside pressure. In this embodiment, the pressure regulating gas inlet system 8132 introduces hydrogen gas. The pressure regulating gas inlet system 8132 comprises a flow regulator and a filter not shown and can introduce a highly purified pressure regulating gas at a predetermined flow rate.

The term "gas not adversely affecting the film formation" means and includes gases which do not adversely affect the quality of the resulting thin film. Such gases include hydrogen and other gases that do not directly affect the film formation, and gases that improve the quality of the resulting film.

The configuration where the transfer chamber 8103 includes the pressure regulating gas inlet system 8132 is based on a characteristic technical concept of an evacuating unit 8131 of the transfer chamber 8103. Specifically, in the system according to the present embodiment, the pressure inside the transfer chamber 8103 is maintained at a degree of vacuum somewhat lower than that inside the film forming chamber 8101.

The evacuating unit 8131 of the transfer chamber 8103 has only to evacuate the inside of the transfer chamber to a relatively high pressure as above, and can be configured at low costs. As the evacuating unit 8131 of the transfer chamber 8103, for example, a combination of a dry pump and a mechanical booster pump can be employed. Both components are available at low costs.

As the evacuating unit 8131 of the transfer chamber according to conventional equivalents, a system having an exhaust speed greater than that in the film forming chamber 8101 is generally employed, and the inside of the transfer chamber 8103 is evacuated to a pressure lower than that in the film forming chamber. However, this configuration will result in an expensive evacuating unit 8131. For example, to attain the pressure inside the film forming chamber 8101 as stated above, a turbo-molecular pump or other expensive vacuum pumps are required. Specifically, if the target pressure is 1 Pa or higher, the system can employ a cheap dry pump and a mechanical booster pump in combination, but if the target pressure is lower than 1 Pa, a turbo-molecular pump or other expensive pumps are required. Such pumps are several times more expensive than the dry pump and the mechanical booster pump.

Such a relatively high target pressure inside the transfer chamber 8103 can shorten the evacuation operation to thereby increase the production efficiency of the overall system.

The system according to this embodiment is also greatly characterized in that the transfer chamber 8103 includes a modifier supply unit 8133. The modifier supply unit 8133 supplies a chemical species (hereinafter referred to as "modifier") having a modifying activity to the surface of the substrate 8109. This feature will now be described in detail below.

Figure 44:
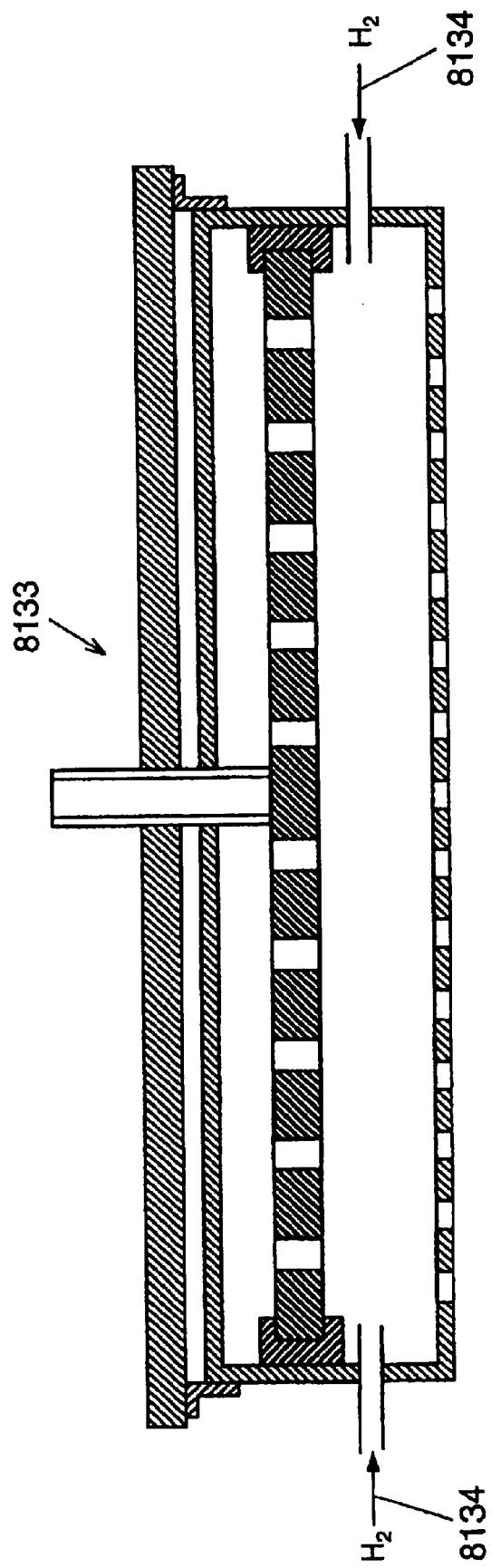
FIG. 44 is a schematic side sectional view of the configuration of the modifier supply unit 8133 arranged in the transfer chamber of the system in FIG. 43.

The modifier supply unit 8133 serves to supply energy to a gas introduced by a modifying gas inlet system 8134 to form a plasma. The configuration of the modifier supply unit 8133 will be illustrated with reference to FIG. 44. FIG. 44 is a schematic side sectional view of the configuration of the modifier supply unit 8133 in the transfer chamber 8103 of the system shown in FIG. 43.

Figure 36:
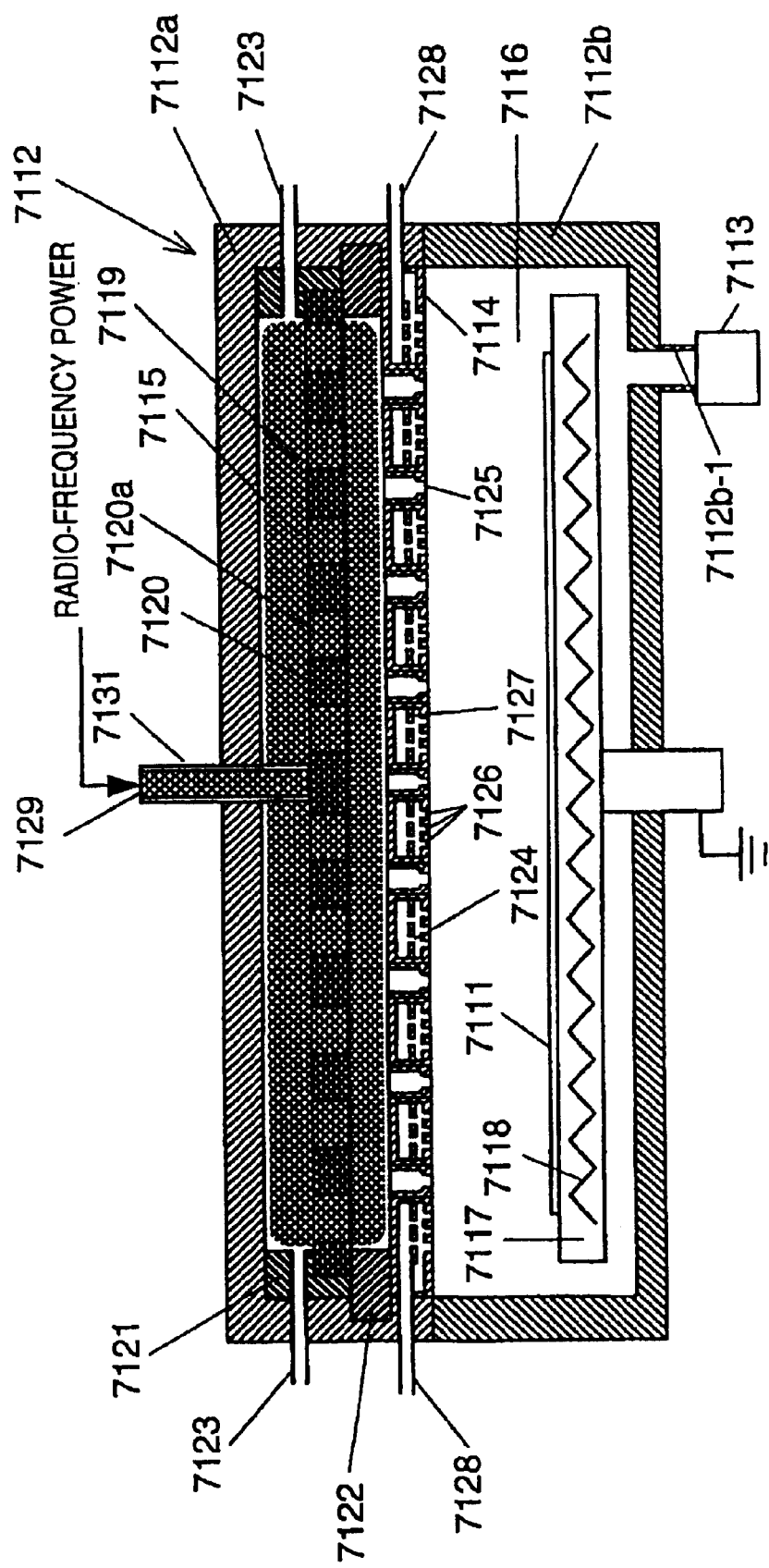
FIG. 36 is a vertical sectional view showing the configuration of an embodiment of the invented system.

The modifier supply unit 8133 has substantially the same configuration as the system shown in FIG. 36. However, this unit has no material gas inlet system, and the partition 7114 is a plate having plural holes. As shown in FIG. 43, the modifier supply unit 8133 is placed in the transfer chamber 8103 in the vicinity of a gate valve 8104c at the boundary between the film forming chamber 8101 and the transfer chamber 8103, and is located above a transfer line of the substrate 8109.

The modifying gas inlet system 8134 supplies a hydrogen gas to the plasma generating space, as in the pressure regulating gas inlet system 8132. The piping of the pressure regulating gas inlet system 8132 may be caused to branch to the modifier supply unit 8133. By this configuration, the pressure regulating gas inlet system 8132 also serves as the modifying gas inlet system 8134.

When a radio frequency power source goes into action while the modifying gas inlet system 8134 brings hydrogen gas into the plasma generating space, a plasma is generated and active hydrogen species flow out downward. The active hydrogen species act as a modifier in this embodiment and are supplied to the surface of the substrate to modify the surface. For example, when the surface of the substrate 8109 is oxidized, the oxidized surface is reduced by the modifier. If the surface has a bondable end, the active hydrogen species terminates the end to thereby chemically stabilize the surface. During the modification procedure, the substrate 8109 may be stopped on the transfer line or may be continuously transferred for a higher efficiency.

A second embodiment of this type of system will be described below. The system according to the second embodiment is characterized in that a laser annealing process and a gate insulating film forming process can be continuously performed in vacuo. These processes are required for the production of a TFT-LCD using a polysilicon film as a channel layer. In the system according to the second embodiment, the transfer chamber 8103 also includes the pressure regulating gas inlet system 8132, and the inside of the transfer chamber 8103 is held at a pressure that is a vacuum pressure but is higher than 1 Pa and lower than that in the film forming chamber 8101. The pressure regulating gas inlet system 8132 brings a hydrogen gas into the transfer chamber 8103 as mentioned above.

According to the second embodiment, the surface of the substrate 8109 is modified by supplying a modifier after the annealing process. This configuration plays a very important role to improve the operating characteristics of the resulting TFT. A polysilicon film formed by crystallizing an amorphous silicon film in the annealing process has unbonded ends of silicon (dangling bonds) on its surface. If the atmosphere contains oxygen or other gases reactive with silicon during movement of the substrate 8109 from an annealing chamber (not shown) to the film forming chamber 8101, such a reactive gas readily reacts with the dangling bonds of silicon to form a contaminated region on the surface of the polysilicon film. If such a contaminated region is formed at an interface between the polysilicon film and the gate insulating film, the resulting TFT cannot have a stoichiometric composition. This is liable to cause defective levels and other problems that deteriorate the operating characteristics of the TFT.

The system according to the present embodiment can avoid the above problems, by modifying the surface of silicon with active hydrogen species after the annealing process to thereby terminate the dangling bonds of silicon with hydrogen. In addition, the transfer chamber 8103 is held in vacuo at a relatively high pressure but is purged with hydrogen gas. This configuration can reduce reactions of dangling bonds, if any, with contaminates and increases the tendency of the dangling bonds to react with hydrogen to thereby terminate. By these operations and advantages, the system according to the present embodiment can markedly satisfactorily improve the interface between a polysilicon film and a gate insulating film. This point constitutes a very important technical point in the manufacture of polysilicon TFTs.

The supply of a modifier by the modifier supply unit plays an important role in modification after the annealing process. As described above, the surface of the substrate 8109 may be modified by ion injection other than the use of the active species. However, ion injection for modification after the annealing process causes problems. Specifically, the polysilicon film crystallized in the annealing process has a relatively weak crystal structure. Accordingly, when ions are injected, such weak bonds are readily broken to cause, for example, a roughened surface of the polysilicon film. As a result, the interfacial characteristics may be deteriorated or channel resistance may increase.

According to the present embodiment, the CVD unit 8113 is employed to generate a plasma in a region at a distance from the surface of the substrate and to supply the active species. Accordingly, substantially no ions are injected into the surface of the substrate and the system does not invite the above problems.

Figure 45:
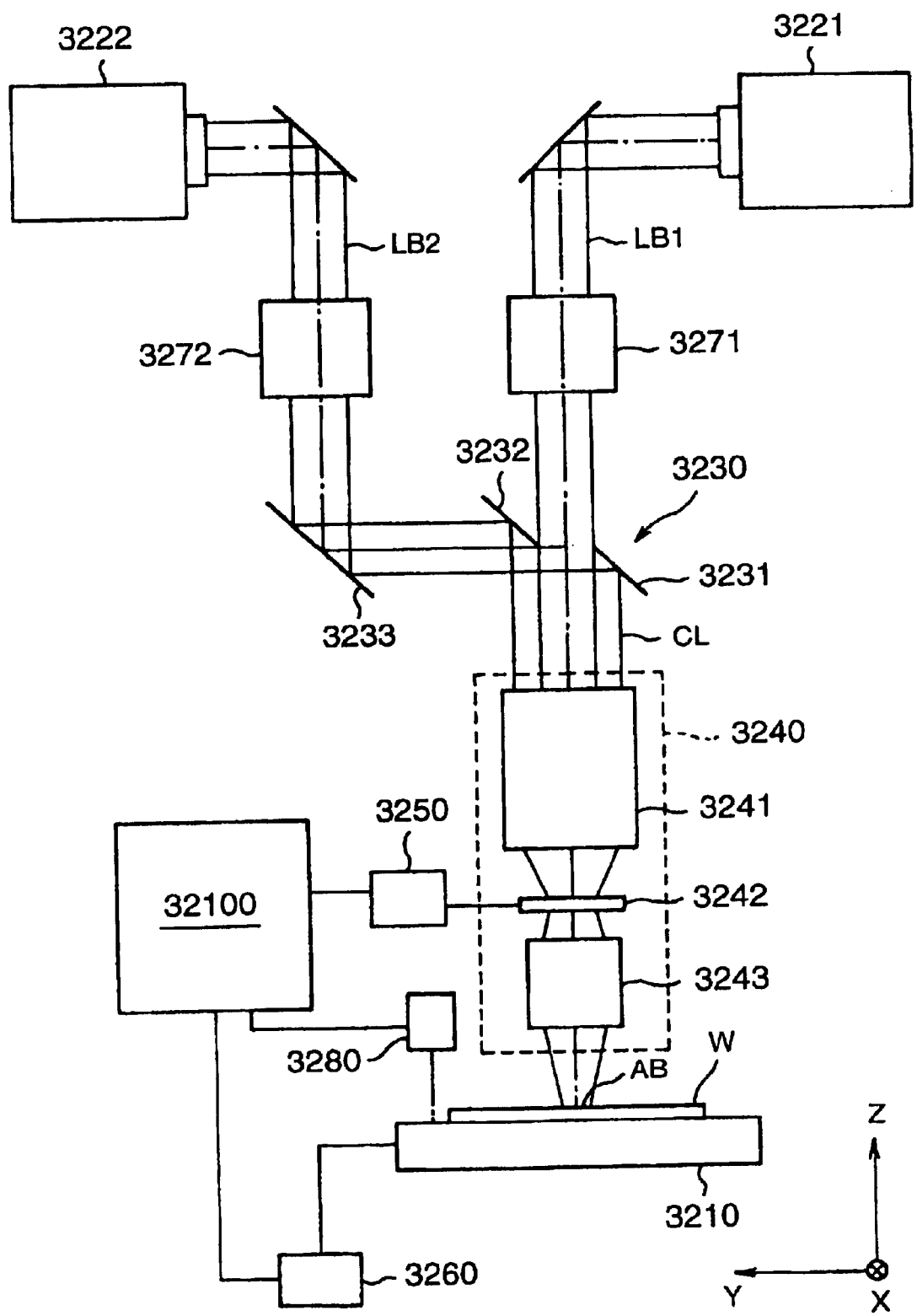
FIG. 45 is a diagram of an embodiment of the composite optical system of plural beams for use in the invention.

FIG. 45 is a diagram illustrating the configuration of the invented laser annealer.

The laser annealer includes a stage 3210, a pair of laser sources 3221 and 3222, a composing optical system 3230, an irradiation optical system 3240, a mask driving unit 3250, a stage driving unit 3260, and a master controller 32100. The stage 3210 holds or supports a work W and is three-dimensionally smoothly movable. The work W is a glass plate having an amorphous Si and another semiconductor thin film formed on its surface. The laser sources 3221 and 3222 respectively produce a pair of laser beams LB1 and LB2 having different characteristics. The composing optical system 3230 composes the laser beams LB1 and LB2 to yield a composite light CL. The irradiation optical system 3240 converts the composite light CL into a linear beam AB and launches the linear beam AB onto the work W at a predetermined illumination. The mask driving unit 3250 moves a mask 3242 formed in the irradiation optical system 3240 to scan the work W with the projected linear beam AB. The stage driving unit 3260 moves the stage 3210 supporting the work W to a necessary degree relative to, for example, the irradiation optical system 3240. The master controller 32100 generally controls the operations of individual units of the overall laser annealer.

Both of the pair of laser sources 3221 and 3222 are excimer lasers or other pulsed laser sources for heating the semiconductor thin film on the work W. The laser sources 3221 and 3222 individually and independently produce a pair of laser beams LB1 and LB2 having different characteristics such as light emitting periods, peak intensities or wavelengths.

The composing optical system 3230 serves to spatially combine the pair of laser beams LB1 and LB2 from the laser sources 3221 and 3222 to form the composite light CL, and includes a pair of knife-edge mirrors 3231 and 3232 arranged in parallel with each other. Between the composing optical system 3230 and the both laser sources 3221 and 3222, a divergent optical system 3271 and a telescopic optical system 3272 are respectively arranged as regulators. The divergent optical system 3271 serves as a regulating optical system to finely adjust the imaging position in the optical axis direction (beam forming position) of the first beam LB1 from the laser source 3221. The image is formed by a homogenizer 3241 in the irradiation optical system 3240. The telescopic optical system 3272 serves as an afocal optical system to adjust the beam size of the second beam LB2 from the laser source 3222 to thereby make the beam size identical to that of the first beam LB1 entered into the composing optical system 3230.

The irradiation optical system 3240 includes a homogenizer 3241, a mask 3242, and a projection lens 3243. The homogenizer 3241 once divides the composite light CL from the composing optical system 3230 into plural divided beams and converts the divided beams into rectangular beams, and homogeneously superimposes and launches the beams onto a predetermined plane. The mask 3242 has a slit transmitting pattern and is arranged on the predetermined plane to shield the composite light CL. The projection lens 3243 reduces and projects the transmitted pattern formed on the mask 3242 onto the work W as a linear beam AB.

The stage driving unit 3260 drives the stage 3210 and aligns a specific region on the work W relative to the irradiation optical system 3240. After the mask driving unit 3250 drives the mask to scan a predetermined region on the work W with the linear beam AB to laser-anneal the predetermined region, the stage driving unit 3260 also aligns the mask 3242 to stepwise move the mask to a region adjacent to the predetermined region. A position detector 3280 continuously monitors the driving of the stage 3210 by the stage driving unit 3260.

The operations of the system shown in FIG. 45 will now be illustrated in detail. Initially, the work W is moved to and mounted on the stage 3210 of the laser annealer. The work W on the stage 3210 is then aligned relative to the irradiation optical system 3240. While moving the mask 3242 of the irradiation optical system 3240, the composite light CL obtained from the pair of laser sources 3221 and 3222 is launched as a linear beam AB onto a predetermined region on the work W. On the work W, a thin film of an amorphous semiconductor such as an amorphous Si is formed. The irradiation and scanning of the thin film with the linear beam AB allows the predetermined region of the semiconductor to anneal and recrystallize to thereby yield a semiconductor thin film having satisfactory electric characteristics. The laser annealing procedure is repeated on plural predetermined regions on the work W, and the semiconductor thin film is annealed in the plural predetermined regions.

In the above system, the composing optical system 3230 spatially composes the pair of laser beams LB1 and LB2 from the pair of laser sources 3221 and 3222 to form the composite light CL. Accordingly, the pair of laser beams LB1 and LB2 can be composed with minimized loss, and the composite light CL as a uniform rectangular beam relative to the pair of laser beams LB1 and LB2 can be formed on predetermined plane of mask 3242, by action of the homogenizer 3241. In addition, the linear beam AB is obtained by efficiently composing the laser beams LB1 and LB2 and can perform a variety of laser annealing procedures.

Figure 46:
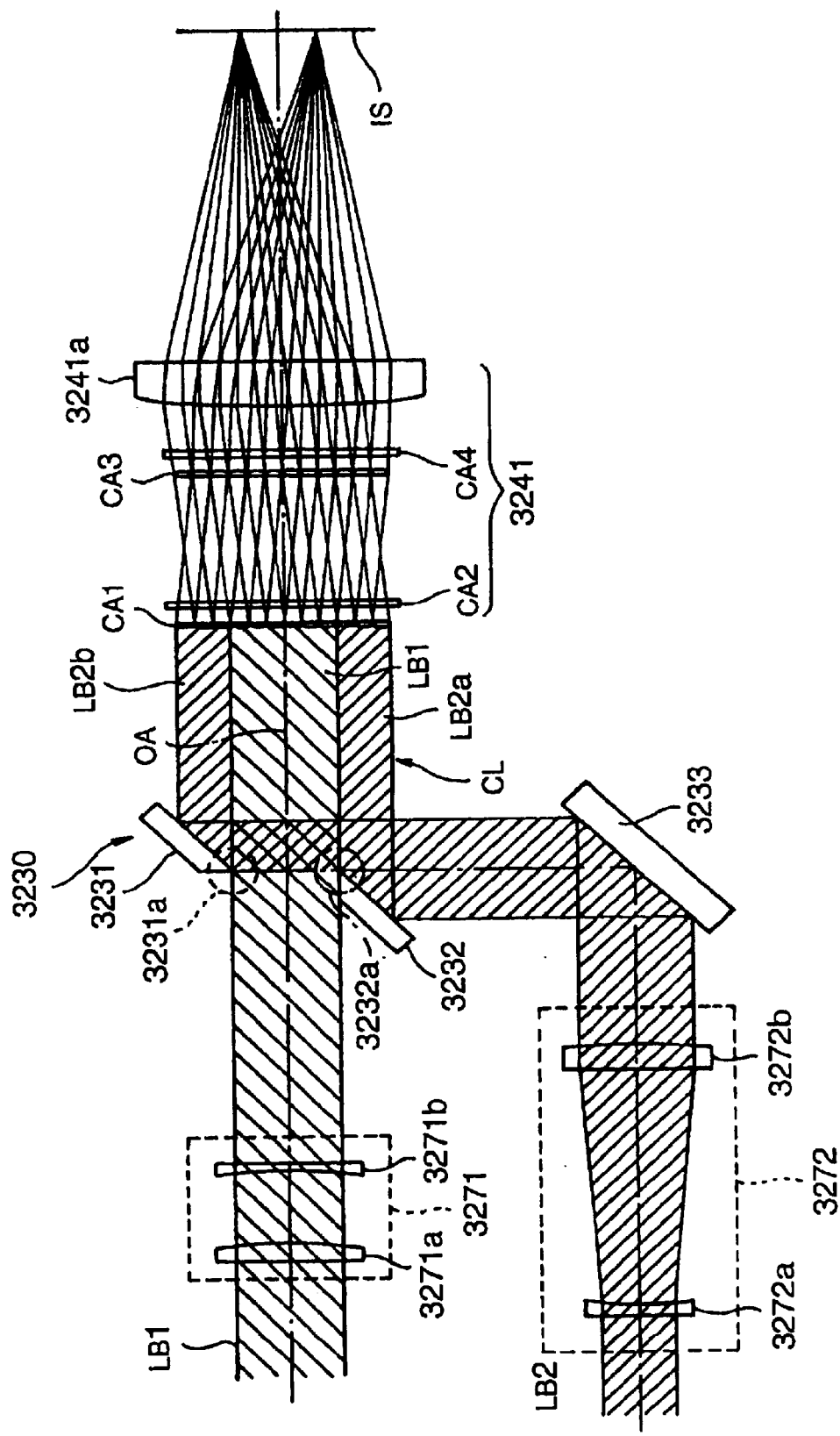
FIG. 46 is a diagram of an embodiment of a composite optical system of plural beams for use in the invention.

FIG. 46 is a diagram illustrating the configuration of the composing optical system 3230 and its surroundings. As is described above, the composing optical system 3230 includes the pair of knife-edge mirrors 3231 and 3232, allows the first beam LB1 to pass through between a pair of knife edges 3231*a* and 3232*a*, and separates the second beam LB2 by the aid of the pair of knife edges 3231*a* and 3232*a*. The divergent optical system 3271 finely adjusts the image-forming position of the first beam LB1 formed by the homogenizer 3241 and constitutes an afocal system including a convex lens 3271*a* and a concave lens 3271*b* in combination. The telescopic optical system 3272 serves to adjust the beam size of the second beam LB2 to identical to that of the first beam LB1, and constitutes an afocal system including a concave lens 3272*a* and a convex lens 3272*b* in combination. Between the telescopic optical system 3272 and the composing optical system 3230, a turning mirror 3233 is arranged to guide the second beam LB2. Separately, the composite light CL obtained by composing the laser beams LB1 and LB2 enters the homogenizer 3241. The homogenizer 3241 includes first to fourth cylindrical lens arrays CA1 to CA4, and a convex condenser lens 3241*a*. The first and third cylindrical lens arrays CA1 and CA3 have a curvature in a cross section in parallel with the paper plane, and the second and fourth cylindrical lens arrays CA2 and CA4 have a curvature in a cross section perpendicular to the paper plane.

The outline of the operations will now be described below. The first laser beam LB1 passes through between the knife edges 3231*a* and 3232*a*, i.e., a central pupil region of the homogenizer 3241 including the optical axis OA, and the second laser beam LB2 is divided by the knife-edge mirrors 3231 and 3232 into two beams and the divided second beams pass through the each edge of the first beam LB1, i.e., a pair of peripheral pupil regions of the homogenizer 3241. The beams LB1 and LB2 thus respectively enter the homogenizer 3241. The homogenizer 3241 has an entrance pupil size twice that of the beam size to allow the composite light CL to enter the homogenizer. The condenser lens 3241*a* and other lens systems have been corrected for aberration according to the entrance pupil.

The composite light CL entered into the homogenizer 3241 is divided into a number equal to the number of the segments constituting the cylindrical lenses by action of the first to fourth cylindrical lens arrays CA1 to CA4 to form divided secondary light sources. The light beams are launched from the divided secondary light sources into the condenser lens 3241*a*, and are superimposed on an irradiated surface IS at the back focus of the condenser lens 3241*a* to yield uniform rectangular beams.

The divergent optical system 3271 and the telescopic optical system 3272 serve to prevent differences in focal position, beam size, and uniformity of the rectangular beams formed by the homogenizer 3241. These differences are caused by beam characteristics and differences between the first and second laser beams LB1 and LB2.

The former divergent optical system 3271 slightly changes the numerical aperture (NA) of the first beam LB1 launched into the homogenizer 3241 to adjust the best focal position of the homogenizer 3241 and the beam size. The latter telescopic optical system 3272 serves to adjust the beam size of the second beam LB2 to be identical to that of the first beam LB1 launched into the homogenizer 3241. By these configurations, the laser beams LB1 and LB2 are respectively divided into the same number as one another by the cylindrical lens arrays CA1 to CA4 to yield an identical uniformity to each other.

The operations will be illustrated in further detail below. The first beam LB1 enters through a beam delivery (e.g. a turning mirror) not shown into the divergent optical system 3271 for the first beam. The divergent optical system 3271 is a substantially 1:1 afocal system and includes two lenses 3271*a* and 3271*b*. By changing the distance between the two lenses 3271*a* and 3271*b*, the divergent optical system 3271 can slightly adjust and change the NA of the outgoing first beam LB1 from the divergent optical system 3271 without significantly changing the beam size of the first beam LB1. In a practical example, the variable adjusting range of the exit NA (a beam divergence angle of the first beam LB1) by the divergent optical system 3271 is set to several milliradians. In this connection, the two lenses 3271*a* and 3271*b* constitute a two-element system of convex and concave lenses, and respectively have little power. Even if the distance between the two lenses 3271*a* and 3271*b* is changed, the aberration does not significantly change.

The exit first beam LB1 from the divergent optical system 3271 only passes through between the two knife-edge mirrors 3231 and 3232, i.e., the central region of the optical axis of the homogenizer 3241. The first beam LB1 passed through between the knife-edge mirrors 3231 and 3232 enters the central portion (cylindrical lenses assigned to the first beam LB1) of the cylindrical lens array CA1 of the homogenizer 3241, and is divided into a number (six in FIG. 46) equal to the number of the cylindrical lenses. The individual divided beams are superimposed by the condenser lens 3241a to form a uniform beam on the irradiated surface IS.

The second beam LB2 is launched through a beam delivery not shown into the telescopic optical system 3272 for the second beam. The second beam LB2 launched into the telescopic optical system 3272 is magnified or reduced in the optical system to have the identical beam size with that of the first beam LB1, and comes out of this optical system toward the composing optical system 3230. The second beam LB2 is divided by the knife-edge mirrors 3231 and 3232 in the composing optical system 3230 into two beam portions LB2a and LB2b. The beam portions LB2a and LB2b respectively pass through each side of the first beam LB1 toward the homogenizer 3241. Both beam portions LB2a and LB2b enter the outer periphery of the optical axis of the homogenizer 3241, i.e., both edges of the cylindrical lens array CA1 (cylindrical lenses assigned to the second beam LB2) of the homogenizer 3241. The beam portions are then divided into a number equal to the number of cylindrical lenses (in FIG. 46, a total of six including upper three and lower three). The individual divided beams are superimposed by the condenser lens 3241a to form a uniform beam on the irradiated surface IS.

In the above description, both the first and second laser beams LB1 and LB2 are to "form a uniform beam on the irradiated surface IS". Actually, the best focal positions of both beams may differ from each other according to divergence angles of exit beams from the light source and other characteristics. When the best focal positions are different, the beam sizes are often different. The differences in characteristics of the first and second beams LB1 and LB2 must be neutralized. To this end, the best focal position of the second beam LB2 is determined as a true irradiated surface IS (reference surface) and the best focal position of the first beam LB1 is made in agreement with the true irradiated surface IS. Specifically, the exit NA of the first beam LB1, i.e., the incident NA viewed from the homogenizer 3241 is changed by the divergent optical system 3271. According to the change in the incident NA viewed from the homogenizer 3241, the best focal position of the first beam LB1 after passing through the homogenizer 3241 is changed. This configuration can finely adjust the best focal position of the first beam LB1 to agree with that of the second beam LB2. In this connection, the relationship between the exit NA and the shift of the best focal position varies according to the lens configuration of the homogenizer 3241, and detailed descriptions of these fine adjustments are omitted herein.

Figure 47:
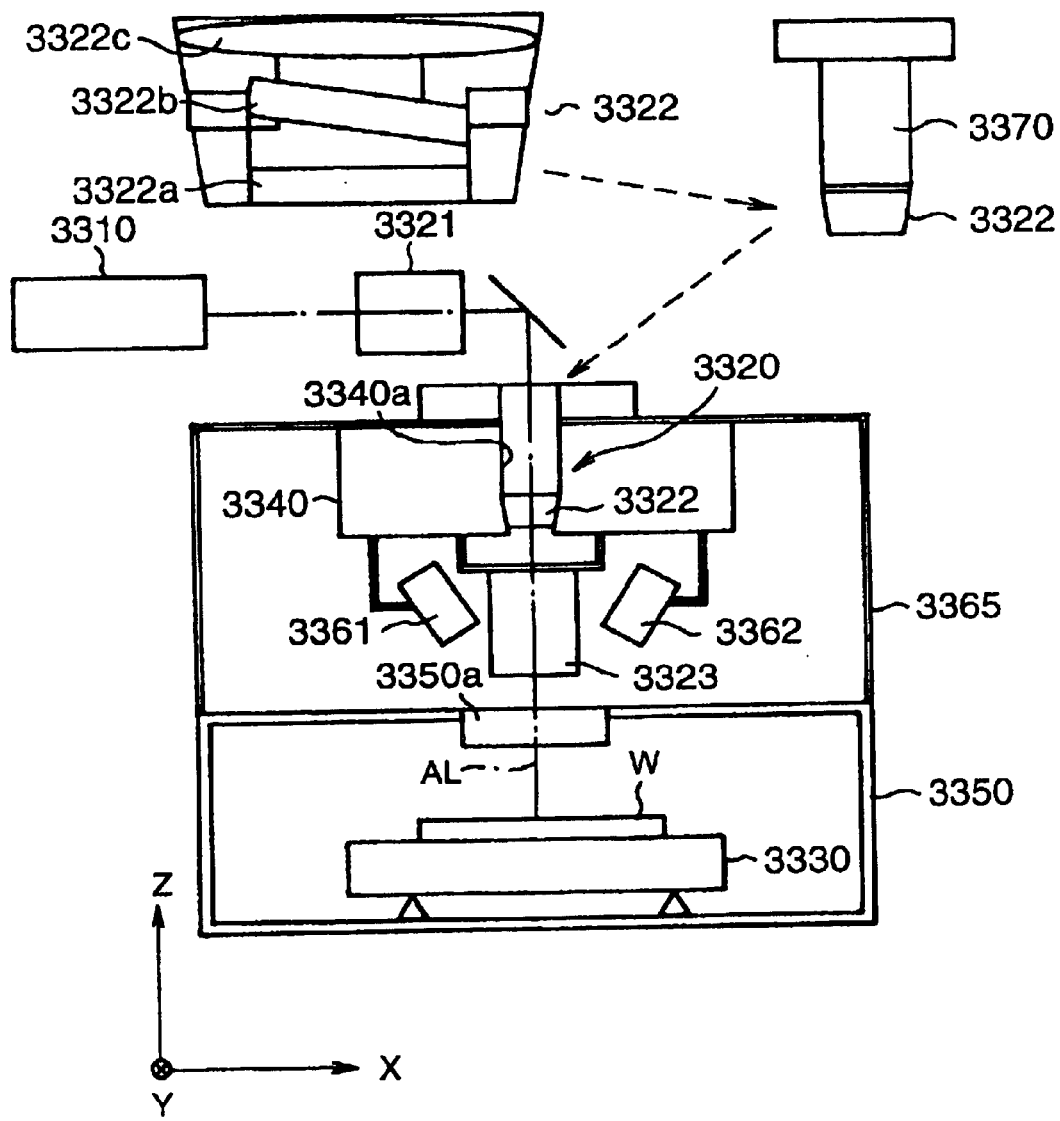
FIG. 47 is a diagram showing an embodiment of a mask stage mechanism for use in the invention.

FIG. 47 is a schematic diagram illustrating the configuration of a laser annealer as an embodiment of the invented laser processing system.

This laser annealer serves to treat a work W with heat. The work W includes an amorphous Si or other semiconductor thin film on a glass substrate. The laser annealer includes a laser source 3310, an irradiation optical system 3320, and a process stage unit 3330. The laser source 3310 produces a laser light AL such as excimer laser for heating the semiconductor thin film. The irradiation optical system 3320 converts the laser light AL into a line form (a fine rectangular form) and launches the light onto the work W at a predetermined illumination. The process stage unit 3330 supports the work W and allows the work W to smoothly move in the X-Y plane in a translational manner and to rotate around the Z axis.

The irradiation optical system 3320 comprises a homogenizer 3321, a mask assembly 3322, and a projection lens 3323. The homogenizer 3321 ensures the incident laser beam AL to have a uniform distribution. The mask assembly 3322 has a mask on which a slit is formed, and the slit throttles the laser light passed through the homogenizer 3321 into a fine rectangular beam. The projection lens 3323 reduces and projects the slit image of the mask onto the work W. Of these components, the mask assembly 3322 is exchangeably supported on a mask stage unit 3340. The mask stage unit 3340 drives the mask assembly 3322, and the mask assembly 3322 is smoothly movable in the X-Y plane and is rotatable around the Z axis.

The process stage unit 3330 is housed in a process chamber 3350, supports the work W in the process chamber 3350 and allows the work W to appropriately move relative to the irradiation optical system 3320. The laser light AL is applied from the irradiation optical system 3320 via a process window 3350a onto the work W, while the work W is supported in an appropriate position in the process chamber 3350.

The system includes, on each side of the projection lens 3323, a position detector or the like. The position detector includes a projecting unit 3361 and a light-receiving unit 3362. The projecting unit 3361 launches a detective light via the process window 3350a into the surface of the work W, and the light receiving unit 3362 detects a reflected light from the surface of the work W. Thus, the work W on the process stage unit 3330 can be precisely aligned relative to the irradiation optical system 3320.

In this configuration, the mask stage unit 3340 and the projection lens 3323 are suspended by and fixed to a frame 3365 extending from the process chamber 3350. The homogenizer 3321 is indirectly fixed to the frame 3365, but this configuration is not shown in the figure.

The mask assembly 3322 supported by the mask stage unit 3340 is suspended at the lower end of a cylindrical mounting jig 3370, is inserted into the bottom of an insertion port 3340a formed in the mask stage unit 3340, and is fixed thereto. The mask assembly 3322 includes a mask 3322a, a reflecting member 3322b, and a field lens 3322c, and integrally holds the mask 3322a, the reflecting member 3322b, and the field lens 3322c. The mask 3322a has a slit, and the reflecting member 3322b is arranged near the mask 3322a at an angle relative to the mask 3322a, and inhibits other optical elements from damage due to reflected light from the mask 3322a. The field lens 3322c adjusts the divergence angle of the laser light AL launched into the mask 3322a.

Figure 48:
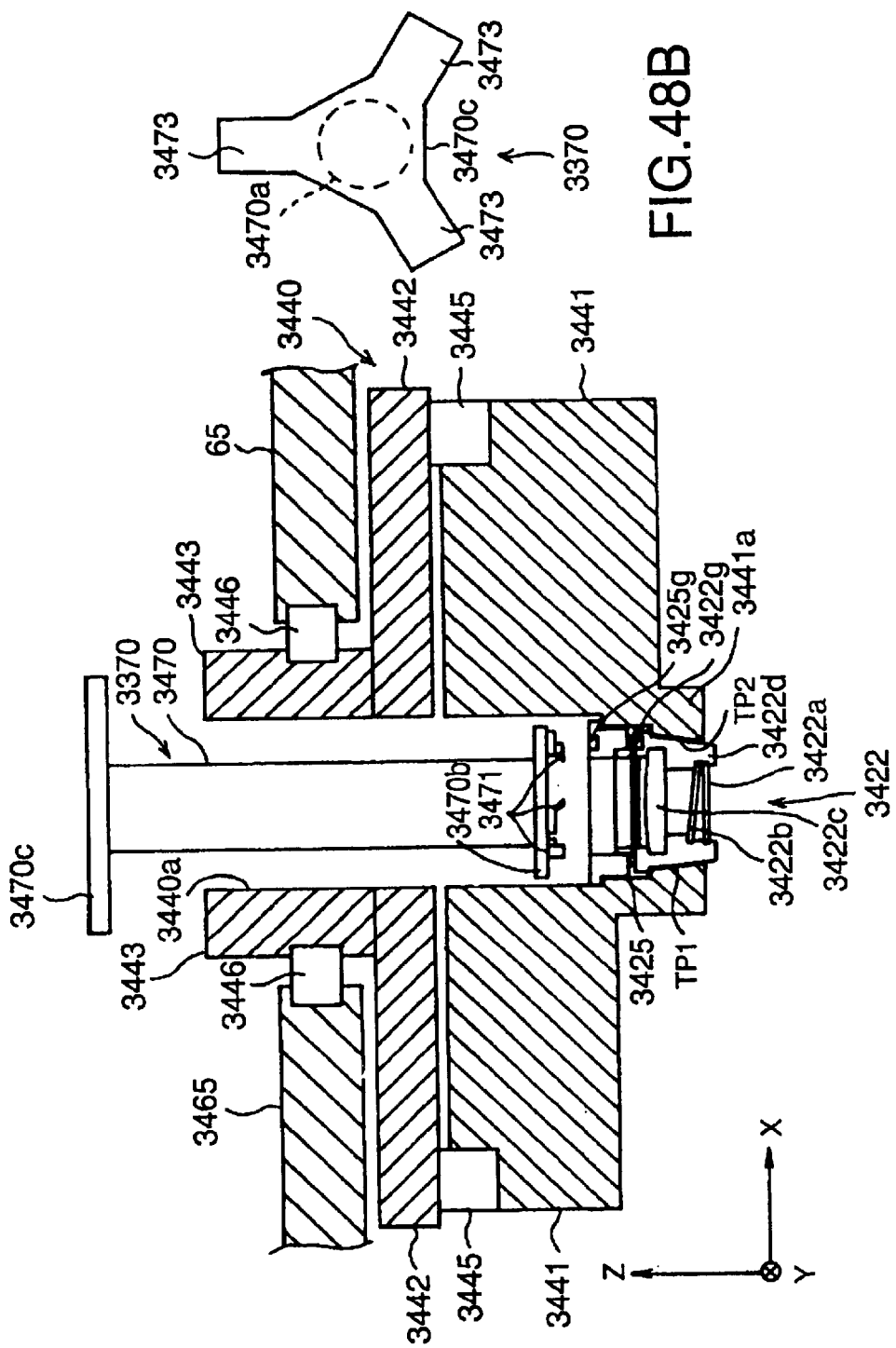
FIGS. 48A and 48B are diagrams showing an embodiment of a mask stage mechanism for use in the invention.

FIGS. 48A and 48B are diagrams showing the configuration of the mask stage unit 3340 and the way to support the mask assembly 3322. FIG. 48A is a side sectional view of the mask stage unit 3340 and surrounding components, and FIG. 48B is a top view of the mounting jig 3370.

The mask stage unit 3340 includes an X axis stage 3441, a Y axis stage 3442, and a θ axis stage 3443. The X axis stage 3441 allows the mask assembly 3322 to move in the X axis direction in a translational manner. The Y axis stage 3442 allows the mask assembly 3322 together with the X axis stage 3441 to move in the Y axis direction in a translational manner. The θ axis stage 3443 allows the X axis stage 3441 and the Y axis stage 3442 to rotate around the Z axis. The X axis stage 3441 is slidably connected via a slide guide 3445 to the Y axis stage 3442. The Y axis stage 3442 is rotatably connected via a bearing 3446 to the θ axis stage 3443.

The mask assembly 3322 includes a tubular mask holder body 3422d, and a tapered outer surface TP1 tapering off downward on the outer periphery of the mask holder body 3422d. The mask holder body 3422d supports the mask 3322a, the reflecting member 3322b and the field lens 3322c. The X axis stage 3441 has a tapered inner surface TP2 around a round opening formed at a bottom 3441a. The tapered inner surface TP2 is adapted to fit the tapered outer surface TP1. By this configuration, if only the mask assembly 3322 is inserted into the round opening at the bottom 3441a of the X axis stage 3441, the tapered outer surface TP1 fits the tapered inner surface TP2. Thus, the mask assembly 3322 can be precisely aligned relative to the X axis stage 3441. In addition, the mask assembly 3322 is adapted to have a downward momentum by an annular fixing nut 3425. The fixing nut 3425 is screwed into the bottom 344la of the X axis stage 3441.

The mask assembly 3322 and the fixing nut 3425 are mounted on the bottom 3441a of the X axis stage 3441 using the mounting jig 3370. The mask assembly 3322 has a depression 3422g which is engaged with a hook-like hanging member 3471 formed on the lower surface of the mounting jig 3370, and moves up and down according to the operation of the mounting jig 3370. By this configuration, the mask assembly 3322 can be easily and surely inserted into the round opening at the bottom 3441a of the X axis stage 3441. The fixing nut 3425 also has a depression 3425g which is engaged with the hanging member 3471 of the mounting jig 3370, and moves up and down according to the operation of the mounting jig 3370. By this configuration, the fixing nut 3425 is screwed from above the mask assembly 3322 inserted into the bottom 3441a of the X axis stage 3441 to easily and surely fix the mask assembly 3322.

The mounting jig 3370 includes a cylindrical body 3470a, a disc supporting member 3470b, and a handle 3470c. The disc supporting member 3470b is fixed at the bottom of the body 3470a and supports the hanging member 3471. The handle 3470c serves to rotate or move the body 3470a up and down together with the supporting member 3470b. In consideration of, for example, convenience of operation, the handle 3470c has a grip 3473 extending in three directions, as shown in FIG. 48B.

While the mask assembly 3322 is mounted at the bottom of the mounting jig 3370, the mask assembly 3322 is inserted into an insertion port 3440a of the mask stage unit 3340. The mask assembly 3322 is then moved down to the bottom 3441a, and at this stage, the mounting jig 3370 is turned in a clockwise direction to separate the mask assembly 3322 from the mounting jig 3370.

Next, the fixing nut 3425 is mounted onto the bottom of the mounting jig 3370 in the same manner as in the mask assembly 3322, and is inserted into the insertion port 3440a of the mask stage unit 3340. When the fixing nut 3425 reaches the bottom, the fixing nut 3425 is turned in a counterclockwise direction to clamp to a predetermined position. Thus, the mask assembly 3322 is pressed against the bottom 3441a at a constant pressure applied by a coned disc spring 3425c. In this procedure, the tapered outer surface TP1 in the mask holder body 3422d comes into intimate contact with the tapered inner surface TP2 in the bottom 3441a, and the mask assembly 3322 can be precisely mounted onto the mask stage unit 3340. Thereafter, the mounting jig 3370 is turned in a clockwise direction to separate the fixing nut 3425 from the mounting jig 3370, and the mounting jig 3370 alone can be taken out.

When the mask assembly 3322 is to be dismounted from the mask stage unit 3340, the above-mentioned mounting procedure should be simply reversed. Specifically, the mounting jig 3370 is inserted into the insertion port 3440a of the mask stage unit 3340 to undo the fixing nut 3425, and the fixing nut 3425 is taken out. Next, the tip of the mounting jig 3370 is allowed to catch the depression 3422g of the mask assembly 3322. The mounting jig 3370 is then slowly raised, and the mask assembly 3322 together with the mounting jig 3370 can be taken out. Likewise, the dismounting of the mask 3322a and the reflecting member 3322b from the mask assembly 3322 can be performed in a reverse manner from the mounting procedure of these elements. Detailed descriptions of such dismounting procedures are omitted herein.

By the above procedure, the mask 3322a can be precisely mounted onto the mask stage unit 3340. For a further precise alignment, the mask 3322a is aligned by visual observation of an alignment mark formed on the mask surface with, for example, a charge-coupled device (CCD) camera not shown.

Next, a device and process for position measurement according to an embodiment of the invention will be illustrated in further detail with reference to the drawings.

Figure 49:
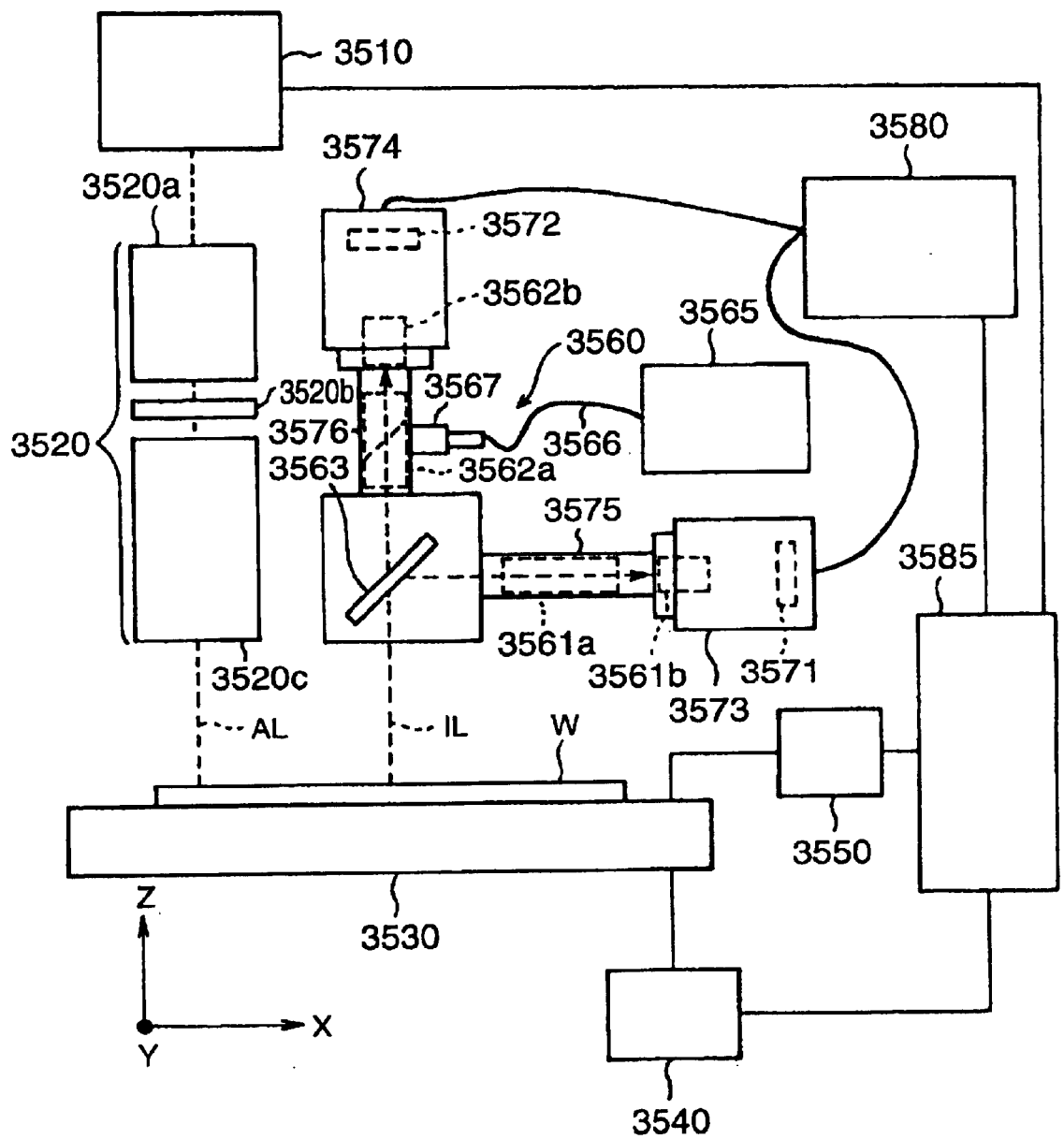
FIG. 49 is a diagram showing the system and process for precision alignment for rectangular beams.

FIG. 49 is a schematic diagram showing the configuration of a laser annealer including the position measuring device according to the embodiment. The laser annealer includes a laser source 3510, an irradiation optical system 3520, a stage 3530, and a stage driving unit 3540. The laser source 3510 produces an excimer laser and other laser light AL for heating an amorphous Si or another semiconductor thin film formed on a glass plate work W. The irradiation optical system 3520 converts the laser light AL into a line or spot and launches the laser light onto the work W at a predetermined illumination. The stage 3530 supports the work W, is smoothly movable in the X-Y plane and is rotatable around the Z axis. The stage driving unit 3540 serves as a driving means to move the stage 3530 supporting the work W to a necessary degree relative to, for example, the irradiation optical system 3520. The irradiation optical system 3520 may comprise, for example, a homogenizer 3520a, a mask 3520b, and a projection lens 3520c. The homogenizer 3520a ensures the incident laser light AL to have a uniform distribution, and the mask 3520b has a slit for throttling the laser light AL passed through the homogenizer 3520a into a predetermined beam form, and the projection lens 3520c reduces and projects the slit image of the mask 3520b onto the work W.

The laser annealer further includes a traveling distance measuring device 3550, a projecting optical system 3560, a first image pickup device 3571, a second image pickup device 3572, an image processor 3580, and an illumination lamp 3565, as a position measuring device in addition to the stage 3530 and the stage driving unit 3540. The traveling distance measuring device 3550 detects the displacement of the stage 3530 as optical or electric information. The projecting optical system 3560 is a coaxial twin-lens dual-scaling system and forms an image of an alignment mark on the work W. The first image pickup device 3571 converts a first-scaling image of a relatively low magnification projected by the projecting optical system 3560 into a picture signal, and the second image pickup device 3572 converts a second-scaling image of a relatively high magnification projected by the projecting optical system 3560 into a picture signal. The image processor 3580 subjects the picture signals produced by the first and second image pickup devices 3571 and 3572 to an appropriate signal processing. The illumination lamp 3565 supplies luminous light to the projecting optical system 3560 for the illumination of the surface of the work W. The laser annealer further includes a master controller 3585 which generally controls the operations of the position measuring device and other components of the laser annealer.

The irradiation optical system 3560 will now be illustrated in further detail. The irradiation optical system 3560 is a coaxial twin-lens dual-scaling system as described above, and includes a first lens system 3561a and 3561b, a second lens system 3562a and 3562b, a half mirror 3563, and an epi-illumination system 3567. The first lens system 3561a and 3561b projects an image of the work W on the stage 3530 onto the first image pickup device 3571 in a relatively low first magnification. The second lens system 3562a and 3562b projects this projected image in a relatively high second magnification onto the second image pickup device 3572. The half mirror 3563 divides the image light IL from the work W and introduces the divided beams into the first lens system 3561a and 3561b and the second lens system 3562a and 3562b. The epi-illumination system 3567 guides an illumination light from the illumination lamp 3565 via a cable 3566 onto the optical axis of the second image pickup device 3572. The illumination light produced by the illumination light 3565 has a wavelength different from that of the laser light from the laser source 3510.

The first lens system 3561a and 3561b and the second lens system 3562a and 3562b constitute a coaxial optical system possessing an optical axis in common. The image light IL is launched from the work W along the optical axis of the first lens system 3561a and 3561b. When the image light IL is reflected by the half mirror 3563, it enters into the center of an image field of the first image pickup device 3571. When the image light IL passes through the half mirror 3563, it enters along the optical axis of the second lens system 3562a and 3562b into the center of an image field of the second image pickup device 3572. In addition, the epi-illumination system 3567 is arranged to be coaxial with the second lens system 3562a and 3562b, and homogeneously illuminates a region on the work W corresponding to the image fields of the first and second image pickup devices 3571 and 3572.

The first image pickup device 3571 comprises a CCD device, a solid image pickup device. The first image pickup device 3571 and the lens 3561b constitute a CCD camera 3573. The CCD camera 3573 is fixed to an end of a lens-barrel 3575 housing the lens 3561a. Separately, the second image pickup device 3572 also comprises a CCD device, and the second image pickup device 3572 and the lens 3562b constitute a CCD camera 3574. The CCD camera 3574 is fixed to an end of a lens-barrel 3576 housing the lens 3562a. The other ends of the both lens-barrels 3575 and 3576 are fixed to a casing which houses the half mirror 3563.

Figure 50:
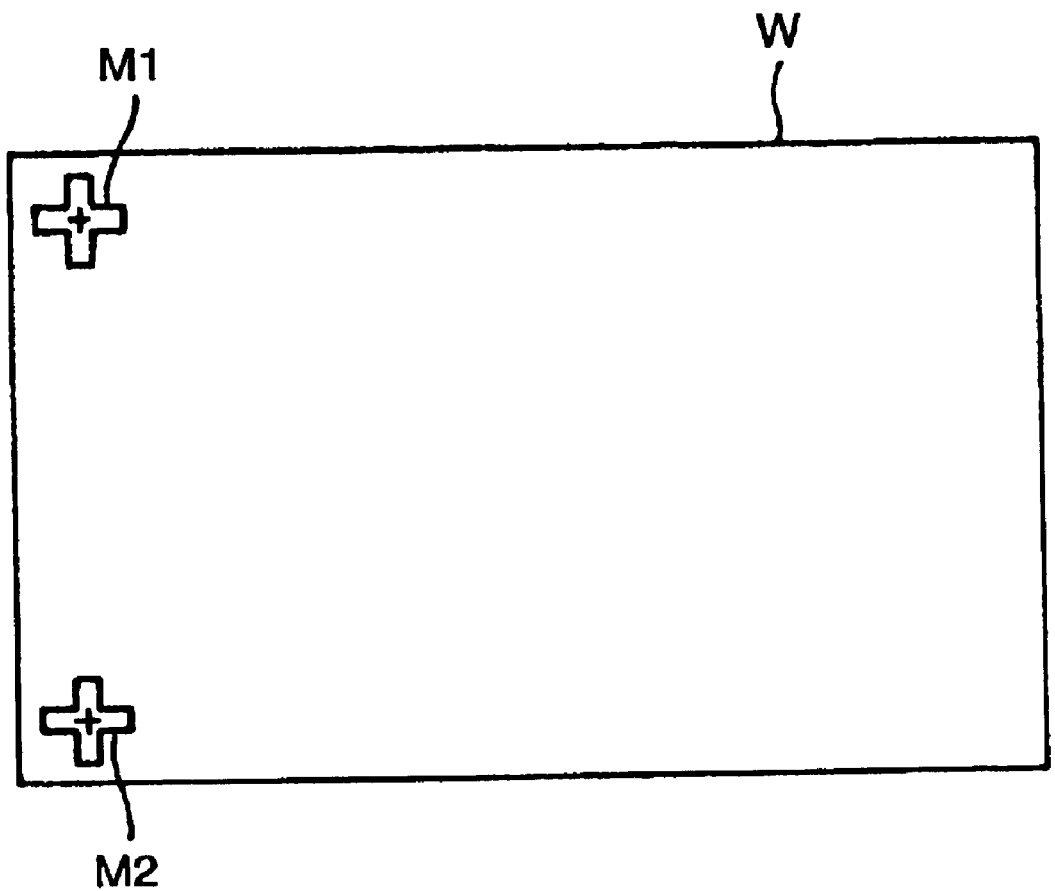
FIG. 50 is a diagram showing an illustrative alignment mark arrangement for use in the invention.

FIG. 50 is a diagram showing an illustrative arrangement of alignment marks formed on the surface of the work W mounted on the stage 3530 of FIG. 49. Alignment marks M1 and M2 shown in the figure are each a dual pattern including a bright, large cross pattern and a dark, small cross pattern in combination.

The first alignment mark M1 is formed in one of the four corners of the work W, and the second alignment mark M2 is formed at another of the four corners of the work W. The first and second alignment marks M1 and M2 are thus formed in two positions on the work W so as to detect not only the position but also the rotation of the work W. By measuring the positions of the first and second alignment marks M1 and M2, the coordinates of the two reference points on the work W can be determined, and the work W can be aligned in such a manner that the attitude and position of the work W can be appropriately adjusted.

The operations of the laser annealer shown in FIG. 49 will be described in detail. The work W is moved to and mounted on the stage 3530 of the laser annealer. The work W on the stage 3530 is aligned relative to the irradiation optical system 3520 serving to guide the annealing laser light AL. While appropriately moving the stage 3530 relative to the irradiation optical system 3520, the laser light AL is launched from the laser source 3510 and is converted into a line or a spot and is applied onto the work W. On the work W, an amorphous Si or another amorphous semiconductor thin film is formed, and the semiconductor is annealed and recrystallized by irradiation and scanning of the work with the laser light AL. The resulting semiconductor thin film has satisfactory electric characteristics.

The position measuring device is used for the alignment of the work W on the stage 3530 relative to the irradiation optical system 3520. Specifically, the stage 3530 is appropriately moved by the stage driving unit 3540 to guide the first alignment mark M1 including a global mark M11 and a fine mark M12 to an image field of the first image pickup device 3571 (Step S1). The position of the work W on the stage 3530 remains within a predetermined moving precision range (0.5 to 1 mm in the example), and the stage 3530 is appropriately moved relative to the projecting optical system 3560 to guide and move the first alignment mark M1 in the visual field of the first lens system 3561a and 3561b, i.e., in the image field (5 mm size in the example) of the first image pickup device 3571. For example, by storing the position of the first alignment mark M1 on the work W in memory as data, the stage 3530 can be appropriately moved with reference to the positional data of the first alignment mark M1 to surely guide the first alignment mark M1 into the image field of the first image pickup device 3571.

Subsequently, the position of the global mark M11 of the first alignment mark M1 is determined by subjecting the picture signal of a relatively low magnification from the first image pickup device 3571 to image signal processing in the image processor 3580 (Step S2). The pixels of the first image pickup device 3571 are in a precise correspondence with distances of points on the stage 3530, and an XY component of the distance from the center of the first image pickup device 3571, i.e. the optical axis of the first lens system 3561a and 3561b, to the center of the global mark M11 can be precisely determined.

Next, while determining and monitoring the travel or stroke of the stage by the traveling distance measuring device 3550, the stage driving unit 3540 is driven to move the stage 3530 in the X-Y plane to allow the center of the global mark M11 to agree with the optical axis of the first lens system 3561a and 3561b (Step S3). The travel determined by the travel measuring device 3550 corresponds to the distance determined in the step S2. In this procedure, the alignment accuracy by th e global mark M11 is about 10 $\mu$m or less in the example. The above search alignment procedure can positively move the fine mark M12 arranged at the center of the global mark M1 into the image field (0.5 mm size in the example) of the second image pickup device 3572 of a high magnification.

The position of the fine mark M12 is then determined by subjecting a picture signal from the second image pickup device 3572 to signal processing in the image processor 3580 (Step 4). The pixels of the second image pickup device 3572 have a precise correspondence with distances of points on the stage 3530, and the distance between the center of the fine mark M12 and the center of the second image pickup device 3572, i.e., the optical axis of the second lens system 3562a and 3562b can be precis ely determined. The position measuring precision through the fine mark M12 is about 1 $\mu$m or less in the example.

The projecting optical system 3560 serving to determine the position of the fine mark M12 has a predetermined positional relationship with the laser annealing irradiation optical system 3520, and the positional relationship is determined or adjusted in advance. Accordingly, the distance from the optical axis of the second lens system 3562a and 3562b to the center of the fine mark M12 can be converted into the distance from the laser annealing irradiation optical system 3520 to the center of the fine mark M12 with reference to the positional relationship (Step S5). By these procedures, the coordinates of the first alignment mark M1 can be precisely determined.

Likewise, the second alignment mark M2 is subjected to these measuring procedures (steps S1 to S5), an d the coordinates of the second alignment mark M2 can be precisely determined (Step S6). In the example, one pixel of the second image pickup device 3572 was set at 1 μm and the position was detected with a precision of about 1 μm.

Next, the work W is aligned (Step 7) with respect to the irradiation optical system 3520 based on the precise measurements of the coordinates of the first and second alignment marks M1 and M2 obtained in steps S5 and S6. Specifically, the position and rotation of the work W are determined based on the coordinate measurements of the fine marks of the first and second alignment marks M1 and M2 with reference to the irradiation optical system 3520. Based on these results, the work W is arranged at a position with a rotational attitude required upon the initiation of laser annealing.

Next, while scanning the work W with the laser light AL such as a laser spot or a laser line using the stage driving unit 3540 and the traveling distance measuring device 3550, the amorphous thin film on the work W is recrystallized to sequentially form polycrystalline thin films on the work W. In this procedure, the work W can be scanned with the laser light AL by moving the stage 3530 in the X or Y direction by the stage driving unit 3540, while monitoring the travel of the stage with the traveling distance measuring device 3550. Alternatively, the work W can be scanned with the laser light AL by allowing the irradiation optical system 3520 to have a scanning function, for example, by moving the mask 3520b in the irradiation optical system 3520.

In the position measuring process according to the first embodiment, after the work W is transferred to and mounted on the stage 3530, the position of the work W can be precisely determined only by moving the work W through search alignment using the global mark M11, and thus the position of the work W can be rapidly determined. In addition, the global mark M11 and the fine mark M12 have similar-shaped outlines to each other, and the image measurement algorithms in the measurements of the marks M11 and M12 can be nearly the same as each other, and the arithmetic processing and other procedures can be simplified.

Figure 51:
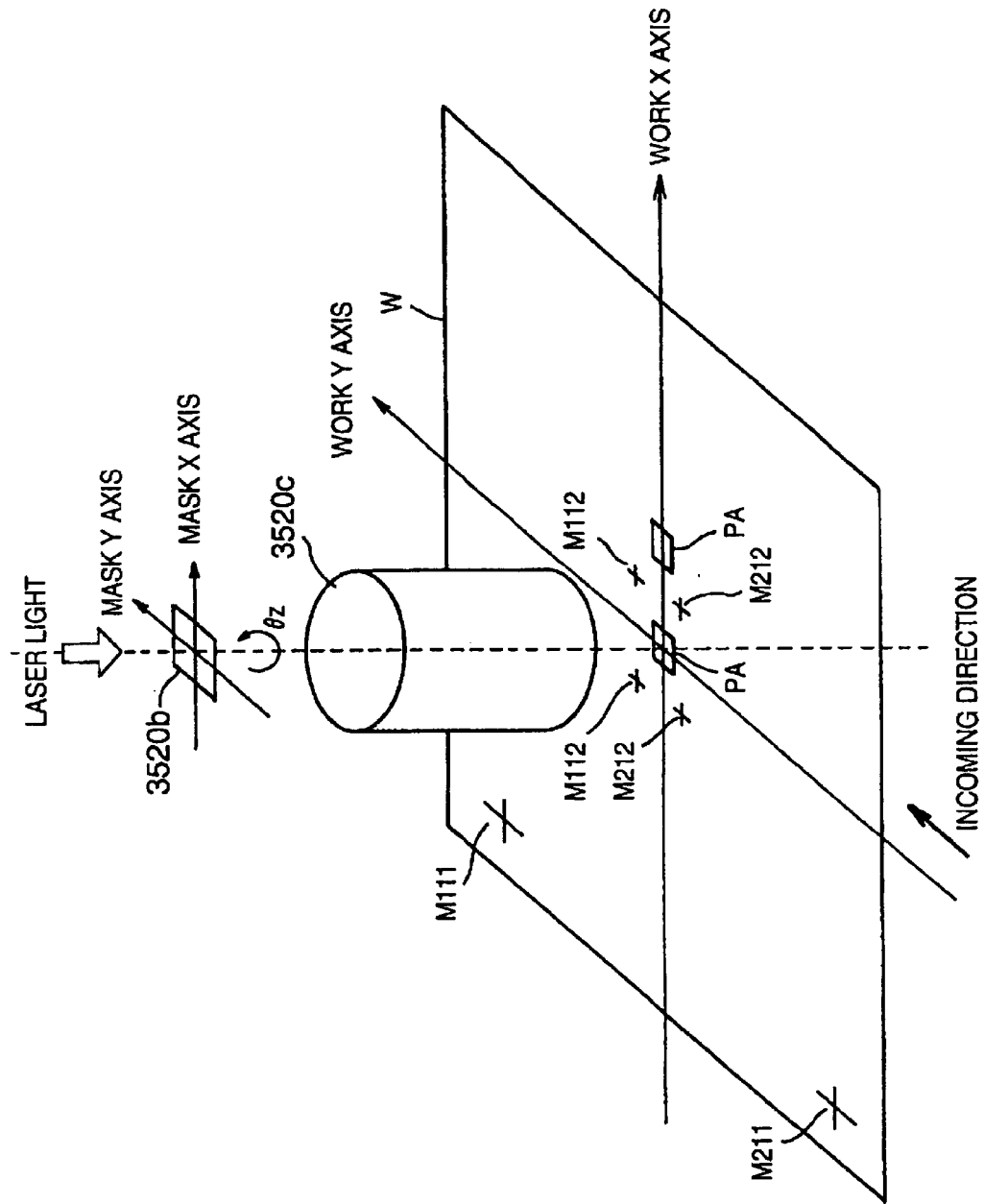
FIG. 51 is a perspective view showing the arrangement of an alignment mark.

FIG. 51 is a perspective view showing arrangement of the alignment marks formed on the surface of the work W mounted on the stage 3530 shown in FIG. 49.

First and second global marks M111 and M211 are respectively formed in either one of the four corners of the work W. Both global marks M111 and M211 have identical coordinates in the work X axis and different coordinates in the work Y axis. Separately, first and second fine marks M112 and M212 are respectively arranged in the vicinity of processing areas PA on the work W. Both fine marks M112 and M212 have identical coordinates in the work X axis and different coordinates in the work Y axis. The processing areas PA are areas to be projected with, for example, a slit image of the mask 3520b by projection lens 3520c, and are arrayed at appropriate intervals (in the figure, only two processing areas are shown).

The positional measurements of the first and second global marks M111 and M211 can determine the coordinates of two reference points on the periphery of the work W. By this procedure, the attitude of the work W can be corrected and the search alignment (global alignment) can be performed to allow each of the first and second fine marks M112 and M212 enter into the image field of the second image pickup device 3572 of a high magnification (FIG. 49). Separately, the positional measurements of the first and second fine marks M112 and M212 can determine precise coordinates of two reference points on the periphery of the processing areas PA corresponding to these fine marks. The slit image of the mask 3520b can be therefore precisely projected onto the processing areas PA by appropriately moving the work W.

Figure 52:
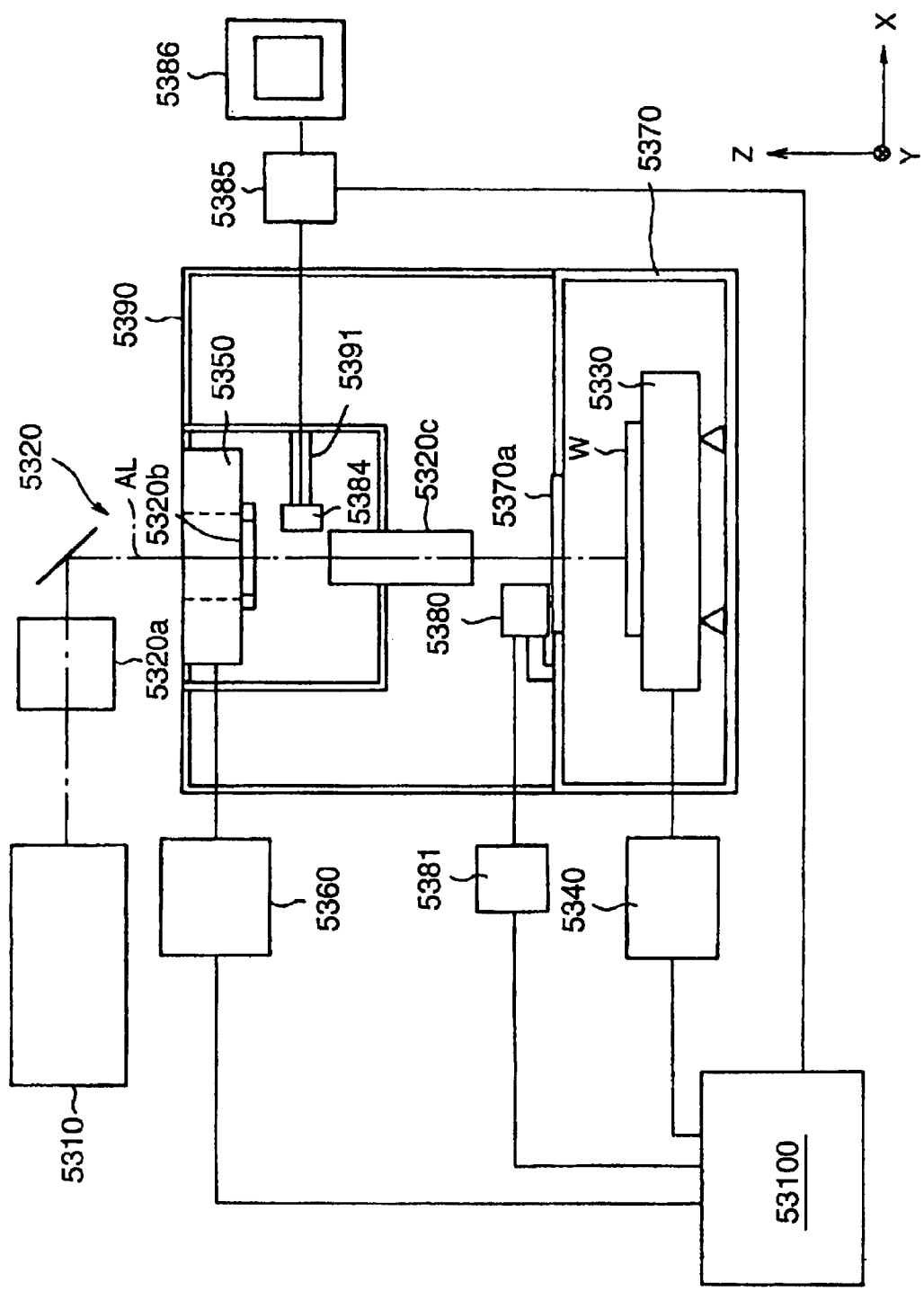
FIG. 52 is a diagram showing the configuration of a laser annealer as an embodiment of the invention.

FIG. 52 is a schematic illustration of the configuration of a laser annealer as an embodiment of the invented laser processing system.

This laser annealer serves to treat a work W with heat, and the work W comprises a glass substrate and an amorphous Si or another semiconductor thin film formed on the glass substrate. The laser annealer includes a laser source 5310, an irradiation optical system 5320, a process stage unit 5330, a stage controller 5340, and a master controller 53100. The laser source 5310 produces a laser light AL such as an excimer laser for heating the semiconductor thin film. The irradiation optical system 5320 converts the laser light AL into a line (to be precise, a fine rectangle) and launches the laser light AL onto the work W at a predetermined illumination. The process stage unit 5330 supports the work W and allows the work W to smoothly move in the X-Y plane in a translational manner and to rotate around the Z axis. The stage controller 5340 controls the operations of the process stage unit 5330, and the master controller 53100 generally controls the operations of individual components of the laser annealer.

The irradiation optical system 5320 comprises a homogenizer 5320a, a mask 5320b, and a projection tens 5320c. The homogenizer 5320a ensures the incident laser light AL to have a uniform distribution. The mask 5320b has a slit, and the slit throttles the laser light AL passed through the homogenizer 3520a into a rectangular beam. The projection lens 5320c reduces and projects the slit image of the mask 5320b onto the work W. Of these components, the mask 5320b is exchangeably supported by a mask stage unit 5350. The mask stage unit 5350 drives and allows the mask 5320b to smoothly move in the X-Y plane in a translational manner and to rotate around the Z axis. The operations of the mas k stage unit 5350 are controlled by a stage controller 5360 to monitor the timing and travel of the translation and rotation of the mask 5320b. The mask stage unit 5350 and the stage controller 5360 constitute a mask driving unit.

The process stage unit 5330 is housed in a process chamber 5370. The laser light AL is launched from the irradiation optical system 5320 via a process window 5370a onto the work W supported by the process stage unit 5330 in the process chamber 5370. The translational and rotational travels are monitored by the stage controller 5340.

The process window 5370a is arranged on the top surface of the process chamber 5370. Immediately above the corner of the process window 5370a, a work alignment camera 5380 is fixed. The work alignment camera 5380 serves to detect the misalignment of the work W mounted on the process stage unit 5330, and includes an image-forming optical system and a CCD and other image pickup devices. A picture signal output from the work alignment camera 5380 is subjected to processing in an image processor 5381. Signals produced by the image processor 5381 are entered into the master controller 53100 and are used in the alignment of the work W relative to the projection tens 5320c constituting the irradiation optical system 5320. Immediately below a corner of the mask 5320b, a mask alignment camera 5384 as an image pickup device is fixed. The mask alignment camera 5384 serves to detect the misalignment of the mask 5320b supported by the mask stage unit 5350, and produces a picture signal output. The picture signal output from the mask alignment camera 5384 is subjected to processing in an image processor 5385, and the picked-up image is displayed on a display 5386 as a display device, and is used in the alignment of the mask 5320b relative to the work W.

In this configuration, the mask stage unit 5350 and the projection lens 5320c are fixed to a frame 5390 extending from the process chamber 5370. The mask alignment camera 5384 is also fixed via a supporting member 5391 to the frame 5390. While the detailed descriptions of this component are omitted herein, the supporting member 5391 serves to adjust the position of the mask alignment camera 5384 relative to the mask stage unit 5350. Specifically, the mask alignment camera 5384 is moved in the X-Y plane in a translational manner and is rotated around the Z axis, and can be surely fixed to the frame 5390 after the completion of necessary alignment movement.

In the above system, the image of a mask alignment mark AM is indicated on the display 5386 while the mask 5320b is moved relative to the projection lens 5320c by the mask stage unit 5350b By this configuration, the position of the mask 5320b can be precisely and positively determined in real time while visually checking the position.

The advantages of the invention will now be listed below.

(1) In a semiconductor thin film forming system for modifying a predetermined region of a semiconductor thin film by exposing the semiconductor thin film to a projected light patterned through plural patterns formed on a photo mask, the invented system includes a mechanism for uniformizing light for exposure in such a manner that the light intensity in a predetermined area on the photo mask distributes within a range of ±1.2% of the average light intensity in the area. By this configuration, a semiconductor thin film on a desired region to be patterned can be homogeneously modified. When the system is applied to LCDs and other imaging devices, damage of substrates due to variations in intensity of light source can be prevented to thereby inhibit deterioration of image quality.

(2) In a semiconductor thin film forming system for modifying a predetermined region of a semiconductor thin film by exposing the semiconductor thin film to a projected light patterned through an exposure pattern formed on a photo mask, and the semiconductor thin film is formed on a substrate held on a substrate stage, the invented system includes a mechanism for sequentially scanning the semiconductor thin film with the patterned light by individually or concurrently driving the photo mask and the substrate stage. By this configuration, selected regions on the substrate can be sequentially modified with a high throughput. When the system is applied to LCDs and other imaging devices, damage of substrates due to variations in intensity of light source can be prevented to thereby inhibit deterioration of image quality. This system can also provide a crystallized silicon film having a trap state density less than $10^{12}$ cm$^{-2}$.

(3) In a semiconductor thin film forming system for modifying a predetermined region of a semiconductor thin film by exposing the semiconductor thin film to a projected light patterned through an exposure pattern formed on a photo mask, the invented system includes a focusing mechanism for obtaining the focus of the projected patterned light on the predetermined region of the semiconductor thin film when the semiconductor thin film is exposed to the projected patterned light. The above configuration can provide a semiconductor thin film forming system having a high reliability in modification processes and a satisfactory reproducibility.

(4) In a semiconductor thin film forming system for modifying a predetermined region of a semiconductor thin film by exposing the semiconductor thin film to a projected exposure beam patterned through a pattern formed on a photo mask, the invented system includes a tilt correcting mechanism (or a leveling mechanism) for correcting the tilt of the projected patterned beam relative to the semiconductor thin film. The above configuration can provide a semiconductor thin film forming system having a high reliability in modification processes and a satisfactory reproducibility.

(5) In a semiconductor thin film forming system for modifying a predetermined region of a semiconductor thin film by exposing the semiconductor thin film to a projected exposure beam patterned through a pattern formed on a photo mask, the invented system includes an alignment mechanism (or an alignment function) for aligning the exposure beam relative to a mark formed on a substrate, on which the semiconductor thin film is deposited. This configuration can achieve the exposure of a target region with an alignment accuracy of the order of micrometers or higher. When the system is applied to LCDs and other imaging devices, damage of substrates due to variations in intensity of light source can be prevented to thereby inhibit deterioration of image quality.

(6) In a semiconductor thin film forming system for modifying a predetermined region of a semiconductor thin film by exposing the semiconductor thin film to a projected light patterned through a pattern formed on a photo mask, the invented system includes a mechanism (or a function) for holding a substrate on a stage, the semiconductor thin film being deposited on the substrate. The above configuration can provide a semiconductor thin film forming system having a high reliability in modification processes and a satisfactory reproducibility.

(7) In a semiconductor thin film forming system for modifying a predetermined region of a semiconductor thin film by exposing the semiconductor thin film to a projected exposure beam patterned through a pattern formed on a photo mask, the invented system includes a composing mechanism for composing a plurality of laser beams into the exposure beam. By this configuration, a semiconductor thin film can be homogeneously modified with good quality in target regions to be patterned. In addition, selected regions on the substrate can be sequentially modified with a high throughput.

(8) Preferably in the system just mentioned above in (7), the plurality of laser beams comprises first and second laser beams, and the composing mechanism composes the first and second laser beams in such a manner that the second laser beam is applied onto the semiconductor thin film with a delay relative to the first laser beam. By this configuration, a semiconductor thin film can be homogeneously modified with good quality in target regions to be patterned. In addition, selected regions on the substrate can be sequentially modified with a high throughput.

(9) In a semiconductor thin film forming system having a process chamber, the process chamber serves to modify a predetermined region of a semiconductor thin film by exposing the semiconductor thin film on a substrate to a projected exposure beam patterned through a pattern formed on a photo mask, the invented system includes a mechanism for moving the substrate from the process chamber to a different process chamber without exposing the substrate to the atmosphere (or the air). By this configuration, a semiconductor thin film can be transferred to a successive process without contamination by impurities and dusts, while the semiconductor thin film has a chemically active surface of an equivalent quality to that of a single crystal semiconductor thin film. Thus, manufacture costs for the semiconductor production system can be reduced by eliminating a cleaning process, and the throughput can be increased by reducing evacuation periods or cleaning periods in individual vacuum systems.

(10) In the system just mentioned above (9), preferably the different process chamber is an insulating film forming chamber for the formation of an insulating film on the substrate. By this configuration, a semiconductor thin film can be transferred to a gate insulating film forming process without contamination by impurities and dusts, while the semiconductor thin film has a chemically active surface of an equivalent quality to that of a single crystal semiconductor thin film. Thus, a semiconductor element having a satisfactory semiconductor-insulator interface can be manufactured by a process at low temperatures of 600° C. or less. Such a good semiconductor-insulator interface is conventionally formed, for example, in an interface between silicon and silicon oxide formed by heating. This system can provide a crystallized silicon film having a trap state density less than $10^{12}$ cm$^{-2}$ and can provide a silicon-insulating film interface exhibiting a low interface state density.

(11) In the system indicated in (9), the different process chamber is preferably a semiconductor film forming chamber for the formation of a semiconductor thin film on the substrate. By this configuration, a semiconductor film can be transferred to a light irradiation process without contamination by impurities and dusts, which semiconductor film is necessary for producing a semiconductor thin film having a chemically active surface of an equivalent quality to that of a single crystal semiconductor thin film. Thus, manufacture costs for the semiconductor deposition system can be reduced by eliminating a cleaning process, and the throughput can be increased by reducing evacuation times or cleaning times in individual vacuum systems.

(12) In the system indicated in (9), the invention provides a system where the different process chamber is a heat treatment chamber for treating the substrate with heat.

(13) Preferably, the different process chamber in the system indicated in (9) is a plasma treatment chamber for subjecting the substrate to a plasma treatment by treating the substrate with plasma. By this configuration, a semiconductor thin film can be transferred to a successive process without contamination by impurities and dusts, while the semiconductor thin film has a chemically active surface of an equivalent quality to that of a single crystal semiconductor thin film. Thus, manufacture costs for the semiconductor deposition system can be reduced by eliminating a cleaning process, and the throughput can be increased by reducing evacuation times or cleaning times in individual vacuum systems.

(14) In the system indicated in (9), the process chamber is preferably a laser treatment chamber for modifying the predetermined region of the semiconductor thin film by exposing the semiconductor thin film on the substrate to a projected laser beam patterned through the pattern formed on the photo mask, the different process chamber being preferably another laser treatment chamber. By this configuration, a semiconductor thin film can be transferred to a successive process without contamination by impurities and dusts, while the semiconductor thin film has a chemically active surface of an equivalent quality to that of a single crystal semiconductor thin film. Thus, manufacture costs for the semiconductor production system can be reduced by eliminating a cleaning process, and the throughput can be increased by reducing evacuation times or cleaning times in individual vacuum systems.

(15) In a preferred embodiment, the different process chamber in the system indicated in any one of (9) to (13) includes a plasma generating source for generating plasma in a predetermined area of the different process chamber, and the substrate is placed in an area in the different process chamber other than the predetermined area. This configuration can inhibit plasma-induced damage of the semiconductor thin film, which semiconductor thin film is transferred to a successive process without contamination by impurities and dusts and has a chemically active surface of an equivalent good quality to that of a single crystal semiconductor thin film.

(16) In the system indicated in (13), preferably, the different process chamber includes a plasma source for generating plasma in a predetermined area of the different process chamber, and the different process chamber serves to subject the substrate to the plasma treatment by reacting an excited gas with a different gas, the excited gas is excited by the plasma generated in the predetermined area, and the different gas is introduced into the different process chamber without passing through the predetermined area. Thus, a semiconductor element having a satisfactory semiconductor-insulator interface can be manufactured by a process at low temperatures of 400° C. or less. Such a good semiconductor-insulator interface is conventionally formed, for example, in an interface between silicon and silicon oxide formed by heating.

Other embodiments and variations will be obvious to those skilled in the art, and this invention is not to be limited to the specific matters stated above.

What is claimed is:

1. A semiconductor thin film forming method comprising:
modifying a predetermined region of a semiconductor thin film by exposing the semiconductor thin film to a projected light obtained after a light is patterned through plural patterns formed on a photo mask, said projected light having a beam size in a minor axis direction in the order of micrometers; and
uniformizing the light to be applied in such a manner that the intensity of the light in a predetermined area on the photo mask distributes within a range of ±11.2% of the average intensity of the light in said area,
wherein spatial distribution of peak intensity of light projected and applied on the semiconductor thin film is uniformized to an identical extent with the peak intensity of the intensity distribution on the photo mask.

2. The method according to claim 1, wherein said projected light comprises a laser beam.

3. The method according to claim 2, wherein said laser beam is generated by an eximer laser.

4. The method according to claim 2, wherein said light is uniformized using a homogenizer, a mask and a projection lens through which said light is applied.

5. The method according to claim 4, wherein said mask includes a slit for throttling light passed through the homogenizer into a rectangular beam.

6. A method according to claim 4, wherein a projection lens is used for reducing and projecting a slit image of the mask onto said film.

7. A semiconductor thin film forming method as claimed in claim 1, wherein said predetermined region of the semiconductor thin film is modified by exposing, at a travel pitch of the order of micrometers, the semiconductor thin film to said projected light.

8. A semiconductor thin film forming method as claimed in claim 1, wherein said predetermined region of the semiconductor thin film is modified by exposing a target exposure position of the semiconductor thin film to said projected light with a target accuracy of 0.1 $\mu$m to 100 $\mu$m.

9. A semiconductor thin film forming method comprising:

modifying a predetermined region of a semiconductor thin film by exposing the semiconductor thin film to a projected light obtained after a light is patterned through plural patterns formed on a photo mask, said projected light having a beam size in a minor axis direction in the order of micrometers, wherein the light is applied in such a manner that the intensity of the light in a predetermined area on the photo mask is distributed within a range of ±11.2% of an average intensity of the light in said area.

10. A semiconductor thin film forming method as claimed in claim 9, wherein said predetermined region of the semiconductor thin film is modified by exposing, at a travel pitch of the order of micrometers, the semiconductor thin film to said projected light.

11. A semiconductor thin film forming method as claimed in claim 9, wherein said predetermined region of the semiconductor thin film is modified by exposing a target exposure position of the semiconductor thin film to said objected light with a target accuracy of 0.1 $\mu$m to 100 $\mu$m.

* * * * *

UNITED STATES PATENT AND TRADEMARK OFFICE
CERTIFICATE OF CORRECTION

PATENT NO. : 6,861,614 B1  
APPLICATION NO. : 09/612551  
DATED : March 1, 2005  
INVENTOR(S) : Tanabe et al.

Page 1 of 1

It is certified that error appears in the above-identified patent and that said Letters Patent is hereby corrected as shown below:

On the title page item (54), and col. 1, line 1,
"S System" should be -- System --.

Signed and Sealed this

Fifth Day of September, 2006

JON W. DUDAS
*Director of the United States Patent and Trademark Office*